US012721216B2

(12) United States Patent
Akimoto

(10) Patent No.: US 12,721,216 B2
(45) Date of Patent: Aug. 25, 2026

(54) IMAGE DISPLAY DEVICE AND METHOD FOR MANUFACTURING IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 598 days.

(21) Appl. No.: 17/520,040

(22) Filed: Nov. 5, 2021

(65) Prior Publication Data

US 2022/0059518 A1 Feb. 24, 2022

Related U.S. Application Data

(63) Continuation of application No. PCT/JP2020/017014, filed on Apr. 20, 2020.

(30) Foreign Application Priority Data

May 8, 2019 (JP) ................................ 2019-088536
Sep. 30, 2019 (JP) ................................ 2019-179860

(51) Int. Cl.
*H10W 90/00* (2026.01)
*H10H 20/01* (2025.01)
(Continued)

(52) U.S. Cl.
CPC ............ *H10W 90/00* (2026.01); *H10H 20/01* (2025.01); *H10H 20/018* (2025.01); *G09G 3/32* (2013.01);
(Continued)

(58) Field of Classification Search
CPC ... H01L 25/167; H01L 33/62; H01L 33/0093; H01L 25/0753; H01L 33/007;
(Continued)

(56) References Cited

U.S. PATENT DOCUMENTS

2004/0195576 A1* 10/2004 Watanabe ........... H10H 20/857 257/79
2007/0205420 A1 9/2007 Ponjee et al.
(Continued)

FOREIGN PATENT DOCUMENTS

CN 101529605 A 9/2009
CN 108022550 A 5/2018
(Continued)

*Primary Examiner* — Jacob Y Choi
*Assistant Examiner* — Ashley Nicole Blackwell
(74) *Attorney, Agent, or Firm* — Foley & Lardner LLP

(57) ABSTRACT

A manufacturing method includes: providing a substrate in which a semiconductor layer including a light-emitting layer is located on a first substrate; forming a metal layer on the semiconductor layer; bonding the semiconductor layer via the metal layer to a second substrate that includes a circuit that includes a circuit element is formed; forming a light-emitting element by patterning the semiconductor layer; forming a first wiring layer by patterning the metal layer; forming an insulating film that covers the light-emitting element and the first wiring layer; forming a first via that extends through the insulating film to the circuit; forming a second wiring layer on the insulating film; and connecting the light-emitting element and the circuit element electrically in series via the first wiring layer, the second wiring layer, and the first via.

10 Claims, 30 Drawing Sheets

(51) Int. Cl.

| | |
|---|---|
| *G09G 3/32* | (2016.01) |
| *H10H 20/82* | (2025.01) |
| *H10H 20/825* | (2025.01) |
| *H10H 20/832* | (2025.01) |
| *H10H 20/833* | (2025.01) |
| *H10H 20/851* | (2025.01) |

(52) U.S. Cl.
CPC ............... *G09G 2300/0426* (2013.01); *G09G 2300/0452* (2013.01); *G09G 2300/0809* (2013.01); *H10H 20/01335* (2025.01); *H10H 20/032* (2025.01); *H10H 20/0361* (2025.01); *H10H 20/82* (2025.01); *H10H 20/825* (2025.01); *H10H 20/833* (2025.01); *H10H 20/835* (2025.01); *H10H 20/8515* (2025.01)

(58) Field of Classification Search
CPC ..... H01L 33/0095; H01L 33/22; H01L 33/32; H01L 33/42; H01L 33/50; G09G 3/32; G09G 2300/0426; G09G 2300/0452; G09G 2300/0809; H10H 20/01; H10H 20/018; H10H 20/01335; H10H 20/032; H10H 20/0361; H10H 20/82; H10H 20/825; H10H 20/833; H10H 20/835; H10H 20/8515; H10H 20/857; H10H 20/851; H10H 20/852; G09F 9/00; G09F 9/30; G09F 9/33; H10W 90/00
USPC .......................................................... 257/211
See application file for complete search history.

(56) References Cited

U.S. PATENT DOCUMENTS

2007/0273292 A1 11/2007 Choi et al.
2010/0026779 A1* 2/2010 Yonehara ................... B41J 2/45 438/34
2010/0109023 A1* 5/2010 Yonehara ................... B41J 2/45 438/458
2010/0197054 A1* 8/2010 Yonehara ................ H01L 27/15 257/E33.044
2012/0049224 A1 3/2012 Mizutani et al.
2012/0126259 A1 5/2012 Mizutani et al.
2012/0161183 A1 6/2012 Ubahara et al.
2012/0171866 A1* 7/2012 Yonehara ............ H01L 33/0093 257/E21.241
2012/0282716 A1 11/2012 Yonehara et al.
2014/0061696 A1* 3/2014 Akaike ............... H01L 33/0093 257/98
2018/0006058 A1 1/2018 Lee
2018/0012876 A1* 1/2018 Kim ................... H10H 20/8252
2018/0012951 A1 1/2018 Sato
2018/0062042 A1 3/2018 Ito et al.
2018/0122837 A1 5/2018 Kang et al.
2018/0254226 A1* 9/2018 Iguchi ................... H01L 27/156
2018/0351035 A1 12/2018 Chung et al.
2019/0131343 A1 5/2019 Templier et al.
2019/0165227 A1* 5/2019 Oya ........................ H01L 33/46
2019/0229235 A1 7/2019 Iguchi
2019/0355766 A1 11/2019 Zhang et al.
2020/0098952 A1 3/2020 Kajiyama et al.
2021/0265542 A1* 8/2021 Ogawa ................ H01L 25/0753

FOREIGN PATENT DOCUMENTS

| | | | |
|---|---|---|---|
| JP | 2002-057283 | A | 2/2002 |
| JP | 2002-141492 | A | 5/2002 |
| JP | 2007-273985 | A | 10/2007 |
| JP | 2007-531261 | A | 11/2007 |
| JP | 2008-135419 | A | 6/2008 |
| JP | 2009-295908 | A | 12/2009 |
| JP | 2010-219310 | A | 9/2010 |
| JP | 2012-054422 | A | 3/2012 |
| JP | 2012-074665 | A | 4/2012 |
| JP | 2012-114184 | A | 6/2012 |
| JP | 2016-139560 | A | 8/2016 |
| JP | 2017-050392 | A | 3/2017 |
| JP | 2018-032820 | A | 3/2018 |
| JP | 2018-205456 | A | 12/2018 |
| JP | 2018-205741 | A | 12/2018 |
| JP | 2019-040928 | A | 3/2019 |
| JP | 2019-096716 | A | 6/2019 |
| JP | 2019-129226 | A | 8/2019 |
| JP | 2019-522894 | A | 8/2019 |
| KR | 20090074091 | A | 7/2009 |
| WO | WO-2008/155940 | A1 | 12/2008 |
| WO | WO-2012/091007 | A1 | 7/2012 |
| WO | WO-2018/132070 | A1 | 7/2018 |

* cited by examiner 160a
153S
158
130
160k
160
156
150
153
152
151
p
n
161k
161d
110d
112
110
108
101
100
105
104
102

160a
159a
153S
158
130
159k
160k
160
156
150
153
152
151
p
n
161k
161d
110d
112
110
108
101
100
105
104
102

150
172
1192
100

181a
150
172
1192
100

183a
181a
150
172
1192
100

184a
183a
181a
150
172
1192
100

IMAGE DISPLAY DEVICE AND METHOD FOR MANUFACTURING IMAGE DISPLAY DEVICE

CROSS-REFERENCE TO RELATED APPLICATIONS

The present application is a bypass continuation of PCT Application No. PCT/JP2020/017014, filed Apr. 20, 2020, which claims priority to Japanese Application No. 2019-088536, filed May 8, 2019, and Japanese Application No. 2019-179860, filed Sep. 30, 2019. The contents of these applications are hereby incorporated by reference in their entireties.

BACKGROUND

The present disclosure relates to an image display device and a method for manufacturing an image display device.

It is desirable to realize an image display device that is thin and has high luminance, a wide viewing angle, high contrast, and low power consumption. To satisfy such market needs, a display device that utilizes a self-luminous element is being developed.

There are expectations for the advent of a display device that uses a micro LED that is a fine light-emitting element as a self-luminous element. A method has been introduced as a method for manufacturing a display device that uses a micro LED in which individually-formed micro LEDs are sequentially transferred to a drive circuit. However, as the number of elements of micro LEDs increases with higher image quality such as full HD, 4K, 8K, etc., if many micro LEDs are individually formed and sequentially transferred to a substrate in which a drive circuit and the like are formed, an enormous amount of time is necessary for the transfer process. Also, there is a risk that connection defects between the micro LEDs, the drive circuits, etc., may occur, and a decrease of the yield may occur.

In known technology, a semiconductor layer that includes a light-emitting layer is grown on a Si substrate; an electrode is formed at the semiconductor layer; subsequently, bonding is performed to a circuit board in which a drive circuit is formed (see, e.g., Japanese Patent Publication No. 2002-141492).

SUMMARY

According to certain embodiments of the present invention, a method for manufacturing an image display device is provided in which a transfer process of a light-emitting element is shortened, and yield is increased.

A method for manufacturing an image display device according to one embodiment of the invention includes a process of preparing a substrate in which a semiconductor layer including a light-emitting layer is formed on a first substrate, a process of forming a metal layer on the semiconductor layer, a process of bonding the semiconductor layer via the metal layer to a second substrate in which a circuit including a circuit element is formed, a process of forming a light-emitting element by patterning the semiconductor layer, a process of forming a first wiring layer by patterning the metal layer, a process of forming an insulating film that covers the light-emitting element and the first wiring layer, a process of forming a first via that extends through the insulating film and reaches the circuit, a process of forming a second wiring layer on the insulating film, and a process of connecting the first wiring layer, the second wiring layer, the first via, the light-emitting element, and the circuit element in series.

An image display device according to one embodiment of the invention includes: a circuit element; a first wiring layer electrically connected to the circuit element; a first insulating film covering the circuit element and the first wiring layer; a second wiring layer located on the first insulating film; a light-emitting element located on the second wiring layer, and including a first semiconductor layer that is connected to the second wiring layer and is of a first conductivity type, a light-emitting layer that is located on the first semiconductor layer, and a second semiconductor layer that is located on the light-emitting layer and is of a second conductivity type that is different from the first conductivity type; a second insulating film covering the second wiring layer and at least a portion of the light-emitting element; a third wiring layer located on the second insulating film and electrically connected to the light-emitting element; and a first via extending through the first and second insulating films and electrically connecting the first and third wiring layers. In a plan view, an outer perimeter of the light-emitting element is located within an outer perimeter of a part of the second wiring layer.

An image display device according to one embodiment of the invention includes: multiple transistors; a first wiring layer electrically connected to the multiple transistors; a first insulating film covering the multiple transistors and the first wiring layer; a second wiring layer located on the first insulating film; a first semiconductor layer that is located on the second wiring layer and is of a first conductivity type; a light-emitting layer located on the first semiconductor layer; a second semiconductor layer that is located on the light-emitting layer and is of a second conductivity type that is different from the first conductivity type; a second insulating film that covers the first insulating film, the second wiring layer, the first semiconductor layer, and the light-emitting layer and covers at least a portion of the second semiconductor layer; a third wiring layer connected to a transparent electrode that is located on multiple exposed surfaces of the second semiconductor layer, wherein the multiple exposed surfaces are exposed from the second insulating film to correspond respectively to the multiple transistors; and a first via extending through the first and second insulating films and electrically connecting a wiring portion of the first wiring layer and a wiring portion of the third wiring layer. In a plan view, outer perimeters of the first semiconductor layer, the light-emitting layer, and the second semiconductor layer are located within an outer perimeter of a part of the second wiring layer.

Advantageous Effects of Invention

According to certain embodiments of the invention, a method for manufacturing an image display device is realized in which a transfer process of a light-emitting element is shortened, and yield is increased.

DETAILED DESCRIPTION

Figure 1:
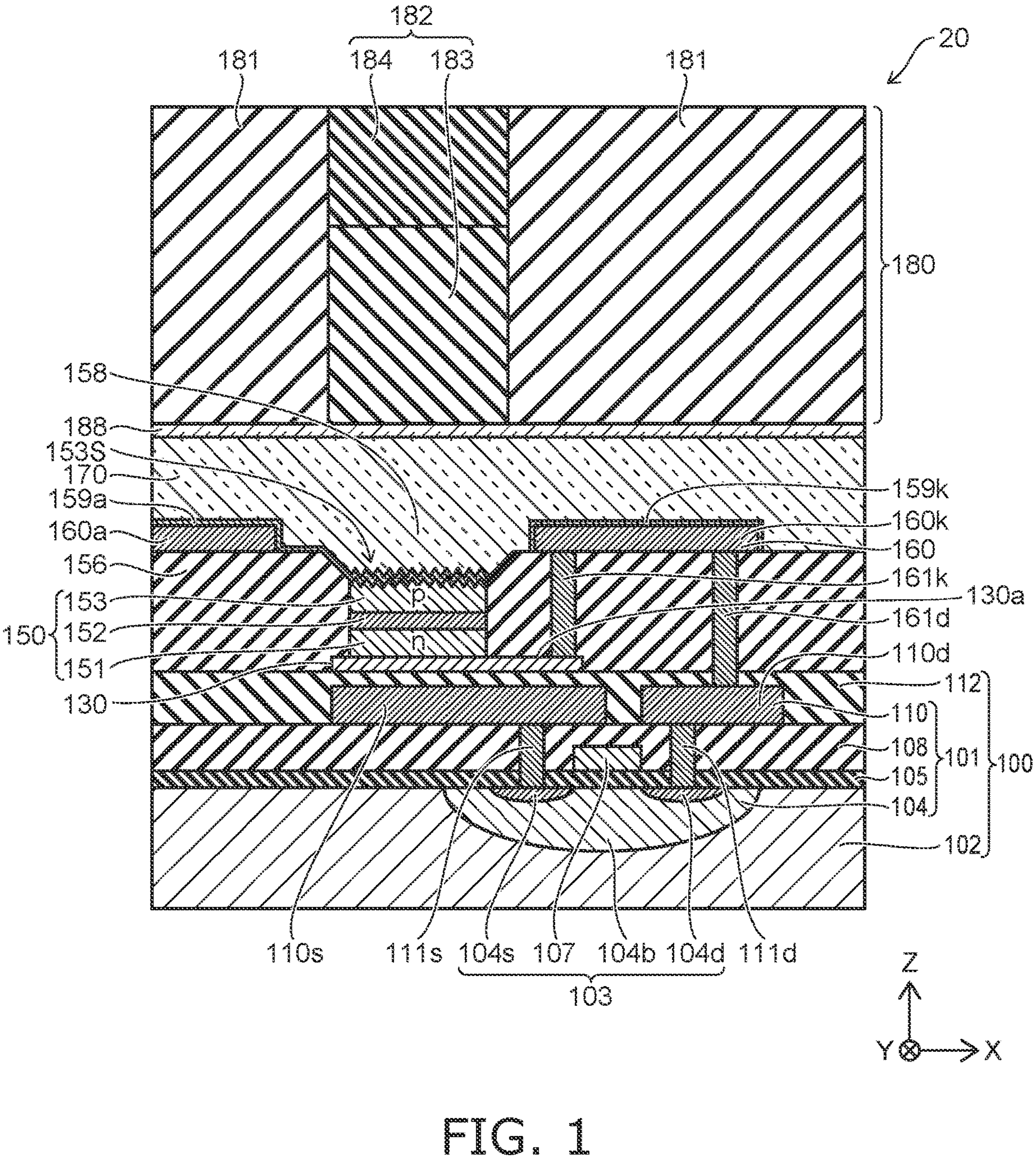
FIG. 1 is a schematic cross-sectional view illustrating a portion of an image display device according to a first embodiment.

Embodiments of the invention will now be described with reference to the drawings.

The drawings are schematic or conceptual, and the relationships between the thickness and width of portions, the proportions of sizes among portions, etc., are not necessarily the same as the actual values. Also, the dimensions and proportions may be illustrated differently among drawings, even when the same portion is illustrated.

In the specification and drawings, components similar to those described previously or illustrated in an antecedent drawing are identified with the same reference numerals, and a repeated detailed description is omitted as appropriate.

First Embodiment

FIG. 1 is a schematic cross-sectional view illustrating a portion of an image display device according to an embodiment.

The configuration of a subpixel 20 of the image display device of the embodiment is schematically shown in FIG. 1. A pixel 10 that is included in an image displayed in the image display device includes multiple subpixels 20.

Hereinbelow, the description may use an XYZ three-dimensional coordinate system. The subpixels 20 are arranged on a two-dimensional plane. The two-dimensional plane in which the subpixels 20 are arranged is taken as an XY plane. The subpixels 20 are arranged along an X-axis direction and a Y-axis direction.

The subpixel 20 includes a light-emitting surface 153S that is substantially parallel to the XY plane. The light-emitting surface 153S outputs light mainly toward a positive direction of a Z-axis orthogonal to the XY plane.

FIG. 1 schematically shows a cross section when the subpixel 20 is cut by a plane parallel to the XZ plane. The cross-sectional view is an auxiliary cross section along line A-A' of FIG. 4 described below.

As shown in FIG. 1, the subpixel 20 of the image display device includes a transistor 103, a first wiring layer 110, a first inter-layer insulating film (a first insulating film) 112, a second wiring layer (a second wiring layer) 130, a light-emitting element 150, a second inter-layer insulating film (a second insulating film) 156, a third wiring layer (a third wiring layer) 160, and a via (a first via) 161*d*. The subpixel 20 further includes a color filter 180. The color filter (the wavelength conversion member) 180 is located on a surface resin layer 170 with a transparent thin film adhesive layer 188 interposed. The surface resin layer 170 is located on the light-emitting element 150, the inter-layer insulating film 156, and the wiring layer 160.

The transistor 103 is formed on a substrate 102. Other than the transistor 103 for driving the light-emitting element 150, other circuit elements, such as transistors, capacitors, etc., are formed in the substrate 102, and a circuit 101 is formed using wiring portions, etc. For example, the transistor 103 corresponds to a drive transistor 26 shown in FIG. 3 described below; also, a select transistor 24, a capacitor 28, etc., are circuit elements. Hereinbelow, the circuit 101 includes an element formation region 104 in which the circuit elements are formed, an insulating layer 105, the wiring layer 110, vias that connect the wiring layer 110 and the circuit elements, and an insulating film 108 that insulates between the circuit elements and the like. The substrate 102, the circuit 101, the inter-layer insulating film 112, and other components may be inclusively called a circuit board 100.

The transistor 103 includes a p-type semiconductor region 104*b*, n-type semiconductor regions 104*s* and 104*d*, and a gate 107. The gate 107 is located on the p-type semiconductor region 104*b* with the insulating layer 105 interposed. The insulating layer 105 is provided to insulate the element formation region 104 and the gate 107 and to sufficiently insulate between the other adjacent circuit elements. A channel may be formed in the p-type semiconductor region 104*b* when a voltage is applied to the gate 107. The transistor 103 is an n-channel transistor, e.g., an n-channel MOSFET.

The element formation region 104 is located in the substrate 102. The substrate 102 is, for example, a Si substrate. The element formation region 104 includes the p-type semiconductor region 104*b* and the n-type semiconductor regions 104*s* and 104*d*. The p-type semiconductor region 104*b* is located at the surface vicinity of the substrate 102. The n-type semiconductor regions 104*s* and 104*d* are located in the p-type semiconductor region 104*b* and are separated from each other at the surface vicinity of the p-type semiconductor region 104*b*.

The insulating layer 105 is located at the surface of the substrate 102. The insulating layer 105 also covers the element formation region 104, and covers the surfaces of the p-type semiconductor region 104*b* and the n-type semiconductor regions 104*s* and 104*d*. The insulating layer 105 is, for example, $SiO_2$. The insulating layer 105 may be a multilevel insulating layer that includes $SiO_2$, $Si_3N_4$, etc., according to the covered region. The insulating layer 105 may include a layer of an insulating material that has a high dielectric constant.

The gate 107 is located on the p-type semiconductor region 104*b* with the insulating layer 105 interposed. The gate 107 is located between the n-type semiconductor regions 104*s* and 104*d*. The gate 107 is, for example, polycrystalline Si. The gate 107 may include a silicide or the like that has a lower resistance than polycrystalline Si.

In the example, the gate 107 and the insulating layer 105 are covered with the insulating film 108. The insulating film 108 is, for example, $SiO_2$, $Si_3N_4$, etc. To planarize the surface when forming the wiring layer 110, an organic insulating film such as PSG (Phosphorus Silicon Glass), BPSG (Boron Phosphorus Silicon Glass), etc., also may be provided.

The vias 111*s* and 111*d* are formed in the insulating film 108. The first wiring layer (the first wiring layer) 110 is formed on the insulating film 108. The first wiring layer 110 includes multiple wiring portions that may have different potentials, and includes wiring portions 110*s* and 110*d*. Thus, in FIG. 1 and subsequent cross-sectional views, the reference numeral of each wiring layer is displayed at a position beside one wiring portion included in the wiring layer. The vias 111*s* and 111*d* are located respectively between the n-type semiconductor regions 104*s* and 104*d* and the wiring portions 110*s* and 110*d* of the wiring layer 110 and electrically connect these components. For example, the wiring layer 110 and the vias 111*s* and 111*d* are formed of a metal such as Al, Cu, etc. The wiring layer 110 and the vias 111*s* and 111*d* may include a refractory metal, etc.

Also, the first inter-layer insulating film 112 is provided as a planarization film on the insulating film 108 and the wiring layer 110. The inter-layer insulating film (the first insulating film) 112 is, for example, an organic insulating film of PSG, BPSG, etc. The first inter-layer insulating film 112 also functions as a protective film at the circuit board 100 that protects the surface of the circuit board 100.

As shown in FIG. 1, the second wiring layer 130 is located on the inter-layer insulating film 112. The wiring layer 130 includes a light-shielding plate (a part) 130*a*. The light-shielding plate 130*a* is located at each subpixel, and the multiple light-shielding plates 130*a* are electrically insulated from each other. The light-emitting elements 150 are respectively located on the light-shielding plates 130*a*.

The wiring layer 130, i.e., the light-shielding plate 130*a*, is formed of a material that has a high conductivity. The light-shielding plate 130*a* includes, for example, Ti, Al, an alloy of Ti and Sn, etc. Cu, V, or the like, or a noble metal that has high light reflectivity such as Ag, Pt, etc., may be included. Because the light-shielding plate 130*a* is formed of such a metal material that has a high conductivity, etc., the light-emitting element 150 and the circuit 101 are electrically connected with a low resistance.

When projected onto the XY plane, an outer perimeter of the light-emitting element 150 when projected from above along the Z-axis is located within an outer perimeter of the light-shielding plate 130*a*. Thereby, the light-shielding plate 130*a* can reflect the downward-scattered light of the light-emitting element 150 toward the light-emitting surface 153S side so that the light does not reach the transistor 103. By appropriately selecting the material of the light-shielding plate 130*a*, the luminous efficiency can be increased by reflecting the downward-scattered light of the light-emitting element 150 toward the light-emitting surface 153S side. Also, by the light-shielding plate 130*a* shielding the downward-scattered light of the light-emitting element 150, the light can be prevented from reaching the transistor 103, and malfunction of the transistor 103 also can be prevented.

The light-emitting element 150 includes an n-type semiconductor layer (a first semiconductor layer) 151, a light-emitting layer 152, and a p-type semiconductor layer (a second semiconductor layer) 153. The n-type semiconductor layer 151, the light-emitting layer 152, and the p-type semiconductor layer 153 are stacked in this order from the inter-layer insulating film 112 toward the positive direction of the Z-axis. That is, the layers of the light-emitting element 150 are stacked from the inter-layer insulating film 112 toward the light-emitting surface 153S.

Although the light-emitting element 150 has, for example, a substantially square or rectangular shape when projected onto the XY plane, the corners may be rounded. The light-emitting element 150 may have, for example, an elliptical shape or a circular shape when projected onto the XY plane. By appropriately selecting the shape, arrangement, and the like of the light-emitting element when viewed in plan, the degree of freedom of the layout is increased.

It is favorable for the light-emitting element 150 to include, for example, a nitride semiconductor such as $In_XAl_YGa_{1-X-Y}N$ ($0 \leq X$, $0 \leq Y$, and $X+Y<1$), etc. The light-emitting element 150 according to one embodiment of the invention is a so-called blue light-emitting diode, and the wavelength of the light emitted by the light-emitting element 150 is, for example, about 467 nm±20 nm. The wavelength of the light emitted by the light-emitting element 150 may be a bluish-violet light emission of about 410 nm±20 nm. The wavelength of the light emitted by the light-emitting element 150 is not limited to the values described above, and can be set to an appropriate value.

The second inter-layer insulating film (the second insulating film) 156 covers the first inter-layer insulating film 112, the second wiring layer 130, and the light-emitting element 150. It is favorable for the second inter-layer insulating film 156 to be formed of a white resin. By setting the inter-layer insulating film 156 to be a white resin, the light that is emitted by the light-emitting element 150 in the lateral direction and/or the downward direction can be reflected, and the luminance of the light-emitting element 150 can be substantially increased. The inter-layer insulating film 156 has the functions of protecting the light-emitting element 150 and planarizing the surface for the wiring layer 160 that is formed on the second inter-layer insulating film 156.

The second inter-layer insulating film 156 may be a black resin. By setting the inter-layer insulating film 156 to be a black resin, the scattering of the light in the subpixel is suppressed, and stray light is more effectively suppressed. An image display device in which stray light is suppressed can display a sharper image.

The second inter-layer insulating film 156 includes an opening 158. The opening 158 is formed by removing a portion of the inter-layer insulating film 156 above the light-emitting element 150. The opening 158 is formed so that the light-emitting surface 153S is exposed from the inter-layer insulating film 156. The light-emitting surface 153S is the surface of the p-type semiconductor layer 153 that is opposite to the surface contacting the light-emitting layer 152. It is favorable to perform surface roughening of the light-emitting surface 153S. The light extraction efficiency of the light-emitting element 150 can be increased when the light-emitting surface 153S is a rough surface.

A via 161*k* (a second via) is provided to extend through the second inter-layer insulating film 156. One end of the via 161*k* is connected to the light-shielding plate 130*a*.

A via 161*d* (a first via) is provided to extend through the inter-layer insulating films 112 and 156. One end of the via 161*d* is connected to a wiring portion 110*d*.

The wiring layer 160 is located on the inter-layer insulating film 156. The wiring layer 160 includes wiring portions 160*a* and 160*k*. Although not shown in this drawing, the wiring portion 160*a* is connected to a power supply line that supplies a power supply to the subpixel 20.

A wiring portion 160*k* is connected to the other ends of the vias 161*k* and 161*d*. Accordingly, the n-type semiconductor layer 151 of the light-emitting element 150 is electrically connected to a drain electrode that is a main electrode of the transistor 103 via the light-shielding plate 130*a*, the via 161*k*, the wiring portion 160*k*, the via 161*d*, and the wiring portion 110*d*.

Transparent electrodes 159*a* and 159*k* are located respectively on the wiring portions 160*a* and 160*k*. The transparent electrode 159*a* is provided onto the light-emitting surface 153S of the p-type semiconductor layer 153 at the opening. The transparent electrode 159*a* is located between the wiring portion 160*a* and the light-emitting surface 153S and electrically connects the wiring portion 160*a* and the p-type semiconductor layer 153.

The surface resin layer 170 covers the second inter-layer insulating film 156, the transparent conductive film that includes the transparent electrodes 159*a* and 159*k*, and the third wiring layer 160. The surface resin layer 170 is a transparent resin, protects the inter-layer insulating film 156 and the wiring layer 160, and provides a planarized surface for bonding the color filter 180.

The color filter 180 includes a light-shielding part 181 and a color conversion part 182. The color conversion part 182 is located directly above the light-emitting surface 153S of the light-emitting element 150 to correspond to the shape of the light-emitting surface 153S. In the color filter 180, the part other than the color conversion part 182 is the light-shielding part 181. The light-shielding part 181 is a so-called black matrix that reduces blur due to color mixing of the light emitted from adjacent color conversion parts 182, etc., and makes it possible to display a sharp image.

The color conversion part 182 is one layer or two layers. A two-layer part is shown in FIG. 1. Whether the color conversion part 182 is one layer or two layers is determined by the color, i.e., the wavelength, of the light emitted by the subpixel 20. When the light emission color of the subpixel 20 is red or green, it is favorable for the color conversion part 182 to be two layers. When the light emission color of the subpixel 20 is blue, it is favorable to be one layer.

When the color conversion part 182 is two layers, the first layer that is more proximate to the light-emitting element 150 is a color conversion layer 183, and the second layer is a filter layer 184. That is, the filter layer 184 is stacked on the color conversion layer 183.

The color conversion layer 183 is a layer that converts the wavelength of the light emitted by the light-emitting element 150 into the desired wavelength. When the subpixel 20 emits red, light of the wavelength of the light-emitting element 150, i.e., 467 nm±20 nm, is converted into, for example, light of a wavelength of about 630 nm±20 nm. When the subpixel 20 emits green, light of the wavelength of the light-emitting element 150, i.e., 467 nm±20 nm, is converted into, for example, light of a wavelength of about 532 nm±20 nm.

The filter layer 184 shields the wavelength component of the blue light emission that remains without undergoing color conversion by the color conversion layer 183.

When the color of the light emitted by the subpixel 20 is blue, the subpixel 20 may output the light via the color conversion layer 183, or may output the light as-is without the light having passed through the color conversion layer 183. When the wavelength of the light emitted by the light-emitting element 150 is about 467 nm±20 nm, the subpixel 20 may output the light without the light having passed through the color conversion layer 183. When the wavelength of the light emitted by the light-emitting element 150 is 410 nm±20 nm, it is favorable to provide a one-layer color conversion layer 183 to convert the wavelength of the output light into about 467 nm±20 nm.

The subpixel 20 may include the filter layer 184 even when the subpixel 20 is blue. By providing the filter layer 184 in the blue subpixel 20, a micro external light reflection that occurs at the surface of the light-emitting element 150 is suppressed.

(Modification)

Modifications of the configuration of the subpixel will now be described.

Figure 2A:
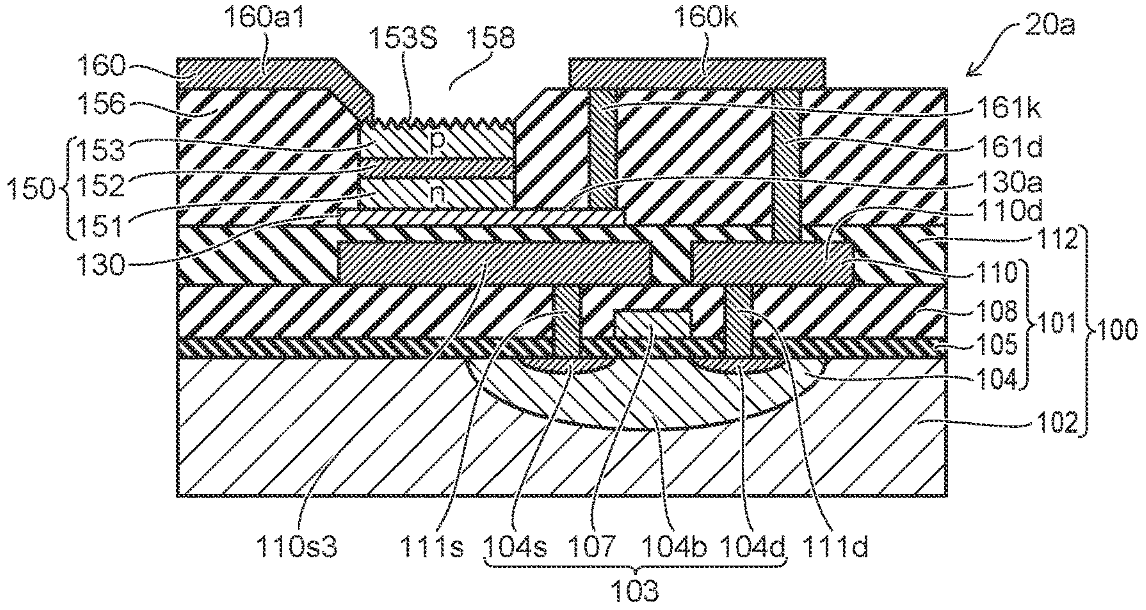
FIG. 2A is a schematic cross-sectional view illustrating one modification of the image display device of the first embodiment.
Figure 2B:
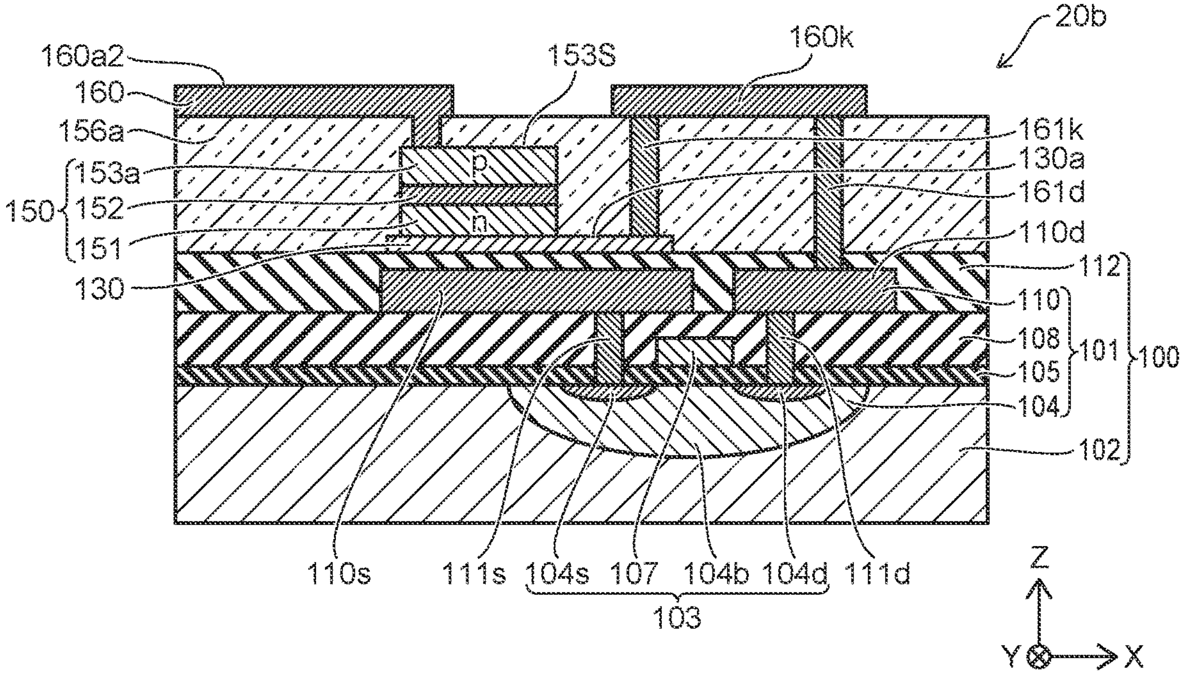
FIG. 2B is a schematic cross-sectional view illustrating one modification of the image display device of the first embodiment.

FIGS. 2A and 2B are schematic cross-sectional views respectively illustrating the modifications of the image display device of the embodiment.

In FIG. 2A and subsequent cross-sectional views of the subpixel, the surface resin layer 170 and the color filter 180 are not illustrated to avoid complexity. Unless specified otherwise, the surface resin layer 170 and the color filter 180 are located on the second inter-layer insulating film and the third wiring layer. This is similar for other embodiments and their modifications described below as well.

In FIG. 2A, the wiring portion structure that is connected to the light-emitting element 150 of a subpixel 20*a* is different from that of the first embodiment described above. The other components are the same as those of the first embodiment described above, and a detailed description is omitted as appropriate.

As shown in FIG. 2A, the subpixel 20*a* includes a wiring portion 160*a*1. The wiring portion 160*a*1 is formed as a wiring portion that is included in the third wiring layer 160. According to the modification, the electrical connection with the p-type semiconductor layer 153 is performed by connecting one end of the wiring portion 160*a*1 to a portion of the light-emitting surface 153S. According to the modification, the process of forming the transparent conductive film that includes the transparent electrodes can be omitted.

In a subpixel 20*b* as shown in FIG. 2B, a second inter-layer insulating film 156*a* is a transparent resin. An opening that corresponds to the light-emitting surface 153S is not provided in the inter-layer insulating film 156*a*. The light-emitting surface 153S is directly connected to a wiring portion 160*a*2 of the third wiring layer 160.

The light-emitting element 150 emits light from the light-emitting surface 153S via the inter-layer insulating film 156*a*. According to the modification, the process of forming the opening in the inter-layer insulating film 156*a* and the process of roughening the light-emitting surface 153S can be omitted.

The embodiment can include any of the configurations of the subpixels 20, 20*a*, and 20*b* shown in the description above. Also, modifications of subpixels similar to those of the embodiment are applicable to embodiments described below as well.

Figure 3:
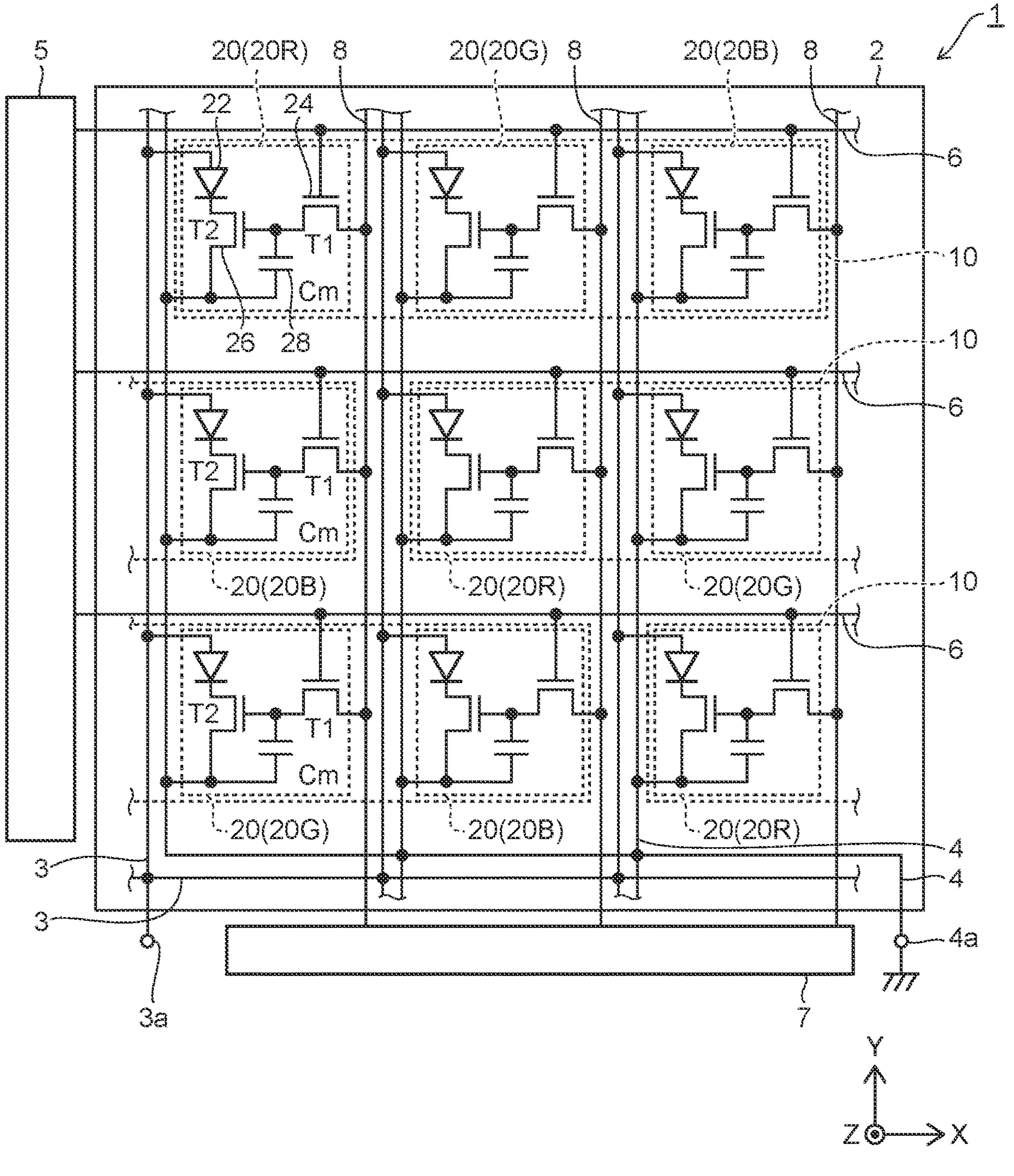
FIG. 3 is a schematic block diagram illustrating the image display device of the first embodiment.

FIG. 3 is a schematic block diagram illustrating the image display device according to the embodiment.

As shown in FIG. 3, the image display device 1 of the embodiment includes a display region 2. The subpixels 20 are arranged in the display region 2. For example, the subpixels 20 are arranged in a lattice configuration. For example, n subpixels 20 are arranged along the X-axis, and m subpixels 20 are arranged along the Y-axis.

The pixel 10 includes multiple subpixels 20 that emit light of different colors. A subpixel 20R emits red light. A subpixel 20G emits green light. A subpixel 20B emits blue light. The light emission color and luminance of one pixel 10 are determined by the three types of subpixels 20R, 20G, and 20B emitting the desired luminances.

One pixel 10 includes the three subpixels 20R, 20G, and 20B. For example, the subpixels 20R, 20G, and 20B are arranged in a straight line along the X-axis as in the example. In the pixels 10, subpixels of the same color may be arranged in the same column, or subpixels of different colors by column may be arranged as in the example.

The image display device 1 further includes a power supply line 3 and a ground line 4. The power supply line 3 and the ground line 4 are wired in a lattice configuration along the arrangement of the subpixels 20. The power supply line 3 and the ground line 4 are electrically connected to each subpixel 20, and electrical power is supplied to each subpixel 20 from a direct current power supply connected between a power supply terminal 3*a* and a GND terminal 4*a*. The power supply terminal 3*a* and the GND terminal 4*a* are provided respectively at end portions of the power supply line 3 and the ground line 4, and are connected to a direct current power supply circuit located outside the display region 2. A positive voltage when referenced to the GND terminal 4*a* is supplied to the power supply terminal 3*a*.

The image display device 1 further includes a scanning line 6 and a signal line 8. The scanning line 6 is wired in a direction parallel to the X-axis. That is, the scanning lines 6 are wired along the arrangement in the row direction of the subpixels 20. The signal line 8 is wired in a direction parallel to the Y-axis. That is, the signal lines 8 are wired along the arrangement in the column direction of the subpixels 20.

The image display device 1 further includes a row selection circuit 5 and a signal voltage output circuit 7. The row selection circuit 5 and the signal voltage output circuit 7 are located along the outer edge of the display region 2. The row selection circuit 5 is located along the Y-axis direction of the outer edge of the display region 2. The row selection circuit 5 is electrically connected to the subpixel 20 of each column via the scanning line 6, and supplies a select signal to each subpixel 20.

The signal voltage output circuit 7 is located along the outer edge of the display region 2. The signal voltage output circuit 7 is located along the X-axis direction of the outer edge of the display region 2. The signal voltage output circuit 7 is electrically connected to the subpixel 20 of each row via the signal line 8, and supplies a signal voltage to each subpixel 20.

The subpixel 20 includes a light-emitting element 22, the select transistor 24, the drive transistor 26, and the capacitor 28. In FIG. 3, the select transistor 24 may be displayed as T1, the drive transistor 26 may be displayed as T2, and the capacitor 28 may be displayed as Cm.

The light-emitting element 22 is connected in series with the drive transistor 26. According to the embodiment, the drive transistor 26 is an n-channel MOSFET, and a cathode electrode that is an n-electrode of the light-emitting element 22 is connected to a drain electrode that is a main electrode of the drive transistor 26. The series circuit of the light-emitting element 22 and the drive transistor 26 is connected between the power supply line 3 and the ground line 4. The drive transistor 26 corresponds to the transistor 103 of FIG. 1, etc., and the light-emitting element 22 corresponds to the light-emitting element 150 of FIG. 1, etc. The current that flows in the light-emitting element 22 is determined by the voltage that is applied between the gate and source of the drive transistor 26, and the light-emitting element 22 emits light of a luminance corresponding to the current flowing in the light-emitting element 22.

The select transistor 24 is connected between the signal line 8 and the gate electrode of the drive transistor 26 via a main electrode. The gate electrode of the select transistor 24 is connected to the scanning line 6. The capacitor 28 is connected between the ground line 4 and the gate electrode of the drive transistor 26.

The row selection circuit 5 selects one row from the arrangement of m rows of the subpixels 20 and supplies the select signal to the scanning line 6. The signal voltage output circuit 7 supplies a signal voltage that has an analog voltage value necessary for each subpixel 20 of the selected row. The signal voltage is applied between the gates and sources of the drive transistors 26 of the subpixels 20 of the selected row. The signal voltage is maintained by the capacitor 28. The drive transistor 26 causes a current that corresponds to the signal voltage to flow in the light-emitting element 22. The light-emitting element 22 emits light of a luminance that corresponds to the current that flows.

The row selection circuit 5 sequentially switches the row that is selected, and supplies the select signal. That is, the row selection circuit 5 scans through the rows in which the subpixels 20 are arranged. Light emission is performed by currents that correspond to the signal voltages flowing in the light-emitting elements 22 of the subpixels 20 that are sequentially scanned. An image is displayed in the display region 2 by each pixel 10 emitting the light emission color and luminance determined by the light emission color and luminance emitted by the subpixels 20 of the colors of RGB.

Figure 4:
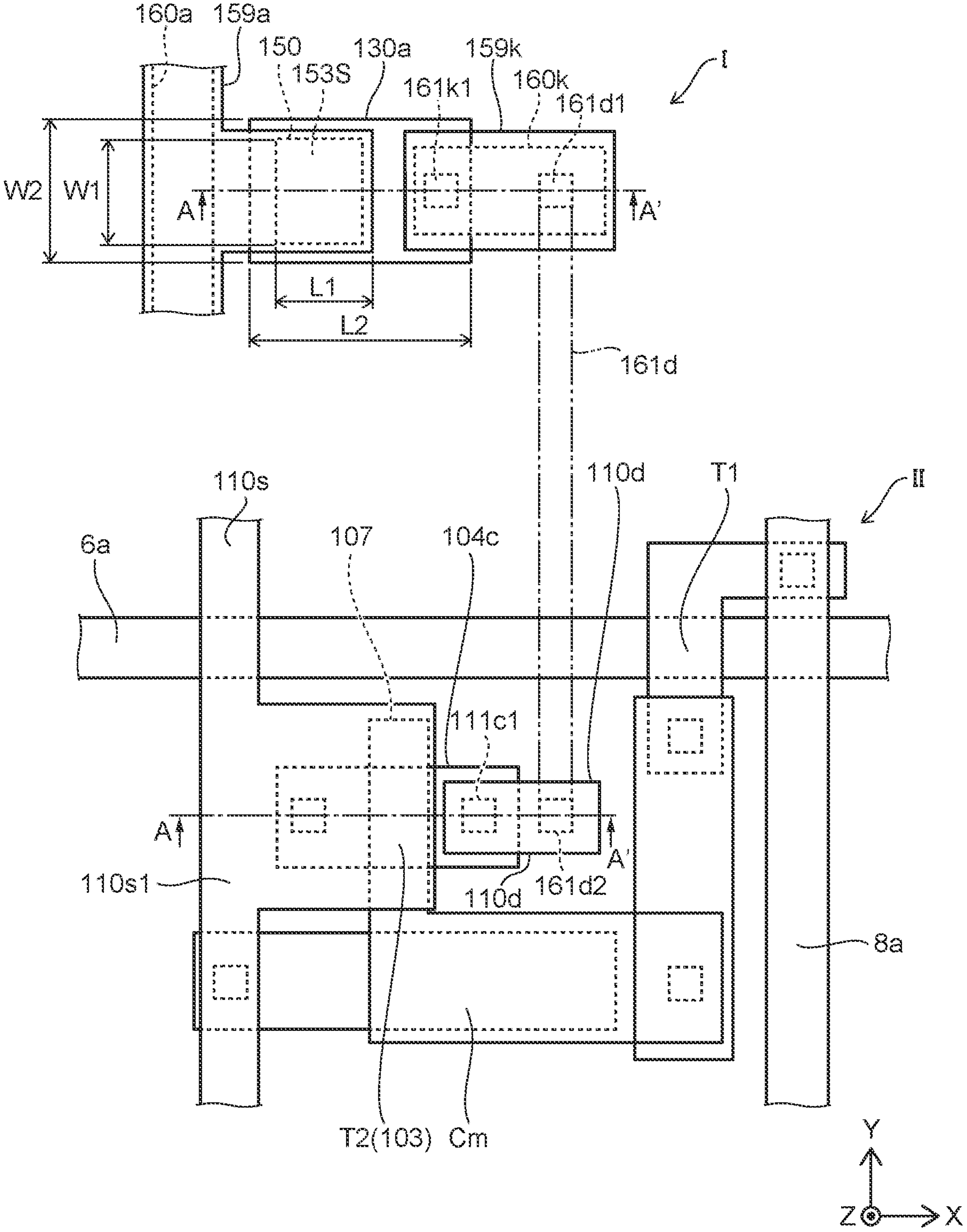
FIG. 4 is a schematic plan view illustrating a portion of the image display device of the first embodiment.

FIG. 4 is a schematic plan view illustrating a portion of the image display device of the embodiment.

According to the embodiment as described in reference to FIG. 1, the light-emitting element 22 (150) and the drive transistor 26 (103) are stacked in the Z-axis direction, and the cathode electrode of the light-emitting element 22 (150) and the drain electrode of the drive transistor 26 (103) are electrically connected by the via 161*d*.

A plan view of a Ith layer is schematically displayed in the upper portion of FIG. 4, and a plan view of a IIth layer is schematically displayed in the lower portion. In FIG. 4, the Ith layer is labeled "I", and the IIth layer is labeled "II". The Ith layer is the layer in which the light-emitting element 22 (150) is formed. In other words, the Ith layer includes the layer from the second wiring layer 130 to the third wiring layer 160 in the positive direction of the Z-axis in FIG. 1. The second inter-layer insulating film 156 is not shown in FIG. 4. The IIth layer includes the layer from the substrate 102 to the first inter-layer insulating film 112 in the positive direction of the Z-axis in FIG. 1. The substrate 102, the insulating layer 105, the insulating film 108, and the first inter-layer insulating film 112 are not shown in FIG. 4. A channel region 104*c* is shown as the element formation region 104 in this drawing.

The cross-sectional view shown in FIG. 1 is an auxiliary cross section along line AA' at the location shown by single dot-dash lines in each of the Ith layer and the IIth layer.

As shown in FIG. 4, the wiring portion 160*k* is connected to the n-type semiconductor layer 151 that is used as a cathode electrode of the light-emitting element 150 by the via 161*k* and a contact hole 161*k*1 of the via 161*k* shown in FIG. 1. The wiring portion 160*k* is connected to one end of the via 161*d* via a contact hole 161*d*1 that is located in the second inter-layer insulating film 156. The via 161*d* is schematically shown by a double dot-dash line in the drawing. A transparent electrode 159*k* is located on the wiring portion 160*k*.

The transparent electrode 159*a* is located at the p-type semiconductor layer 153 that is used as an anode electrode of the light-emitting element 150 over the entire surface of the light-emitting surface 153S that is the surface of the p-type semiconductor layer 153. The transparent electrode 159*a* also is located on the wiring portion 160*a* that is the third wiring layer 160. The transparent electrode 159*a* is located between the light-emitting surface 153S and the wiring portion 160*a* that is the third wiring layer 160, and electrically connects the light-emitting surface 153S and the wiring portion 160*a*.

The other end of the via 161*d* is connected to the wiring portion 110*d* via a contact hole 161*d*2 located in the first inter-layer insulating film 112. The wiring portion 110*d* is connected to a via 111*d* (FIG. 1) and is connected to the drain electrode of the transistor 103 via a contact hole 111*c*1 that is made in the insulating film 108. Thus, the light-emitting element 150 and the transistor 103 that are formed respectively in the Ith layer and the IIth layer that are different layers can be electrically connected by the via 161*d* that extends through the inter-layer insulating films 156 and 112.

The arrangement of the light emission of the light-emitting element 150 being shielded by the light-shielding plate 130*a* will now be described using FIG. 4.

The light-emitting element 150 includes a rectangular bottom surface that has a length L1 in the X-axis direction and a length W1 in the Y-axis direction. The light-shielding plate (the part) 130*a* has a rectangular shape that has a length L2 in the X-axis direction and a length W2 in the Y-axis direction. The light-emitting element 150 is located on the light-shielding plate 130*a*.

The lengths of the components described above are set so that L2>L1 and W2>W1. The light-emitting element 150 is located on the light-shielding plate 130*a* and is disposed so that the outer perimeter of the light-emitting element 150 is located within the outer perimeter of the light-shielding plate 130*a*. It is sufficient for the outer perimeter of the light-emitting element 150 to be located within the outer perimeter of the light-shielding plate 130*a*. The shape of the light-shielding plate 130*a* and the shape of the light-emitting element 150 are not limited to rectangular, and may be any appropriate shape.

The light-emitting element 150 emits light upward, and the downward light emission, the reflected light at the interface between the inter-layer insulating film 112 and the surface resin layer 170, the scattered light, etc., exist. Accordingly, it is favorable for the outer perimeter of the light-shielding plate 130*a* to be set so that the outer perimeter of the light-emitting element 150 projected onto the light-shielding plate 130*a* when projected onto the XY plane is located within the outer perimeter of the light-shielding plate 130*a*. By thus setting the light-shielding plate 130*a*, the light that reaches the region below the light-emitting element 150 can be suppressed, and the effects of the light on the circuit element can be reduced.

A method for manufacturing the image display device 1 of the embodiment will now be described.

FIGS. 5A to 9B are schematic cross-sectional views illustrating the method for manufacturing the image display device of the embodiment.

Figure 5A:
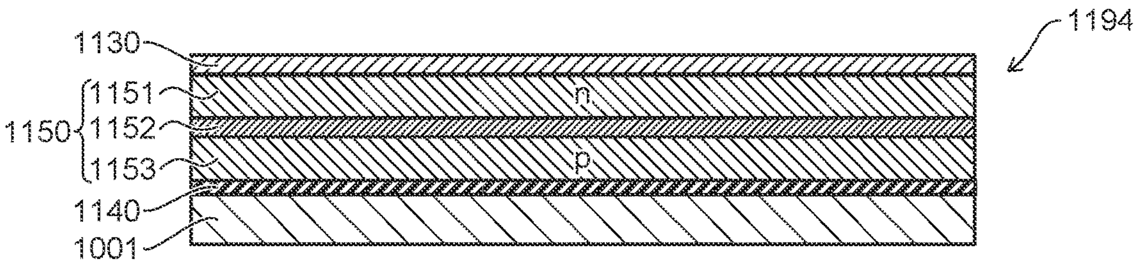
FIG. 5A is a schematic cross-sectional view illustrating a method

A semiconductor growth substrate 1194 is prepared as shown in FIG. 5A. The semiconductor growth substrate 1194 includes a semiconductor layer 1150 that is grown on a crystal growth substrate (a first substrate) 1001. The crystal growth substrate 1001 is, for example, a Si substrate, a sapphire substrate, etc. It is favorable to use a Si substrate.

In the example, a buffer layer 1140 is formed at one surface of the crystal growth substrate 1001. It is favorable for the buffer layer (the buffer layer) 1140 to include a nitride such as AlN, etc. The buffer layer 1140 is used to relax the mismatch at the interface between the GaN crystal and the crystal growth substrate 1001 when epitaxially growing GaN.

In the semiconductor growth substrate 1194, a p-type semiconductor layer 1153, a light-emitting layer 1152, and an n-type semiconductor layer 1151 are stacked on the buffer layer 1140 in this order from the buffer layer 1140 side. For example, vapor deposition (Chemical Vapor Deposition, CVD) is used to grow the semiconductor layer 1150, and it is favorable to use metal-organic chemical vapor deposition (Metal Organic Chemical Vapor Deposition, MOCVD). The semiconductor layer 1150 is, for example, $In_XAl_YGa_{1-X-Y}N$ ($0 \leq X$, $0 \leq Y$, and $X+Y<1$), etc.

A metal layer 1130 is formed at the surface of the semiconductor layer 1150 at the side that is opposite to the surface at the crystal growth substrate 1001 side. That is, the metal layer 1130 is formed on the surface of the n-type semiconductor layer 1151 that is opposite to the surface of the n-type semiconductor layer 1151 at which the light-emitting layer 152 is located. The metal layer 1130 includes, for example, Ti, Al, an alloy of Ti and Sn, etc. Cu, V, or the like, or a noble metal that has high light reflectivity such as Ag, Pt, etc., may be included.

Figure 5B:
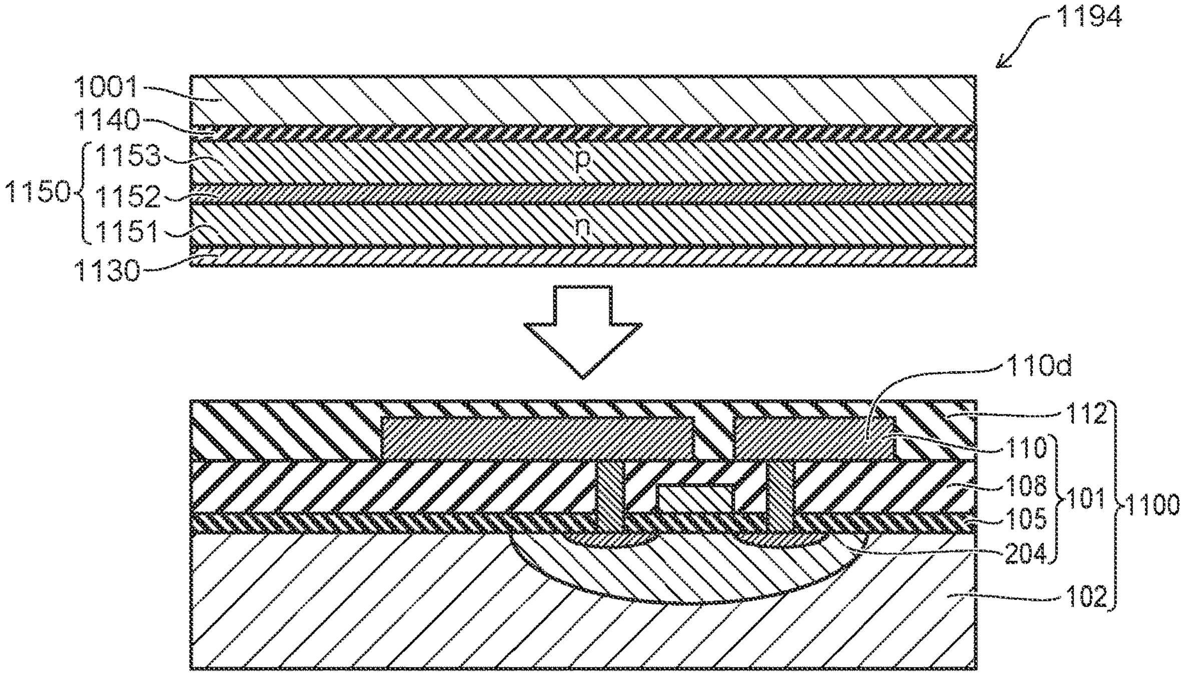
FIG. 5B is a schematic cross-sectional view illustrating the method for manufacturing the image display device of the first embodiment.

A circuit board 1100 is prepared as shown in FIG. 5B. The circuit board (the second substrate) 1100 includes the circuit 101 described with reference to FIG. 1, etc. The semiconductor growth substrate 1194 is vertically inverted. That is, one surface of the circuit board 1100 is caused to face the surface of the metal layer 1130 formed on the semiconductor layer 1150 as shown by the arrow of the drawing, and the two are bonded. The bonding surface of the circuit board 1100 is the exposed surface of the inter-layer insulating film 112 formed on the wiring layer 110. Subsequently, the crystal growth substrate 1001 is removed. For example, wet etching and/or laser lift-off is used to remove the crystal growth substrate 1001.

In the wafer bonding that bonds the two substrates, for example, the two substrates are heated, and the two substrates are bonded by thermal compression bonding. A low melting-point metal and/or a low melting-point alloy may be used when performing thermal compression bonding. The low melting-point metal is, for example, Sn, In, etc.; the low melting-point alloy can be, for example, an alloy having Zn, In, Ga, Sn, Bi, etc., as a primary component.

In the wafer bonding, other than the above description, the bonding surfaces of the substrates may be cleaned by plasma processing in a vacuum and closely adhered after planarizing the bonding surfaces by chemical mechanical polishing (Chemical Mechanical Polishing, CMP), etc.

Figure 6A:
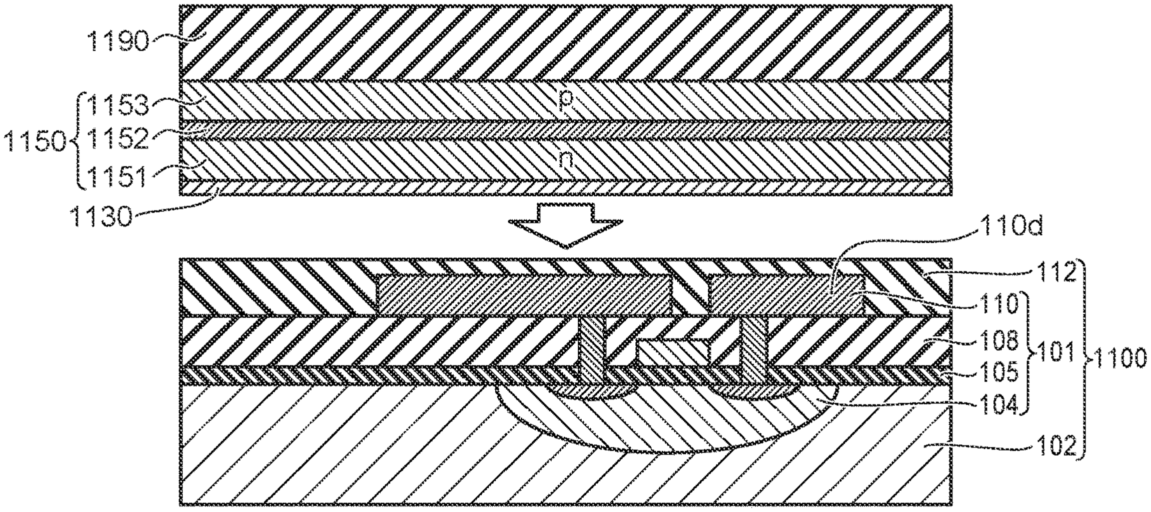
FIG. 6A is a schematic cross-sectional view illustrating a method for manufacturing a modification of the image display device of the first embodiment.
Figure 6B:
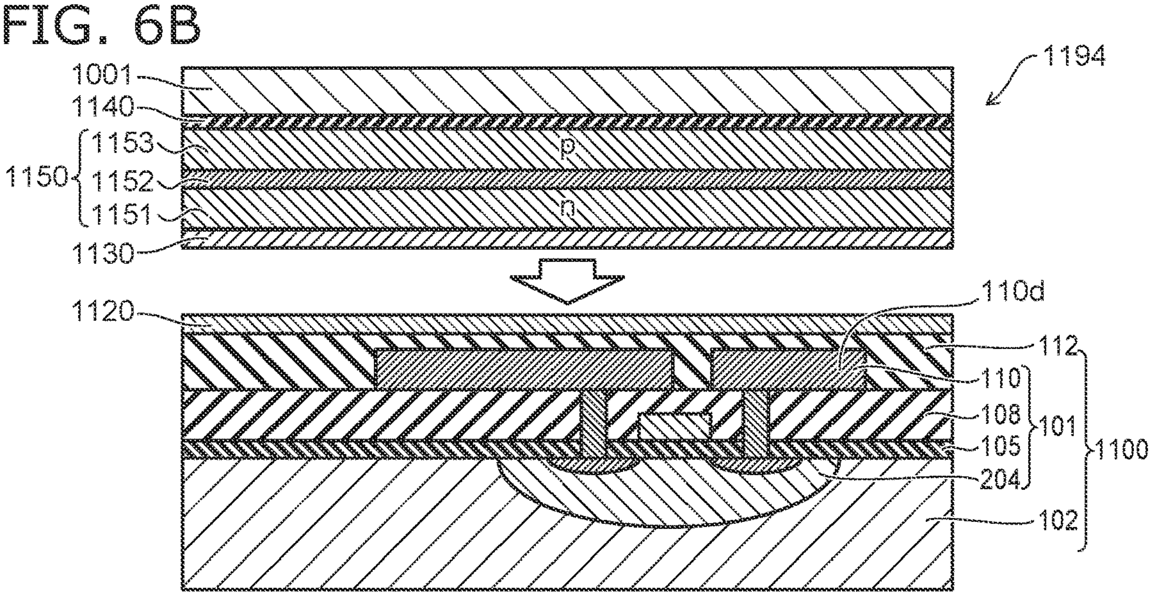
FIG. 6B is a schematic cross-sectional view illustrating a method for manufacturing a modification of the image display device of the first embodiment.
Figure 6C:
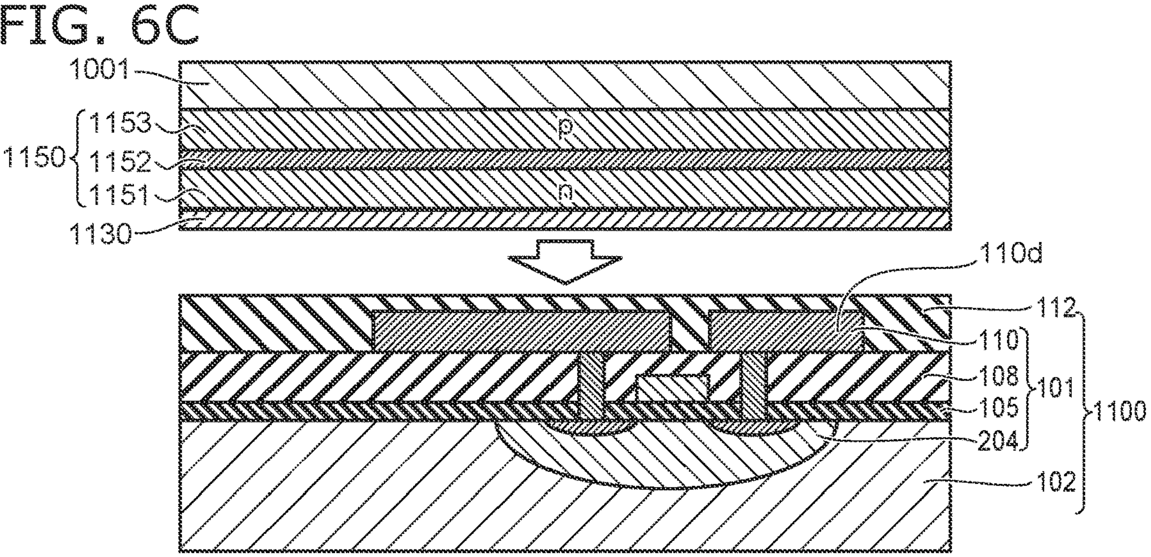
FIG. 6C is a schematic cross-sectional view illustrating a method for manufacturing a modification of the image display device of the first embodiment.

Modifications of the wafer bonding process are shown in FIGS. 6A to 6C. In the wafer bonding process, any of FIGS. 6A to 6C can be used instead of the process of FIG. 5B.

As shown in FIG. 6A, the semiconductor layer 1150 includes the n-type semiconductor layer 1151, the light-emitting layer 1152, and the p-type semiconductor layer 1153 that are stacked by growing on the crystal growth substrate 1001 in this order from the crystal growth substrate 1001 side. After the semiconductor layer 1150 is formed, a support substrate 1190 is bonded to the surface of the p-type semiconductor layer 1153 opposite to the surface at the side at which the light-emitting layer 1152 is located, i.e., the surface of the p-type semiconductor layer 1153 that is not covered. For example, the support substrate 1190 (a third substrate) is formed of Si, quartz, etc. Subsequently, the crystal growth substrate 1001 is removed. For example, a laser is used to remove the crystal growth substrate 1001. Subsequently, the metal layer 1130 is formed at the surface of the n-type semiconductor layer 1151 that is not covered.

Although the support substrate 1190 is bonded after the buffer layer 1140 is removed in the example, the support substrate 1190 may be bonded to the buffer layer 1140, and the buffer layer 1140 may be removed after the wafer bonding process.

As shown in FIG. 6B, the metal layer 1130 may be formed on the semiconductor growth substrate 1194, and a metal layer 1120 also may be formed on the circuit board 1100. According to the modification, metal layers are bonded to each other; therefore, the wafer bonding can be performed more easily by using the same metal material or alloys including the same metal material in the metal layers. It is sufficient for a metal layer to be located on at least one of the semiconductor growth substrate 1194 side or the circuit board 1100 side.

As shown in FIG. 6C, when crystal growth of the semiconductor layer 1150 on the crystal growth substrate 1001 is performed, the semiconductor growth substrate may be formed without interposing the buffer layer 1140. In such a case, the process of removing the buffer layer after the wafer bonding can be omitted.

The description continues now by returning to the manufacturing process after the wafer bonding.

Figure 7A:
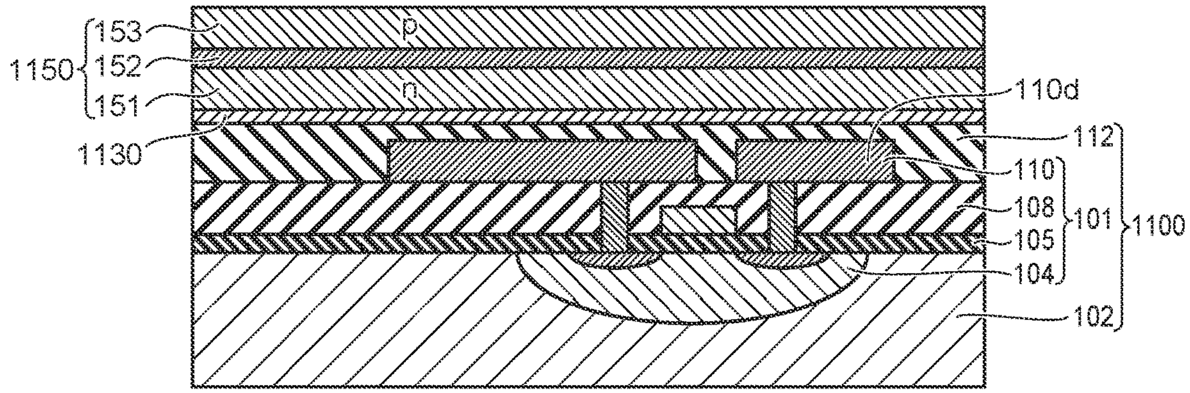
FIG. 7A is a schematic cross-sectional view illustrating the method for manufacturing the image display device of the first embodiment.
Figure 7B:
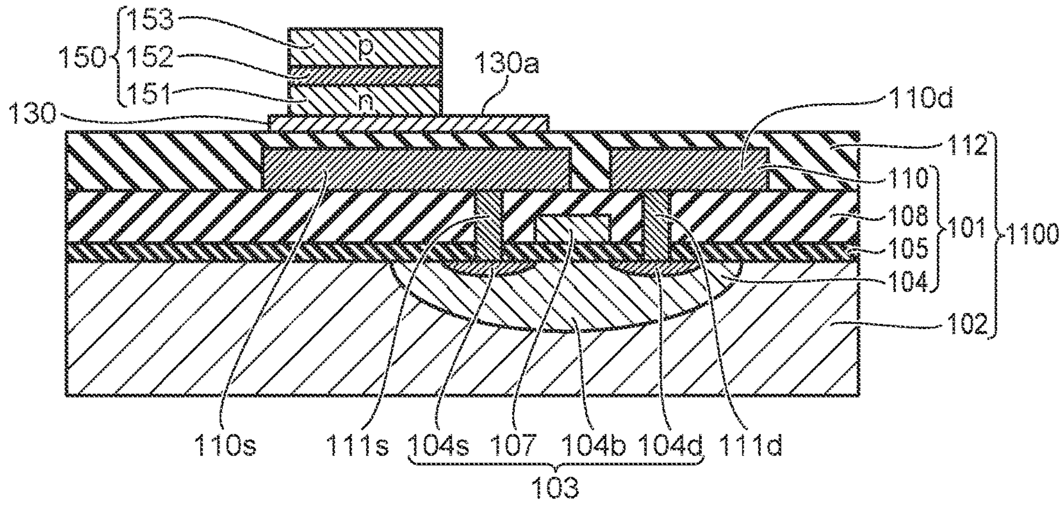
FIG. 7B is a schematic cross-sectional view illustrating the method for manufacturing the image display device of the first embodiment.

As shown in FIGS. 7A and 7B, the circuit board 1100 is bonded to the semiconductor layer 1150 via the metal layer 1130 by the wafer bonding. The metal layer 1130 and the semiconductor layer 1150 are formed into the necessary shape by etching. The second wiring layer 130 is formed by etching the metal layer 1130. The wiring layer 130 includes the light-shielding plate 130*a*. The light-shielding plate 130*a* is formed into the shape described above by etching. The shape of the light-emitting element 150 is formed by further etching the semiconductor layer 1150. For example, a dry etching process is used to form the light-emitting element 150, and it is favorable to use anisotropic plasma etching (Reactive Ion Etching, RIE).

Figure 8A:
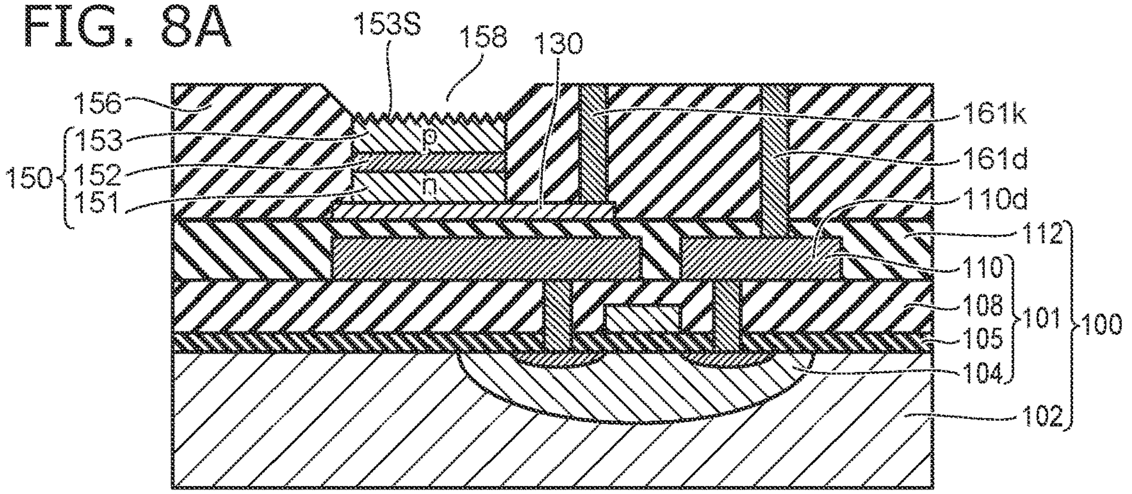
FIG. 8A is a schematic cross-sectional view illustrating the method for manufacturing the image display device of the first embodiment.

As shown in FIG. 8A, the inter-layer insulating film 156 that covers the light-emitting element 150 is formed. Via holes are formed in the inter-layer insulating film 156. Subsequently, a conductive metal material is filled into the via holes. One of wet etching or dry etching can be used to form the via holes.

Subsequently, a conductive layer is formed in the via holes by sputtering, etc. The vias and the wiring layers may be simultaneously formed after forming the via holes.

The opening 158 is formed by etching the second inter-layer insulating film 156, and the surface of the p-type semiconductor layer 153 is exposed. The etching may be wet etching or dry etching.

Subsequently, the exposed light-emitting surface 153S of the p-type semiconductor layer 153 is roughened by wet etching or the like to increase the luminous efficiency.

Figure 8B:
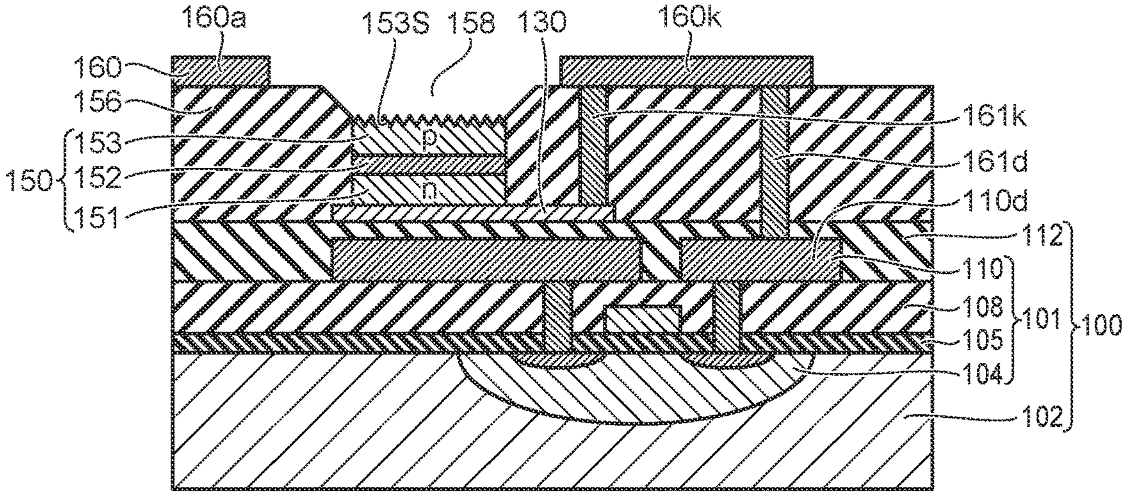
FIG. 8B is a schematic cross-sectional view illustrating the method for manufacturing the image display device of the first embodiment.

As shown in FIG. 8B, the third wiring layer 160 is formed in the opening 158 as well, and the wiring portions 160*a* and 160*k* are formed by photolithography. The wiring portion 160*a* is not connected to the p-type semiconductor layer 153.

Figure 8C:
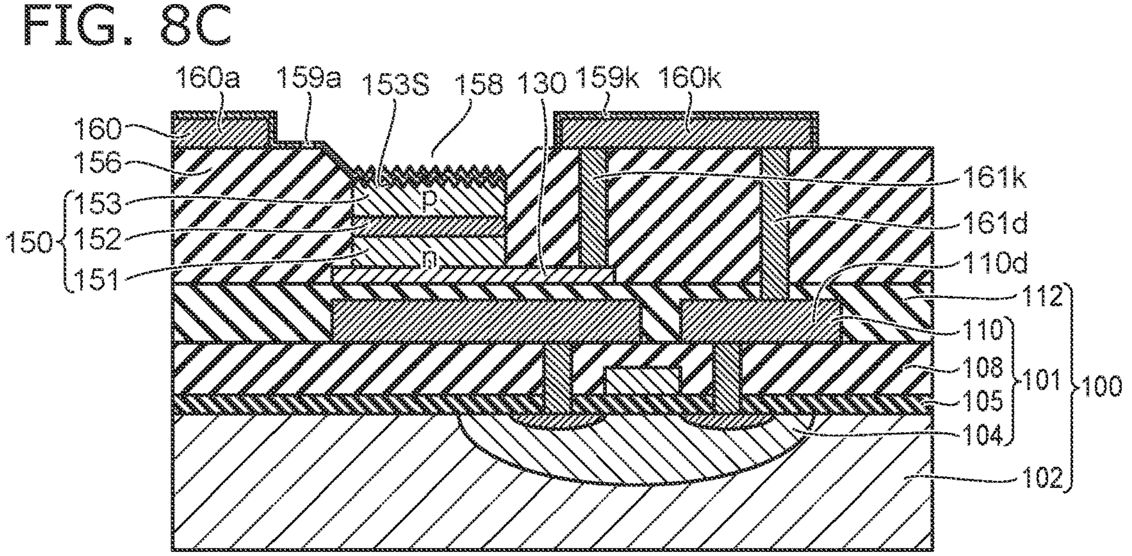
FIG. 8C is a schematic cross-sectional view illustrating the method for manufacturing the image display device of the first embodiment.

As shown in FIG. 8C, a transparent conductive film that covers the wiring layer 160, the second inter-layer insulating film 156, and the light-emitting surface 153S of the p-type semiconductor layer 153 is formed. It is favorable for the transparent conductive film to include an ITO film, a ZnO film, etc. The necessary transparent electrodes 159*a* and 159*k* are formed by photolithography.

The transparent electrode 159*a* is formed on the wiring portion 160*a*, and is also formed on the light-emitting surface 153S of the p-type semiconductor layer 153. Accordingly, the wiring portion 160*a* and the p-type semiconductor layer 153 are electrically connected. It is favorable for the transparent electrode 159*a* to be provided to cover the entire surface of the exposed light-emitting surface 153S, and to be connected to the light-emitting surface 153S.

Figure 9A:
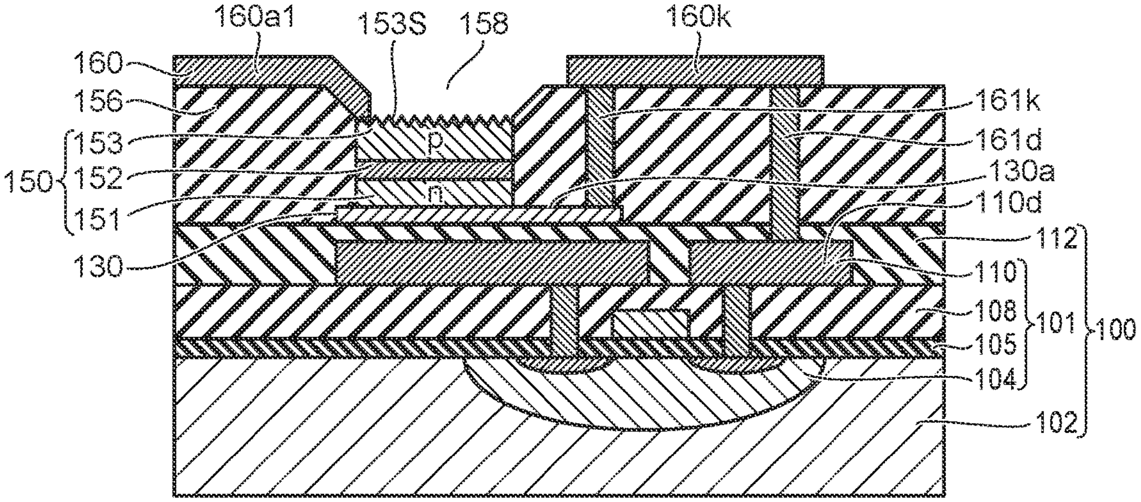
FIG. 9A is a schematic cross-sectional view illustrating a method for manufacturing a modification of the image display device of the first embodiment.
Figure 9B:
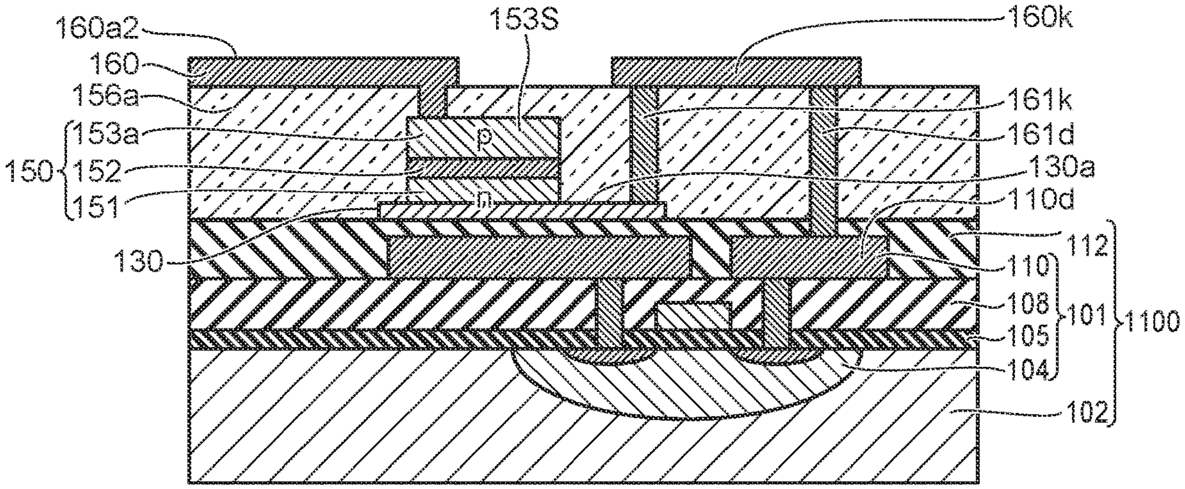
FIG. 9B is a schematic cross-sectional view illustrating a method for manufacturing a modification of the image display device of the first embodiment.

FIGS. 9A and 9B illustrate manufacturing processes that correspond respectively to the subpixels 20*a* and 20*b* of the modifications. The process as shown in FIG. 9A is performed after the process as shown in FIG. 7B, and the subpixel 20*a* is formed by performed the process as shown in FIG. 9A. The process as shown in FIG. 9B is performed after the process as shown in FIG. 7B, and the subpixel 20*b* is formed by performed the process as shown in FIG. 9B.

As shown in FIG. 9A, the wiring portions 160*a*1 and 160*k* are formed after forming the opening 158 to expose the light-emitting surface 153S of the p-type semiconductor layer 153. The wiring portion 160*a*1 is connected to the light-emitting surface 153S of the p-type semiconductor layer 153 instead of the electrical connection by the transparent electrode.

As shown in FIG. 9B, the third wiring layer 160 is formed after forming the second inter-layer insulating film 156*a* without forming an opening, and the wiring portion 160*a*2 is connected to the light-emitting surface 153S of the p-type semiconductor layer 153.

Thus, the subpixels 20*a* and 20*b* of the modifications are formed.

A portion of the circuit other than the subpixel 20 is formed in the circuit board 100. For example, the row selection circuit 5 (FIG. 3) can be formed in the circuit board 100 together with the drive transistors, the select transistors, etc. That is, there are cases where the row selection circuit 5 is simultaneously embedded by the manufacturing processes described above. On the other hand, it is desirable for the signal voltage output circuit 7 to be embedded in a semiconductor device that is manufactured by manufacturing processes in which higher integration by fine patterning is possible. For example, the signal voltage output circuit 7 is mounted to another substrate together with a CPU and other circuit components, and is connected with the wiring portions of the circuit board 100 before embedding the color filter described below or after embedding the color filter.

It is favorable for the circuit board 1100 to be a wafer that includes the circuit 101. The circuit 101 is formed in the circuit board 1100 for one or multiple image display devices. Or, in the case of a larger screen size, etc., the circuit 101 for configuring one image display device may be formed by being subdivided into multiple circuit boards 1100, and one image display device may be formed by combining all of the subdivided circuits.

Also, it is favorable for the crystal growth substrate 1001 to be a wafer of the same size as the wafer-shaped circuit board 1100.

Figure 10:
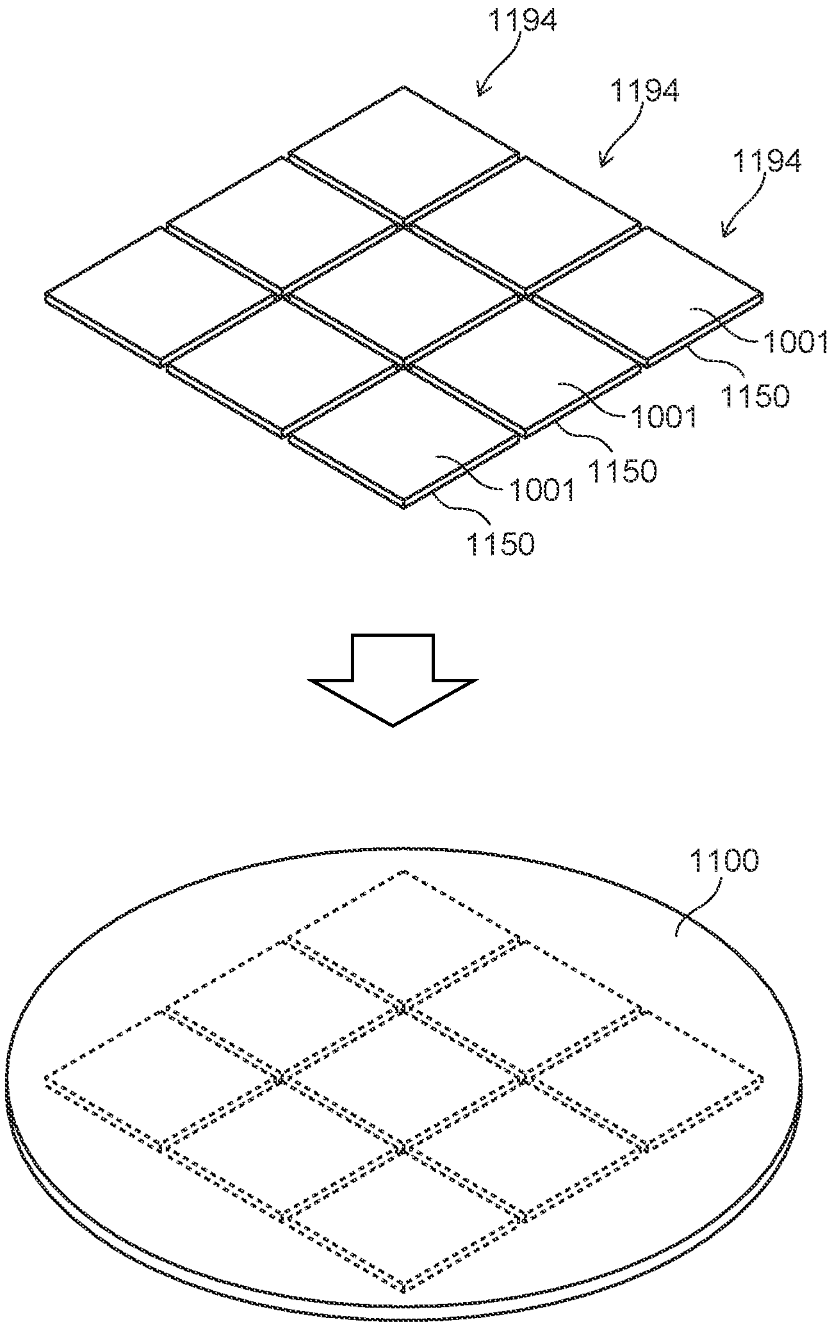
FIG. 10 is a schematic perspective view illustrating the method for manufacturing the image display device of the first embodiment.

FIG. 10 is a perspective view illustrating the method for manufacturing the image display device of the embodiment.

As shown in FIG. 10, multiple semiconductor growth substrates 1194 may be prepared, and semiconductor layers 1150 that are formed on the multiple crystal growth substrates 1001 may be bonded to one circuit board 1100.

For example, the multiple circuits 101 are arranged in a lattice configuration in the circuit board 1100. The circuits 101 include all of subpixels 20, etc., necessary for one image display device 1. A spacing that is about the scribe line width is located between the circuits 101 that are located next to each other. A circuit element or the like is not located at the end portion and the end portion vicinity of the circuit 101.

The semiconductor layer 1150 is formed so that the end portion of the semiconductor layer 1150 is aligned with the end portion of the crystal growth substrate 1001. Therefore, by disposing and bonding so that the end portion of the semiconductor growth substrate 1194 is aligned with the end portion of the circuit 101, the end portion of the semiconductor layer 1150 and the end portion of the circuit 101 can be aligned after bonding.

When growing the semiconductor layer 1150 on the crystal growth substrate 1001, the crystal quality easily degrades at the end portion and the end portion vicinity of the semiconductor layer 1150. Therefore, by aligning the end portion of the semiconductor layer 1150 and the end portion of the circuit 101, the region at which the crystal quality easily degrades that is at the end portion vicinity of the semiconductor layer 1150 on the semiconductor growth substrate 1194 is not used in the display region of the image display device 1.

Or, conversely, multiple circuit boards 1100 may be prepared, and the multiple circuit boards 1100 may be bonded to the semiconductor layer 1150 that is formed on the crystal growth substrate 1001 of one semiconductor growth substrate 1194.

Figure 11:
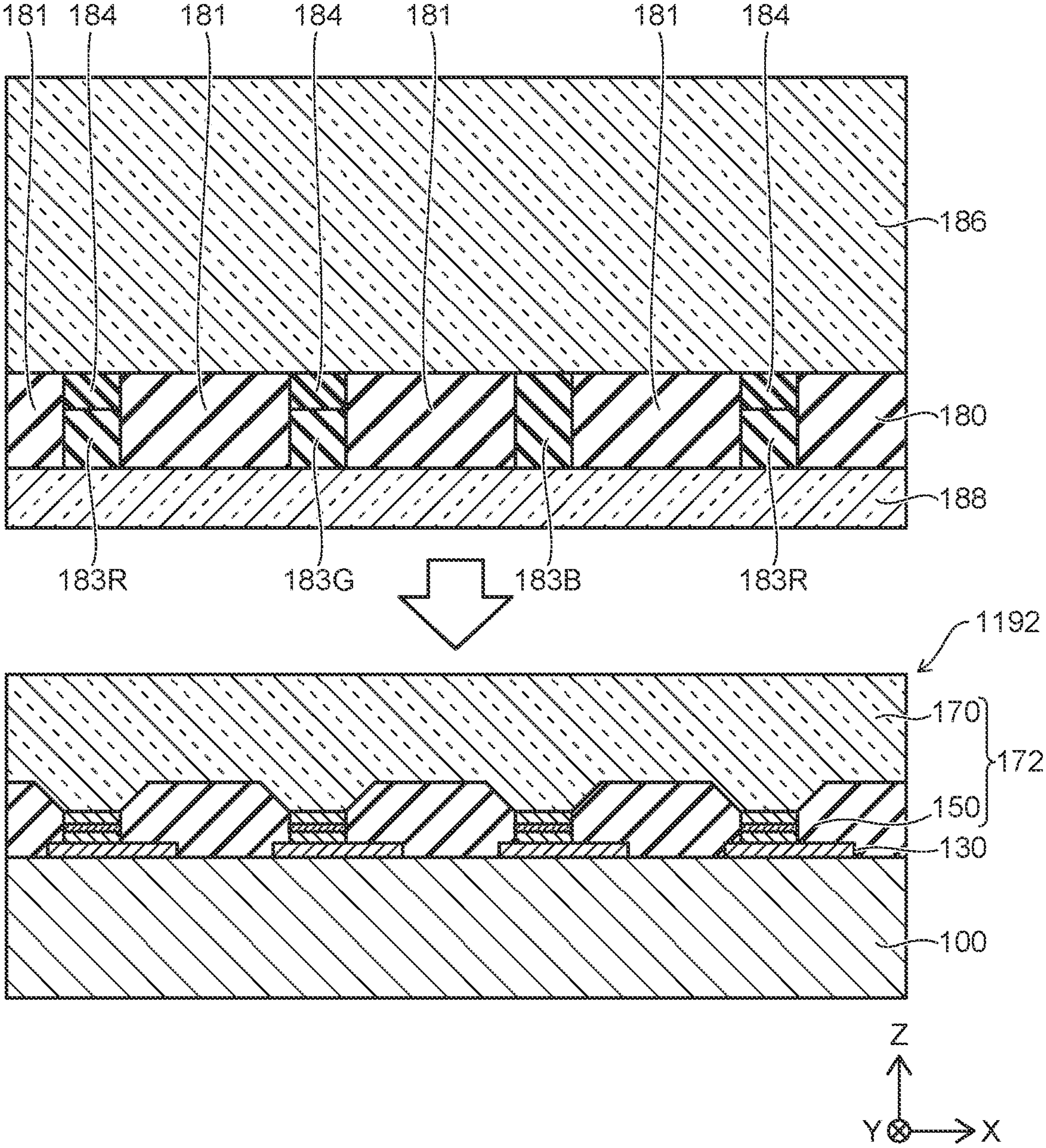
FIG. 11 is a schematic cross-sectional view illustrating the method for manufacturing the image display device of the first embodiment.

FIG. 11 is a schematic cross-sectional view illustrating the method for manufacturing the image display device of the embodiment.

In FIG. 11, the wiring portions that are in the circuit board 100, in the inter-layer insulating films 112 and 156, etc., are not illustrated to avoid complexity. Also, a portion of the color conversion members such as the color filter 180, etc., is displayed in FIG. 11. Here, the structural component that includes the wiring layer 130, the light-emitting element 150, the vias 161*k* and 161*d*, the wiring layer 160, the inter-layer insulating film 156, and the surface resin layer 170 is called a light-emitting circuit part 172. Also, the structural component in which the light-emitting circuit part 172 is located on the circuit board 100 is called a structure body 1192.

As shown in FIG. 11, the color filter 180 is bonded to the structure body 1192 at one surface of the color filter 180. The other surface of the color filter 180 is bonded to a glass substrate 186. The transparent thin film adhesive layer 188 is located at the one surface of the color filter 180, and the bonding to the surface of the structure body 1192 at the light-emitting circuit part 172 side is performed via the transparent thin film adhesive layer 188.

In the color filter 180 of the example, the color conversion parts are arranged in the positive direction of the X-axis in the order of red, green, and blue. Respectively for red and green, a red color conversion layer 183R and a green color conversion layer 183G are located in the first layer. The filter layers 184 are located in the second layer. For blue, a single-layer color conversion layer 183B is provided. The light-shielding part 181 is located between the color conversion parts.

The color filter 180 is adhered to the structure body 1192 so that the positions of the color conversion layers 183R, 183G, and 183B of each color match the positions of the light-emitting elements 150.

FIGS. 12A to 12D are schematic cross-sectional views showing a modification of the method for manufacturing the image display device of the embodiment.

A method in which the color filter is formed by inkjet is shown in FIGS. 12A to 12D.

Figure 12A:
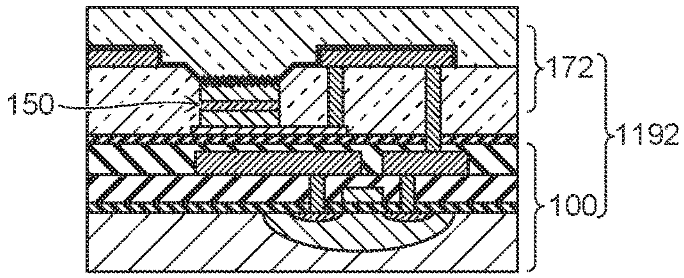
FIG. 12A is a schematic cross-sectional view illustrating a method for manufacturing a modification of the image display device of the first embodiment.

As shown in FIG. 12A, the structure body 1192 in which the light-emitting circuit part 172 is adhered to the circuit board 100 is prepared.

Figure 12B:
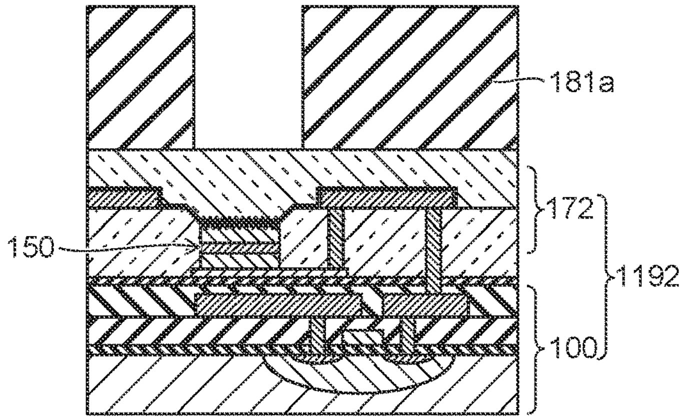
FIG. 12B is a schematic cross-sectional view illustrating the manufacturing method of the modification of the image display device of the first embodiment.

As shown in FIG. 12B, a light-shielding part 181*a* is formed on the structure body 1192. For example, the light-shielding part 181*a* is formed using screen printing, photolithography technology, etc.

Figure 12C:
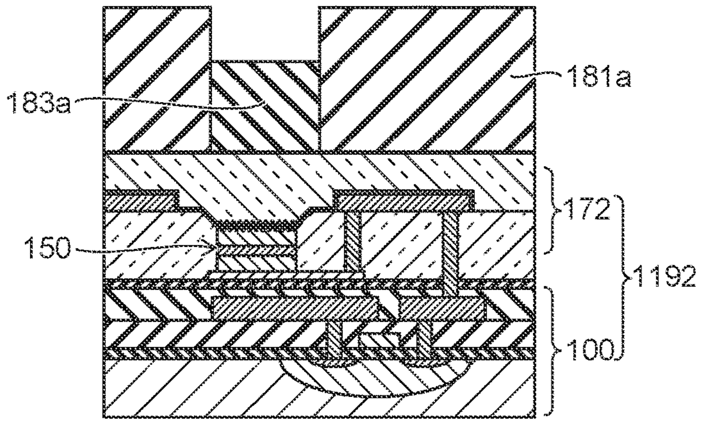
FIG. 12C is a schematic cross-sectional view illustrating the manufacturing method of the modification of the image display device of the first embodiment.

As shown in FIG. 12C, a fluorescer 183*a* that corresponds to the light emission color is dispensed from an inkjet nozzle. The fluorescer 183*a* colors the region in which the light-shielding part 181*a* is not formed. The fluorescer 183*a* includes, for example, a fluorescent coating that uses a general fluorescer material or a quantum dot fluorescer material. It is favorable to use a quantum dot fluorescer material because the light emission colors can be realized, the monochromaticity can be high, and the color reproducibility can be high. After the printing by the inkjet nozzle, drying processing is performed using an appropriate temperature and time. The thickness of the coating when coloring is set to be less than the thickness of the light-shielding part 181*a*.

As described above, the fluorescer may not be dispensed in the subpixel of the blue light emission because the color conversion part may not be formed. Also, when a blue color conversion layer is formed in the subpixel of the blue light emission, the color conversion part may be one layer; therefore, it is favorable for the thickness of the coated film of the blue fluorescer to be about equal to the thickness of the light-shielding part 181*a*.

Figure 12D:
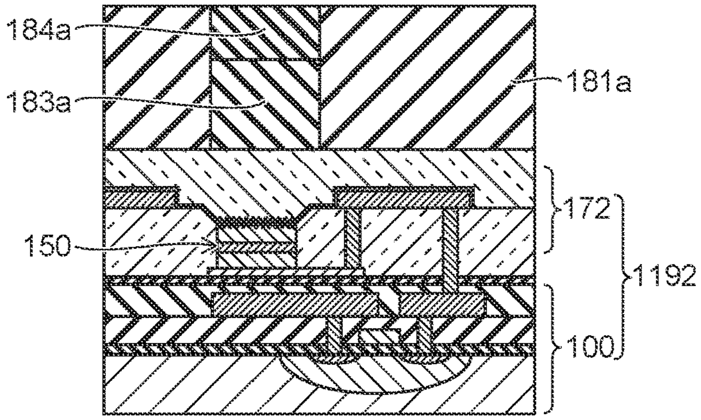
FIG. 12D is a schematic cross-sectional view illustrating the manufacturing method of the modification of the image display device of the first embodiment.

As shown in FIG. 12D, a coating 184*a* for the filter layer is dispensed from the inkjet nozzle. The coating 184*a* is coated to overlap the coated film of the fluorescer 183*a*. The total thickness of the coated film of the fluorescer 183*a* and the coating 184*a* is set to be about equal to the thickness of the light-shielding part 181*a*.

Thus, the image display device 1 can be manufactured.

Effects of the image display device 1 of the embodiment will now be described.

According to the method for manufacturing the image display device 1 of the embodiment, the semiconductor layer 1150 that includes the light-emitting layer 1152 for the light-emitting element 150 is bonded to the circuit board 1100 (100) that includes the circuit elements such as the transistor 103 that drives the light-emitting element 150, etc. Subsequently, the light-emitting element 150 is formed by etching the semiconductor layer 1150. Therefore, compared to individually transferring singulated light-emitting elements onto the circuit board 1100 (100), the process of transferring the light-emitting elements can be markedly shortened.

For example, in an image display device having 4K image quality, the number of subpixels is greater than 24 million, and in the case of an image display device having 8K image quality, the number of subpixels is greater than 99 million. When individually mounting such a large amount of light-emitting elements to a circuit board, an enormous amount of time is necessary, and it is difficult to realize an image display device that uses micro LEDs at a realistic cost. Also, when individually mounting a large amount of light-emitting elements, the yield decreases due to connection defects when mounting, etc., and an even higher cost is unavoidable.

Conversely, according to the method for manufacturing the image display device 1 of the embodiment, the entire semiconductor layer 1150 is adhered to the circuit board 1100 (100) before singulating the semiconductor layer 1150; therefore, the transfer process is completed when performed 1 time.

After directly forming the light-emitting element on the circuit board by etching, etc., the light-emitting element and the circuit element in the circuit board 1100 (100) are electrically connected by forming vias; therefore, a uniform connection structure can be realized, and the decrease of the yield can be suppressed.

Also, alignment is unnecessary because the adhering to the circuit board 1100 (100) is performed at the wafer level without pre-singulating the semiconductor layer 1150 or forming electrodes at positions corresponding to the circuit elements. Therefore, the adhesion process can be easily performed in a short period of time. Alignment is unnecessary when adhering, which is favorable for a higher definition display; also, reducing the size of the light-emitting element 150 is easy.

When performing wafer bonding of the semiconductor layer 1150 to the circuit board 1100 according to the embodiment, the metal layers 1130 and 1120 are pre-formed on at least one of the bonding surfaces of the semiconductor layer 1150 and the circuit board 1100. Therefore, the wafer bonding can be easily performed by appropriately selecting the materials of the metal layers.

The metal layer that is formed in the wafer bonding can be utilized as the second wiring layer 130 as the connection between the light-emitting element 150 and the outside, etc. Because the second wiring layer 130 has an ohmic connection with the n-type semiconductor layer 151, the via 161*k* and the n-type semiconductor layer 151 can be electrically connected to have a low resistance value.

Because the second wiring layer 130 can include the light-shielding plate 130*a*, malfunction of the circuit elements such as the transistor 103, etc., due to unnecessary light scattering of the light-emitting element 150 can be prevented.

Second Embodiment

Figure 13:
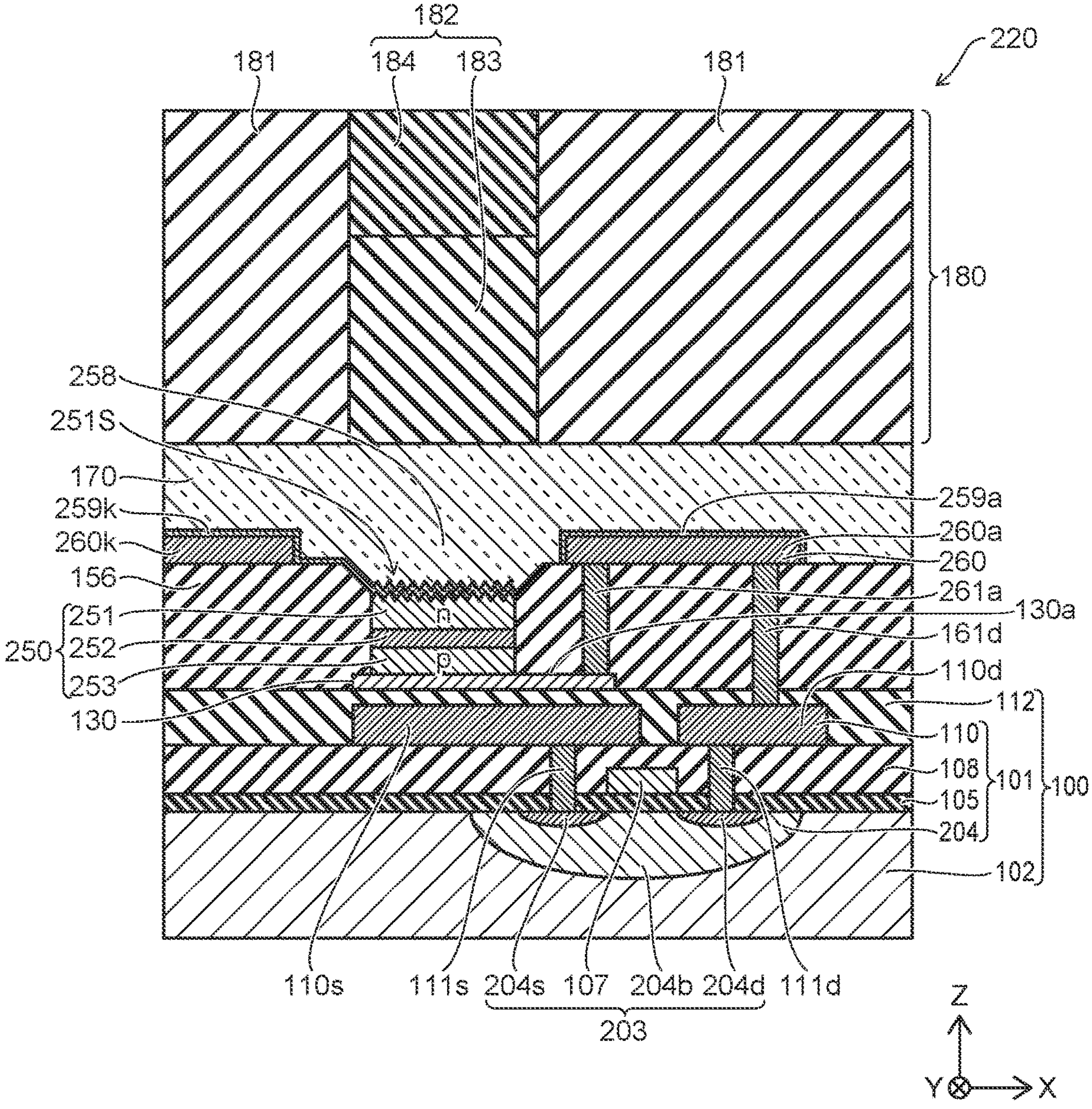
FIG. 13 is a schematic cross-sectional view illustrating a portion of an image display device according to a second embodiment.

FIG. 13 is a schematic cross-sectional view illustrating a portion of an image display device according to the embodiment.

FIG. 13 schematically shows a cross section of a subpixel 220 when cut by a plane parallel to the XZ plane. The cross-sectional view is a cross-sectional view corresponding to an auxiliary cross section along line A-A' of FIG. 4 described above.

The configuration of a light-emitting element 250 and the configuration of a transistor 203 that drives the light-emitting element 250 according to the embodiment are different from those of the other embodiments described above. The same components as those of the other embodiments described above are marked with the same reference numerals, and a detailed description is omitted as appropriate.

As shown in FIG. 13, the subpixel 220 of the image display device of the embodiment includes the transistor 203 and the light-emitting element 250. The transistor 203 is formed in an element formation region 204 that is formed in the substrate 102. The element formation region 204 includes an n-type semiconductor region 204*b* and p-type semiconductor regions 204*s* and 204*d*. The n-type semiconductor region 204*b* is located at the surface vicinity of the substrate 102. The p-type semiconductor regions 204*s* and 204*d* are located in the n-type semiconductor region 204*b* and are separated from each other at the surface vicinity of the n-type semiconductor region 204*b*.

The gate 107 is located on the n-type semiconductor region 204*b* with the insulating layer 105 interposed. The gate 107 is located between the p-type semiconductor regions 204*s* and 204*d*.

The structure of the upper portion of the transistor 203 and the structure of the wiring portions are the same as those of the other embodiments described above. According to the embodiment, the transistor 203 is a p-channel transistor, e.g., a p-channel MOSFET.

Similarly to the other embodiments described above, the second wiring layer 130 is formed on the first inter-layer insulating film 112, and the light-shielding plate 130*a* that is a portion of the wiring layer 130 is provided.

The light-emitting element 250 includes a p-type semiconductor layer 253, a light-emitting layer 252, and an n-type semiconductor layer 251. The p-type semiconductor layer 253, the light-emitting layer 252, and the n-type semiconductor layer 251 are stacked in this order from the first inter-layer insulating film 112 of the circuit board 100 toward a light-emitting surface 251S. Although the light-emitting element 250 has, for example, a substantially square or rectangular shape when projected onto the XY plane, the corners may be rounded. The light-emitting element 250 may have, for example, an elliptical shape or a circular shape when projected onto the XY plane. The degree of freedom of the layout is increased by appropriately selecting the shape, arrangement, and the like of the light-emitting element when viewed in plan.

The light-emitting element 250 may include the same materials as those of the other embodiments described above. For example, the light-emitting element 250 emits blue light of about 467 nm±20 nm, or bluish-violet light of a wavelength of 410 nm±20 nm.

The p-type semiconductor layer 253 of the light-emitting element 250 is located on the light-shielding plate 130*a*. It is favorable for the light-shielding plate 130*a* and the p-type semiconductor layer 253 to have an ohmic connection.

The second inter-layer insulating film (the second insulating film) 156 covers the first inter-layer insulating film 112, the second wiring layer 130, and the light-emitting element 250. The second inter-layer insulating film 156 includes an opening 258. The opening 258 is formed on the light-emitting element 250, and the inter-layer insulating film 156 is not located on the light-emitting surface 251S of the light-emitting element 250. It is favorable for the inter-layer insulating film 156 to include a white resin so that the inter-layer insulating film 156 reflects the light emitted by the light-emitting element 250 and effectively outputs the light from the opening 258.

The light-emitting surface 251S is a surface of the n-type semiconductor layer 251 that is opposite to the surface contacting the light-emitting layer 252. The light-emitting surface 251S is roughened.

A via 261*a* is provided to extend through the inter-layer insulating film 156. One end of the via 261*a* is connected to the light-shielding plate 130*a*.

The via 161*d* is provided to extend through the inter-layer insulating films 112 and 156. One end of the via 161*d* is connected to the wiring portion 110*d*.

A wiring layer 260 is located on the inter-layer insulating film 156. The wiring layer 260 includes wiring portions 260*k* and 260*a*. The wiring portion 260*a* is connected to the other ends of the vias 261*a* and 161*d*. Accordingly, the p-type semiconductor layer 253 of the light-emitting element 250 is electrically connected to a main electrode of the transistor 203 by the vias 261*a* and 161*d*.

The wiring portion 260*k* is connected to a ground line that is not illustrated. A transparent electrode 259*k* is located on the wiring portion 260*k*. The transparent electrode 259*k* extends to the light-emitting surface 251S and is located over the entire surface of the light-emitting surface 251S. Accordingly, the n-type semiconductor layer 251 is connected to the ground line via the transparent electrode 259*k* and the wiring portion 260*k*.

A transparent electrode 259*a* also is located on a wiring portion 260*a*.

The surface resin layer 170 is located on the inter-layer insulating film 156 and the transparent electrodes 259*k* and 259*a*.

Figure 14:
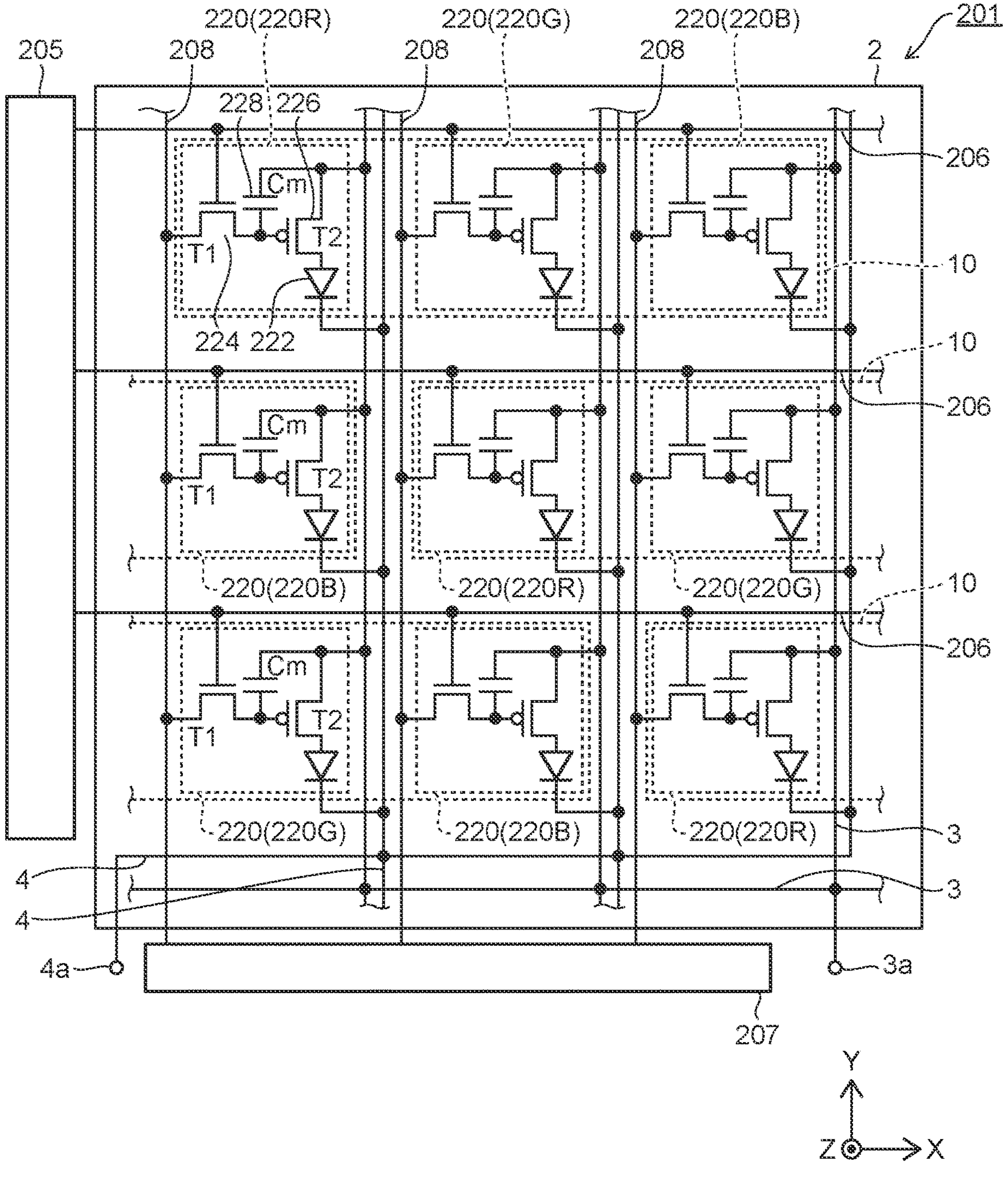
FIG. 14 is a schematic block diagram illustrating the image display device of the second embodiment.

FIG. 14 is a schematic block diagram illustrating the image display device according to the embodiment.

As shown in FIG. 14, the image display device 201 of the embodiment includes a display region 2, a row selection circuit 205, and a signal voltage output circuit 207. Similarly to the other embodiments described above, for example, the subpixels 220 are arranged in a lattice configuration in the display region 2.

The subpixel 220 includes a light-emitting element 222, a select transistor 224, a drive transistor 226, and a capacitor 228. In FIG. 14, the select transistor 224 may be displayed as T1, the drive transistor 226 may be displayed as T2, and the capacitor 228 may be displayed as Cm.

According to the embodiment, the light-emitting element 222 is located at the ground line 4 side, and the drive transistor 226 that is connected in series to the light-emitting element 222 is located at the power supply line 3 side. That is, the drive transistor 226 is connected to a higher potential side than the light-emitting element 222. The drive transistor 226 is a p-channel MOSFET.

The select transistor 224 is connected between a signal line 208 and a gate electrode of the drive transistor 226. The capacitor 228 is connected between the power supply line 3 and a gate electrode of the drive transistor 226.

The polarities of the signal voltages supplied by the row selection circuit 205 and the signal voltage output circuit 207 to a scanning line 206 and the signal line 208 to drive the drive transistor 226 that is a p-channel MOSFET are different from those of the other embodiments described above.

According to the embodiment, the polarity of the drive transistor 226 is a p-channel; therefore, the polarities of the signal voltages, etc., are different from those of the other embodiments described above. In other words, the row selection circuit 205 supplies a select signal to the scanning line 206 to sequentially select one row from the arrangement of the m rows of the subpixels 220. The signal voltage output circuit 207 supplies signal voltages that have analog voltage values necessary for the subpixels 220 of the selected row. The drive transistors 226 of the subpixels 220 of the selected row cause currents that correspond to the signal voltages to flow in the light-emitting elements 222. The light-emitting elements 222 emit light of luminances corresponding to the currents that flow.

A method for manufacturing the image display device 201 of the embodiment will now be described.

FIGS. 15A to 16C are schematic cross-sectional views illustrating the method for manufacturing the image display device of the embodiment.

According to the embodiment, a semiconductor growth substrate 1294 that is different from the semiconductor growth substrate 1194 already described with reference to FIG. 5A is prepared. The semiconductor growth substrate 1294 includes the semiconductor layer 1150 that is grown on the crystal growth substrate 1001. Although the semiconductor layer 1150 is grown on the crystal growth substrate 1001 with the buffer layer 1140 interposed in the example, similarly to the other embodiments described above, the growth is possible without having the buffer layer 1140 interposed.

According to the embodiment, the n-type semiconductor layer 1151, the light-emitting layer 1152, and the p-type semiconductor layer 1153 are stacked in the semiconductor growth substrate 1294 in this order from the crystal growth substrate 1001 side. Here, in the initial state of the crystal growth, crystal defects that are caused by mismatch of the crystal lattice constants occur easily, and such a crystal is of the n-type. Therefore, as in the example, the stacking from the n-type semiconductor layer 1151 is advantageous in that the margin of the production processes is increased, and the yield is easily increased.

The metal layer 1130 is formed at the p-type semiconductor layer 1153 side. By forming the metal layer on the surface of the p-type semiconductor layer 1153, the p-type semiconductor layer 1153 can be protected by the metal layer 1130. Therefore, an advantage is provided in that the storage of the semiconductor growth substrate 1294 is easier. By forming a thin film layer that includes a hole-injection material at the interface between the p-type semiconductor layer 1153 and the metal layer 1130, it is also possible to further reduce the drive voltage of the light-emitting element 250 described above. For example, an ITO film or the like may be favorably used as such a hole-injection material.

Figure 15A:
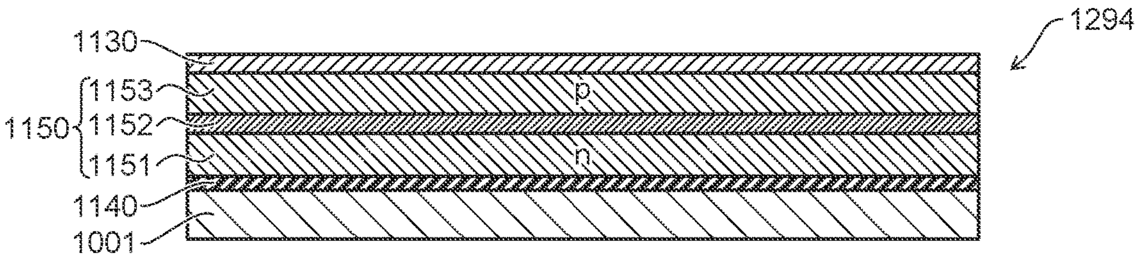
FIG. 15A is a schematic cross-sectional view illustrating a method for manufacturing the image display device of the second embodiment.
Figure 15B:
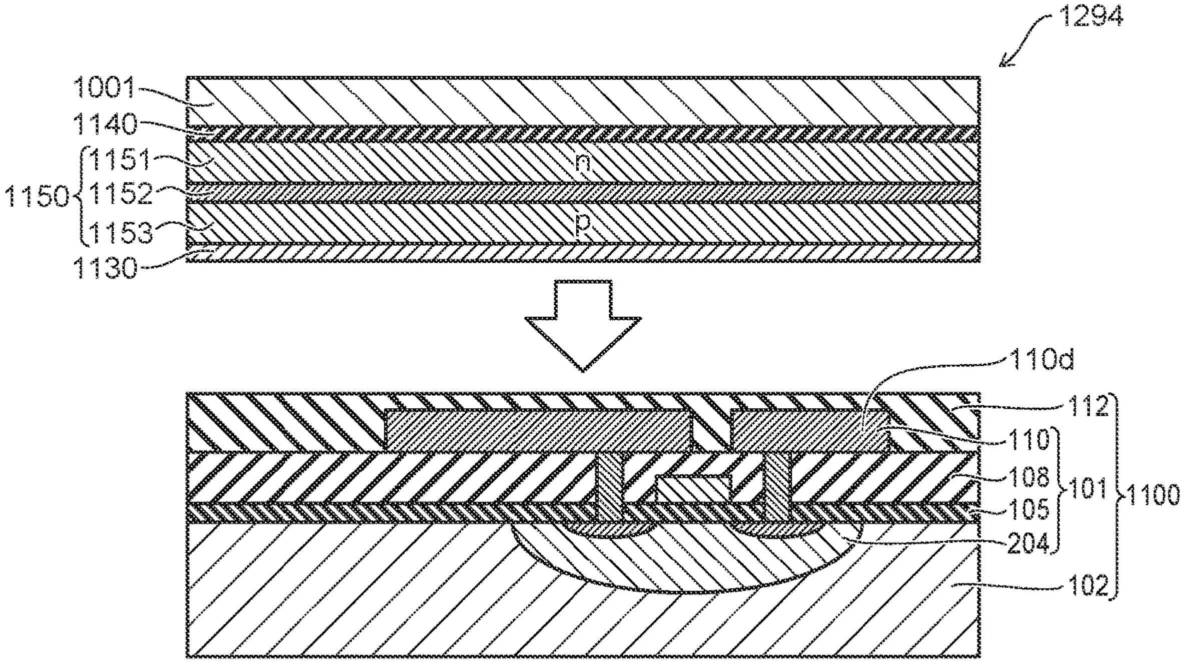
FIG. 15B is a schematic cross-sectional view illustrating the method for manufacturing the image display device of the second embodiment.

As shown in FIG. 15B, the semiconductor growth substrate 1294 is vertically inverted and adhered to the circuit board 1100. As shown by the arrow of the drawing, one surface of the circuit board 1100 and the surface of the metal layer 1130 that is formed on the semiconductor layer 1150 are aligned, and the two are adhered. The bonding surface of the circuit board 1100 is the exposed surface of the inter-layer insulating film 112 formed on the wiring layer 110.

The wafer bonding described above may be performed similarly to those of the modifications described in reference to FIGS. 6A to 6C. In other words, the semiconductor growth substrate may be adhered to the circuit board 1100 without inverting after transferring the semiconductor layer 1150 to a support substrate, metal layers may be located on at least one of the semiconductor layer 1150 or the circuit board 1100, and the semiconductor layer 1150 that undergoes crystal growth without having the buffer layer 1140 interposed may be adhered.

Figure 16A:
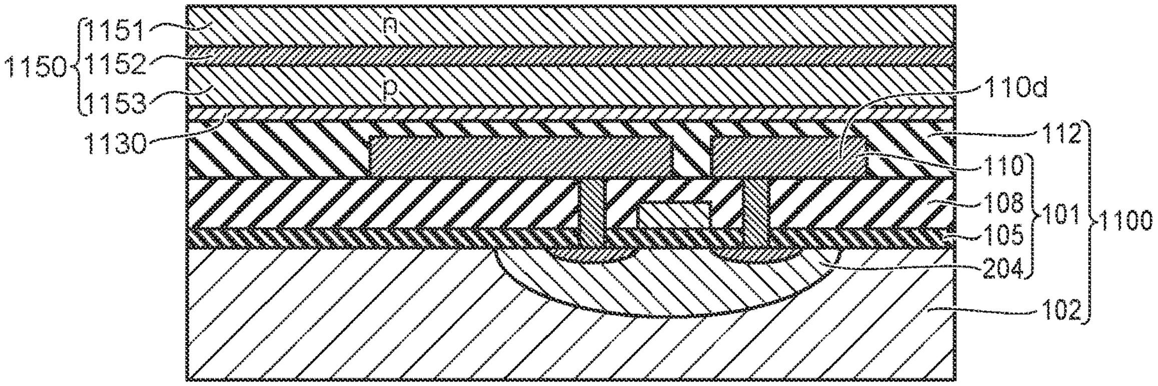
FIG. 16A is a schematic cross-sectional view illustrating the method for manufacturing the image display device of the second embodiment.
Figure 16B:
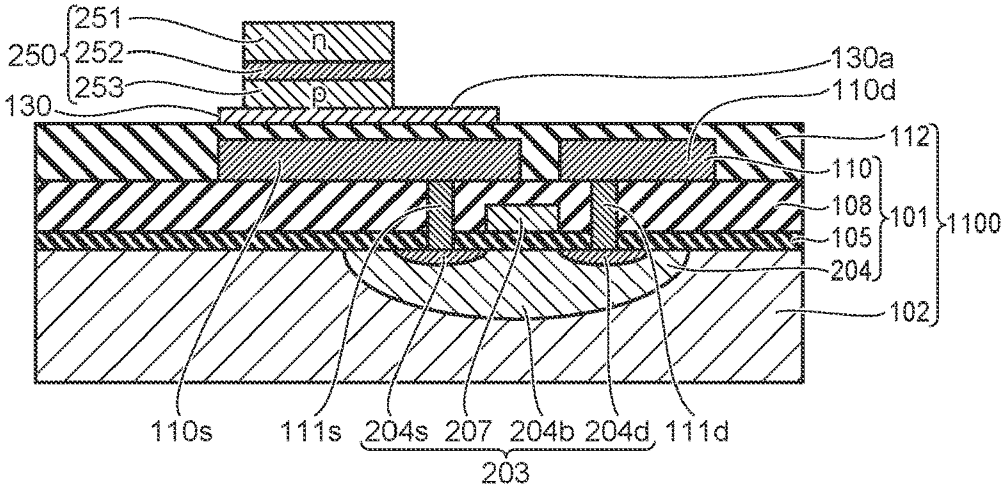
FIG. 16B is a schematic cross-sectional view illustrating the method for manufacturing the image display device of the second embodiment.
Figure 16C:
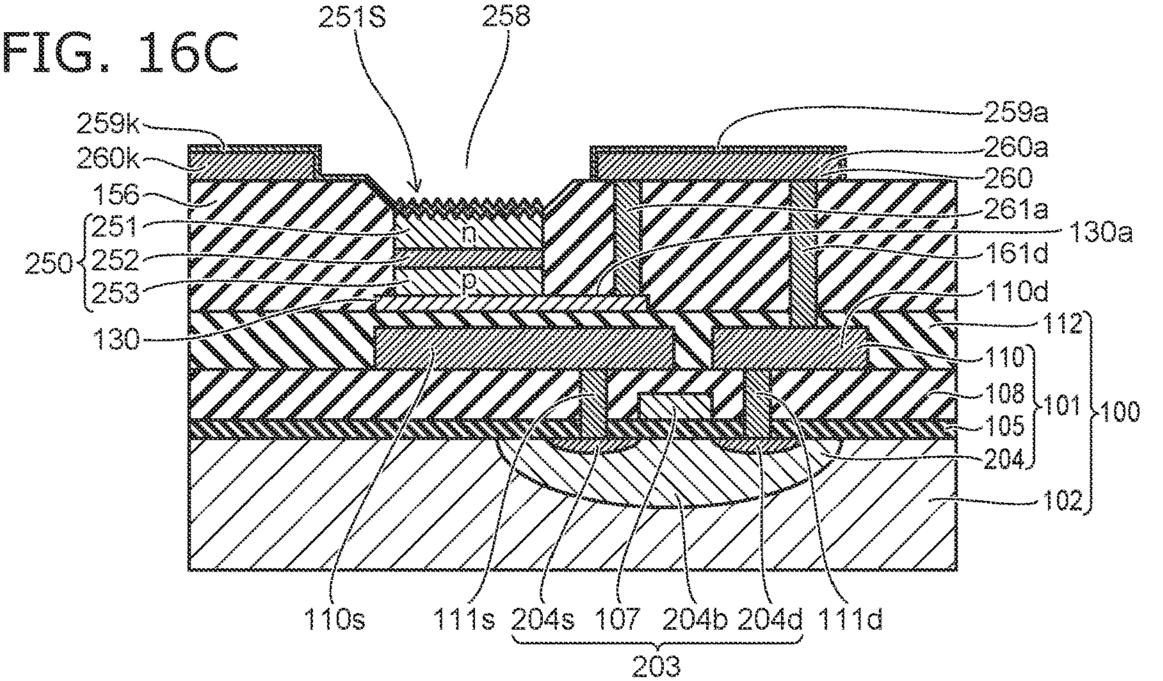
FIG. 16C is a schematic cross-sectional view illustrating the method for manufacturing the image display device of the second embodiment.

As shown in FIGS. 16A to 16C, the circuit board 1100 is bonded to the semiconductor layer 1150 via the metal layer 1130 by the wafer bonding. Subsequently, similarly to the other embodiments described above, the second wiring layer 130 and the light-shielding plate 130*a* are formed from the metal layer 1130, and the light-emitting element 250 is formed from the semiconductor layer 1150.

The inter-layer insulating film 156 that covers the light-emitting element 250 is formed, and via holes are formed in the inter-layer insulating film 156. Subsequently, a conductive metal material is filled into the via holes, a conductive layer is formed in the via holes, and the wiring layer 260 is formed by photolithography.

The opening 258 is formed in the inter-layer insulating film 156, and the light-emitting surface 251S is roughened. Subsequently, the third wiring layer 260 that includes the wiring portions 260*a* and 260*k* is formed, and the transparent electrodes 259*a* and 259*k* are formed of ITO films, etc., on the third wiring layer 260.

Effects of the image display device 201 of the embodiment will now be described.

According to the embodiment, effects similar to those of the other embodiments described above are obtained. In other words, the individual light-emitting elements 250 are formed by etching after bonding the semiconductor layer 1150 to the circuit board 1100; therefore, the transfer process of the light-emitting elements can be markedly shortened.

In addition to the effects of the other embodiments described above, according to the embodiment, the roughening can be performed more easily by using the n-type semiconductor layer 251 as the light-emitting surface 251S, and a subpixel that has a high luminous efficiency can be formed by connecting the wiring portion 260*k* to the light-emitting surface 251S.

Third Embodiment

According to the other embodiments described above, the second wiring layer 130 may be connected to multiple different potentials, and the light-shielding plate 130*a* that is included in the second wiring layer 130 connects the semiconductor of the lower layer of each subpixel to main electrodes of the driving transistors 103 and 203 by vias. Therefore, the light-shielding plate 130*a* may be set to different potentials for each subpixel. According to the embodiment, a second wiring layer 330 also is used as a light-shielding plate, and shields all of the light-emitting elements. Also, according to the embodiment, the second wiring layer 330 is connected to a single potential. In the example, the wiring layer 330 is connected to the power supply line.

Figure 17:
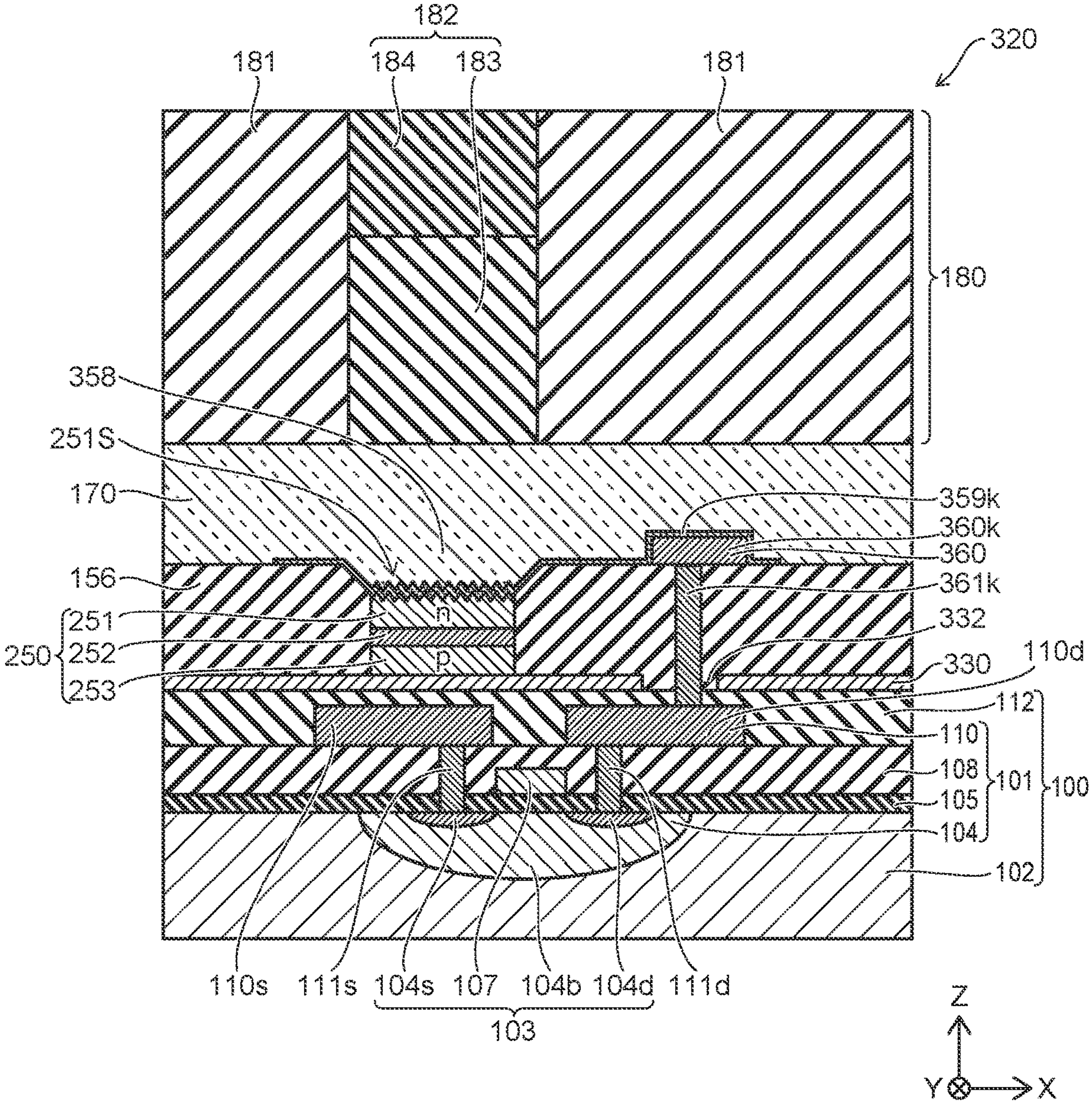
FIG. 17 is a schematic cross-sectional view illustrating a portion of an image display device according to a third embodiment.

FIG. 17 is a schematic cross-sectional view illustrating a portion of the image display device according to the embodiment.

FIG. 17 schematically shows a cross section when a subpixel 320 is cut by a plane parallel to the XZ plane. The cross-sectional view is an auxiliary cross section along line B-B' of FIG. 18 described below.

According to the embodiment, the configuration of the light-emitting element 250 is the same as that of the second embodiment. In other words, the light-emitting element 250 includes the p-type semiconductor layer 253 of the lower layer, and the n-type semiconductor layer 251 that includes the light-emitting surface 251S. The transistor 103 for driving the light-emitting element 250 is an n-channel transistor similar to that of the first embodiment. The same components as those of the other embodiments described above are marked with the same reference numerals, and a detailed description is omitted as appropriate.

As shown in FIG. 17, the subpixel 320 of the image display device of the embodiment includes the transistor 103 and the light-emitting element 250. The transistor 103 is formed in the element formation region 104 that is formed in the substrate 102. The element formation region 104 includes the p-type semiconductor region 104*b* and the n-type semiconductor regions 104*s* and 104*d*, and the transistor 103 is an n-channel transistor.

The structure of the upper portion of the transistor 103 and the structure of the wiring portions of the circuit board 100 are the same as those of the first embodiment described above.

The second wiring layer 330 is formed on the first inter-layer insulating film 112. The wiring layer 330 is provided to substantially cover the circuit elements that include the transistor 103 located under each subpixel 320. The wiring layer 330 includes a through-hole 332 for each subpixel 320.

The second inter-layer insulating film 156 is formed on the light-emitting element 250, the wiring layer 330, and the first inter-layer insulating film 112 that is exposed in the through-hole 332. A via 361*k* is provided to extend through the inter-layer insulating films 156 and 112, and the through-hole 332 is provided for the via 361*k* to pass through. The diameter of the through-hole 332 is set to be greater than the diameter of the via 361*k* when projected onto the XY plane; therefore, the via 361*k* is insulated from the wiring layer 330.

One end of the via 361*k* is connected to the wiring portion 110*d*. The other end of the via 361*k* is connected to a wiring portion 360*k* of a third wiring layer 360. The transparent electrode 359*k* is formed on the wiring portion 360*k* and on the light-emitting surface 251S. The transparent electrode 359*k* is located between the wiring portion 360*k* and the light-emitting surface 251S and electrically connects the wiring portion 360*k* and the n-type semiconductor layer 251.

The n-type semiconductor layer 251 of the light-emitting element 250 is connected to the drain electrode of the transistor 103 via the transparent electrode 359*k*, the wiring portion 360*k*, the via 361*k*, and the wiring portion 110*d*.

The p-type semiconductor layer 253 of the light-emitting element 250 is located on the second wiring layer 330. The p-type semiconductor layer 253 has an ohmic connection with the wiring layer 330. The wiring layer 330 is connected to the power supply line. Accordingly, the p-type semiconductor layer 253 of the light-emitting element 250 is connected to the power supply line via the second wiring layer 330.

Figure 18:
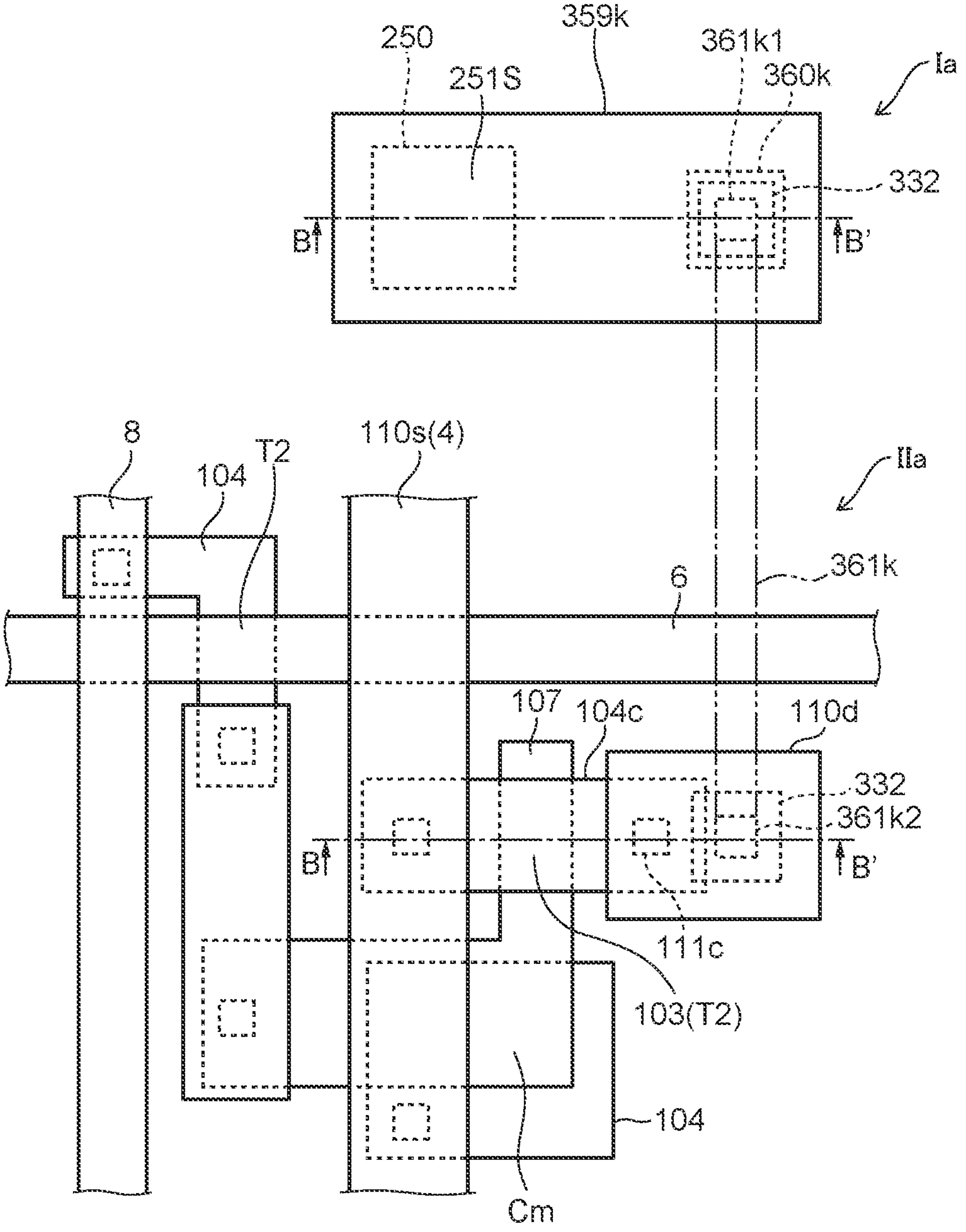
FIG. 18 is a schematic plan view illustrating a portion of the image display device of the third embodiment.

FIG. 18 is a schematic plan view illustrating a portion of the image display device of the embodiment.

According to the embodiment, the light-emitting element is driven using an n-channel transistor. The circuit configuration of FIG. 3 is applied to the drive circuit.

As described in reference to FIG. 17, the light-emitting element 250 and the driving transistor 103 are stacked in the Z-axis direction, and the drain electrode of the transistor 103 and the n-type semiconductor layer 251 that is the cathode electrode of the light-emitting element 250 are electrically connected by the via 361*k*. The second wiring layer 330 is located between the light-emitting element 250 and the transistor 103.

A plan view of a Iath layer is schematically displayed in the upper portion of FIG. 18, and a plan view of a IIath layer is schematically displayed in the lower portion of FIG. 18. In FIG. 18, the Iath layer is labeled "Ia", and the IIth layer is labeled "IIa". The Iath layer is the layer in which the light-emitting element 250 is formed. The IIath layer is the layer in which the transistor 103 is formed. In FIG. 18, the second wiring layer 330 is not shown, and the through-hole 332 that is located in the wiring layer 330 is shown by broken lines in the Iath layer and the IIath layer for reference.

The Iath layer includes the p-type semiconductor layer 253 up to the transparent electrode 359*k* in FIG. 17. The second inter-layer insulating film 156 is not shown in FIG. 18. The IIath layer includes the layers from the element formation region 104 to the first wiring layer 110 in FIG. 16. The substrate 102, the insulating layer 105, the insulating film 108, and the first inter-layer insulating film 112 are not shown in FIG. 18. In this drawing, the channel region 104*c* is shown as the element formation region 104 of the driving transistor 103. The select transistor T1 and/or the capacitor Cm are formed in other element formation regions 104.

As shown in the upper drawing of FIG. 18, the transparent electrode 359*k* is located over the entire surface of the light-emitting surface 251S of the light-emitting element 250, and is located on the wiring portion 360*k*. The wiring portion 360*k* and the light-emitting surface 251S, i.e., the n-type semiconductor layer 251, are electrically connected because the transparent electrode 359*k* is located between the light-emitting surface 251S and the wiring portion 360*k*. The wiring portion 360*k* is connected to the via 361*k* via a contact hole 361*k*1.

The via 361*k* is schematically shown by a double dot-dash line in the drawing.

As shown in the lower drawing of FIG. 18, the via 361*k* passes through the through-hole 332, reaches a contact hole 361*k*2, and is electrically connected to the wiring portion 110*d*. The wiring portion 110*d* is connected to a drain electrode of the transistor 103 via a contact hole 111*c* at the channel region 104*c* side.

As shown in both the Iath layer and the IIath layer, the through-hole 332 that is formed in the second wiring layer 330 is made to be larger than the cross section of the via 361*k*. Although not shown in the drawing, the second inter-layer insulating film 156 is located between the wiring layer 330 and the via 361*k*, and the wiring layer 330 and the via 361*k* are insulated from each other.

Thus, the n-type semiconductor layer 251 of the light-emitting element 250 and the drain electrode of the transistor 103 are electrically connected by the via 361*k*.

The second wiring layer 330 is located over the entire surface of the first inter-layer insulating film 112 other than the through-hole 332. Also, the through-hole 332 is located to avoid the region above the circuit elements such as the transistor 103, etc. Thereby, the wiring layer 330 can reflect the downward scattered light of the light-emitting element 250 upward, and can shield the scattering toward the circuit elements.

A method for manufacturing the image display device of the embodiment will now be described.

Figure 19A:
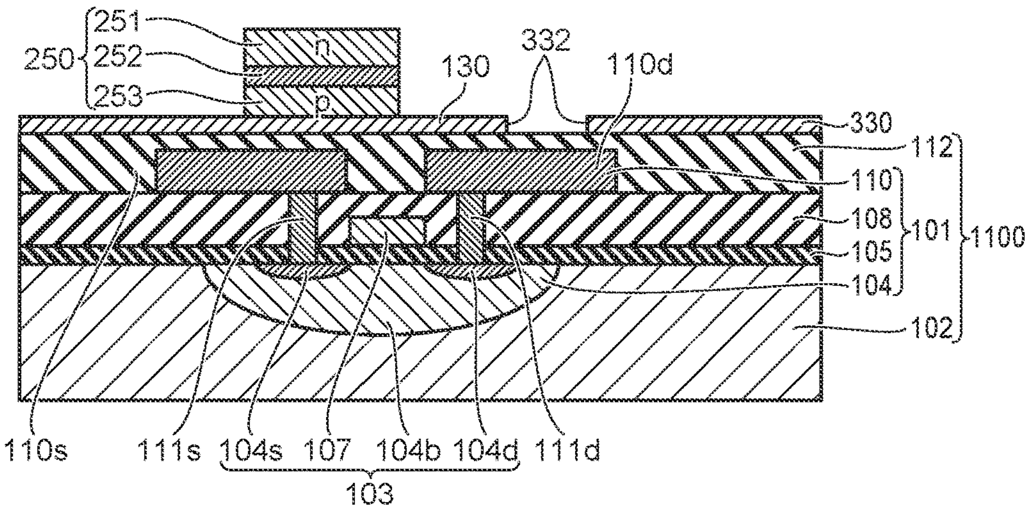
FIG. 19A is a schematic cross-sectional view illustrating a method for manufacturing the image display device of the third embodiment.
Figure 19B:
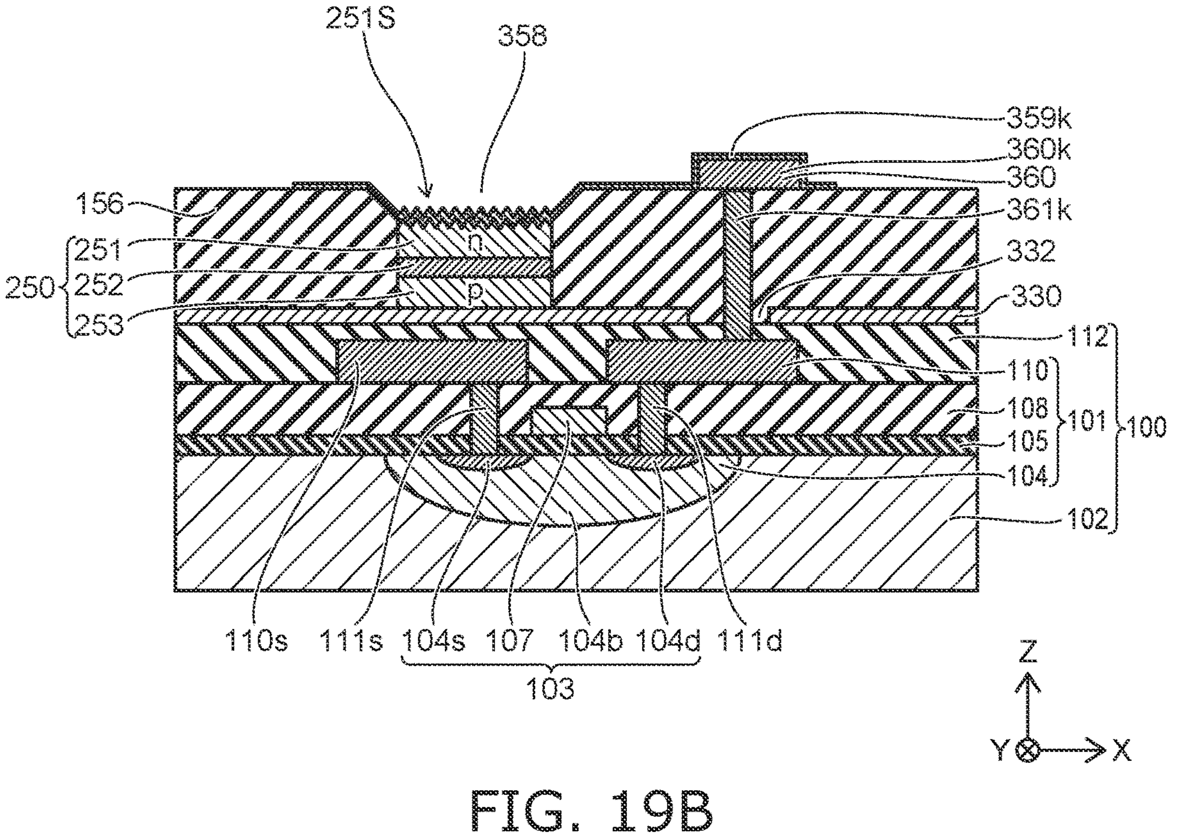
FIG. 19B is a schematic cross-sectional view illustrating the method for manufacturing the image display device of the third embodiment.

FIGS. 19A and 19B are schematic cross-sectional views illustrating the method for manufacturing the image display device of the embodiment.

According to the embodiment, the process of bonding the semiconductor layer 1150 and the circuit board 1100 is the same as that of the second embodiment described above. The processes after the processing up to FIG. 16A is performed will now be described.

The second wiring layer 330 is formed as shown in FIG. 19A. Etching is used to form the second wiring layer 330. When forming the second wiring layer 330, the second wiring layer 330 is formed to cover the circuit elements at the circuit board 1100 side, and the through-hole 332 is formed at a location corresponding to the wiring portion 110*d*. Subsequently, the light-emitting element 250 is formed by etching further.

As shown in FIG. 19B, the second inter-layer insulating film 156 is formed on the light-emitting element 250, the second wiring layer 330, and the first inter-layer insulating film 112. Subsequently, a via hole is formed in the second inter-layer insulating film 156, and the via 361*k* is formed by filling a conductive member.

An opening 358 is formed in the second inter-layer insulating film 156, and the light-emitting surface 251S is exposed. The third wiring layer 360 is formed on the inter-layer insulating film 156. The n-type semiconductor layer 251 and the wiring portion 360*k* at the cathode electrode side of the wiring layer 360 are electrically connected by forming the transparent electrode 359*k* between the wiring portion 360*k* and the light-emitting surface 251S.

By using the manufacturing processes of the semiconductor layer 1150 described in the first embodiment described above, a subpixel that includes the light-emitting element 150 and the p-channel transistor 203 also can be used. In other words, by using the manufacturing processes shown in FIGS. 5A to 6C of the first embodiment, the n-type semiconductor layer 151 can be used as the lower layer, the p-type semiconductor layer 153 can be used as the light-emitting surface 153S, and the p-type semiconductor layer 153 can be connected to the drain electrode of the transistor 203 by a via. In such a case, the circuit configuration is that of FIG. 13, and the second wiring layer is connected to a ground line.

Effects of the image display device of the embodiment will now be described.

In the image display device of the embodiment, other than the effects of the other embodiments described above, the second wiring layer 330 can have a simple pattern of only the through-hole 332; therefore, the pattern design can be easier, and the development period and the like of the image display device can be shortened.

Although all of the second wiring layers 330 described above are connected to the same potential, wiring portions that are connected to different potentials may be included.

Fourth Embodiment

According to the other embodiments described above, the second wiring layers 130 and 330 are connected to a single potential for at least one subpixel. In one subpixel according to the embodiment, the second wiring layer can include multiple wiring portions that can be connected to different potentials.

Although an example is described in the embodiment in which the light-emitting element 250 includes the p-type semiconductor layer 253 of the lower layer, and in which the n-type semiconductor layer 251 includes the light-emitting surface 251S, even the light-emitting element 150 that includes the n-type semiconductor layer 151 of the lower layer and the p-type semiconductor layer 153 including the light-emitting surface 153S is easily realized by using the processes of the other embodiments described above, etc.

According to the embodiment, the light-emitting element 250 is driven by the p-channel transistor 203. The circuit configuration of FIG. 14 is applied to the drive circuit. When the light-emitting element 150 is driven by the n-channel transistor 103, the circuit of FIG. 3 is applied.

Figure 20:
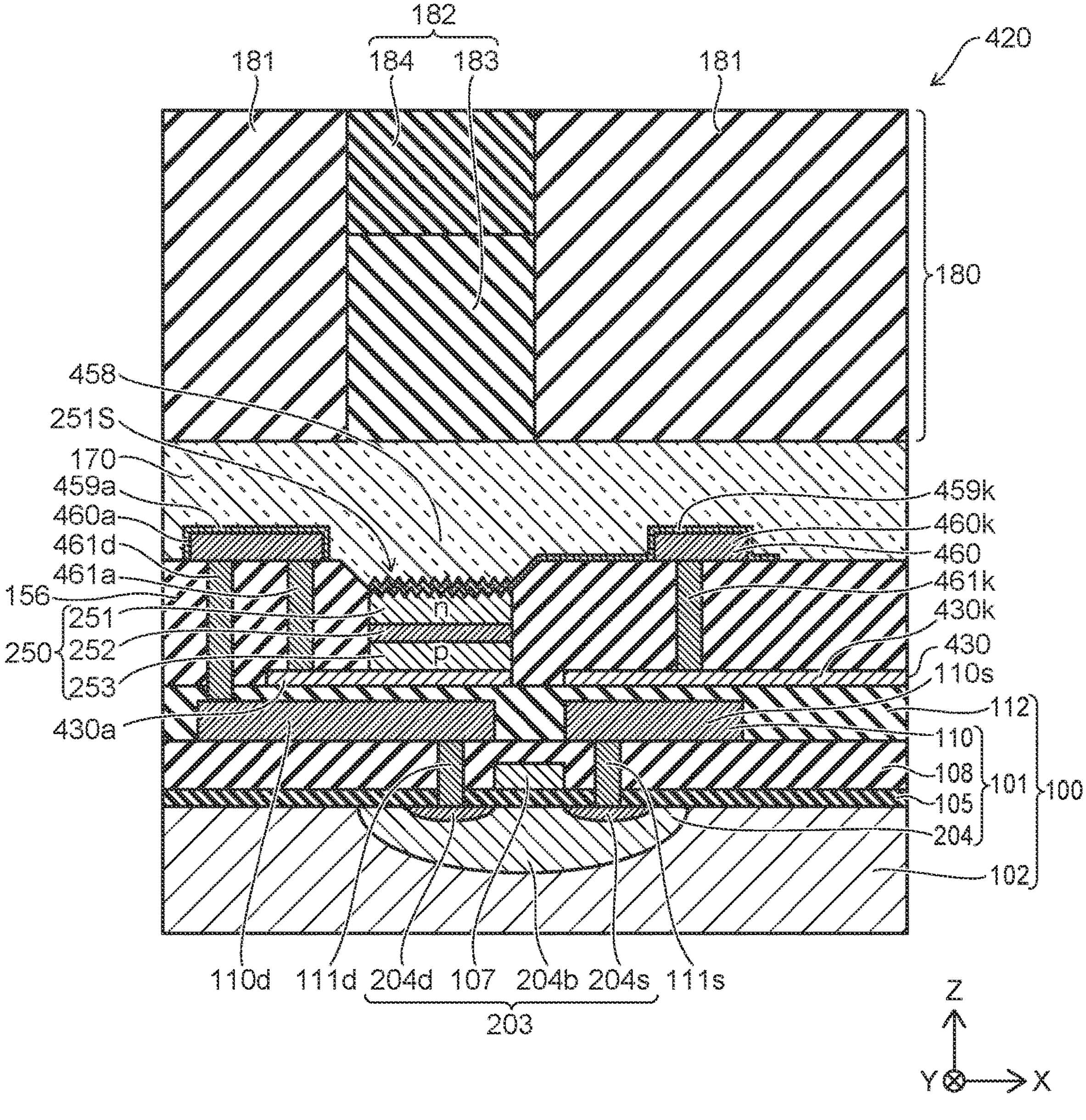
FIG. 20 is a schematic cross-sectional view illustrating a portion of an image display device according to a fourth embodiment.

FIG. 20 is a schematic cross-sectional view illustrating a portion of an image display device according to the embodiment.

As shown in FIG. 20, a subpixel 420 of the image display device of the embodiment includes the light-emitting element 250 and the p-channel transistor 203. The light-emitting element 250 is located on a wiring portion 430*a* of a second wiring layer 430. The wiring portion 430*a* also is used as a light-shielding plate. A via 461*a* is provided to extend through the second inter-layer insulating film 156. One end of the via 461*a* is connected to the wiring portion 430*a*. The other end of the via 461*a* is connected to a wiring portion 460*a* of a third wiring layer 460 that is formed on the inter-layer insulating film 156. A transparent electrode 459*a* is formed on the wiring portion 460*a*.

A via 461*d* is provided to extend through the inter-layer insulating films 156 and 112. One end of the via 461*d* is connected to the wiring portion 460*a*. The other end of the via 461*d* is connected to the wiring portion 110*d*.

That is, the p-type semiconductor layer 253 that is an anode electrode of the light-emitting element 250 is connected to a drain electrode of the p-channel transistor 203 via the wiring portion 430*a*, the via 461*a*, the wiring portion 460*a*, the via 461*d*, and the wiring portion 110*d*.

The n-type semiconductor layer 251 of the light-emitting element 250 includes the light-emitting surface 251S that is roughened. A transparent electrode 459*k* is located over the entire surface of the light-emitting surface 251S, and is located also on a wiring portion 460*k*. The transparent electrode 459*k* is located between the light-emitting surface 251S and the wiring portion 460*k* and electrically connects the light-emitting surface 251S and the wiring portion 460*k*.

A via 461*k* is provided to extend through the second inter-layer insulating film 156. One end of the via 461*k* is connected to the wiring portion 460*k* of the third wiring layer 460. The other end of the via 461*k* is connected to a wiring portion 430*k* of the second wiring layer 430. The wiring portion 430*k* is connected to the ground line 4 (FIG. 13).

That is, the n-type semiconductor layer 251 that is a cathode electrode of the light-emitting element 250 is connected to the ground line via the transparent electrode 459*k*, the wiring portion 460*k*, the via 461*k*, and the wiring portion 430*k*.

A method for manufacturing the image display device of the embodiment will now be described.

Figure 21A:
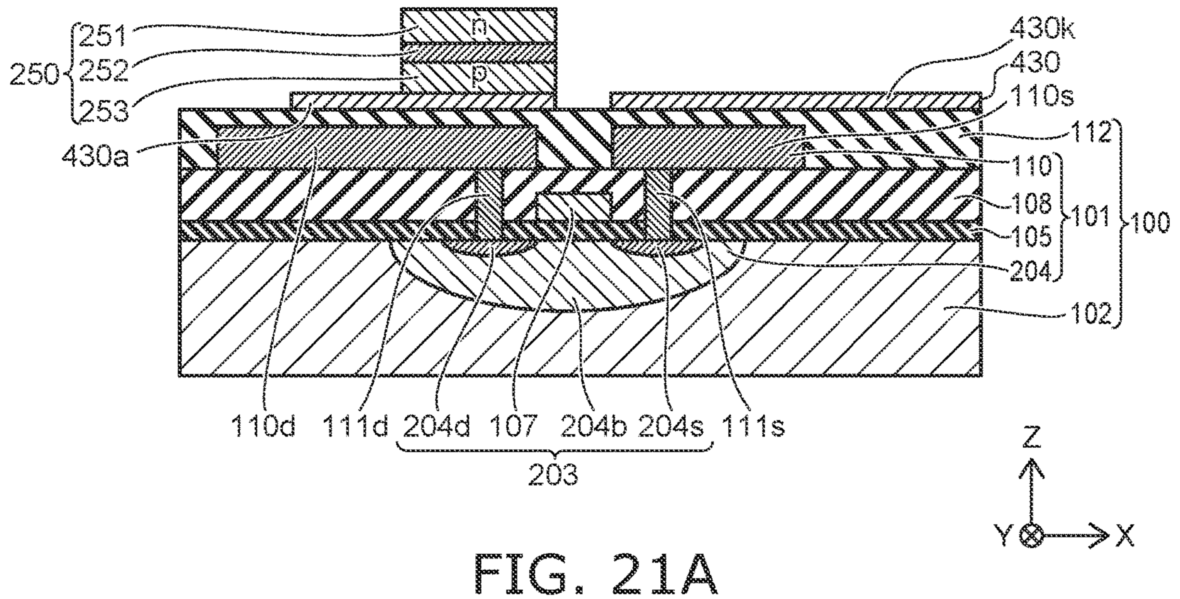
FIG. 21A is a schematic cross-sectional view illustrating a method for manufacturing the image display device of the fourth embodiment.
Figure 21B:
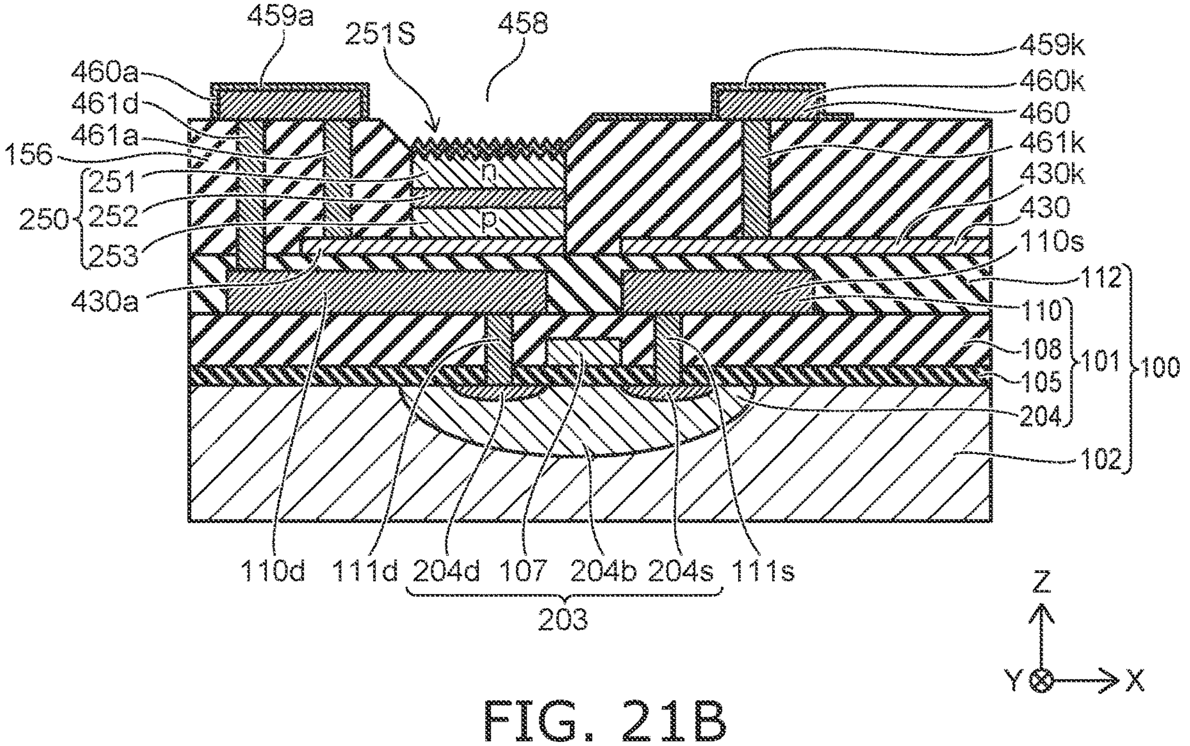
FIG. 21B is a schematic cross-sectional view illustrating the method for manufacturing the image display device of the fourth embodiment.

FIGS. 21A and 21B are schematic cross-sectional views illustrating the method for manufacturing the image display device of the embodiment.

According to the embodiment, the process of bonding the semiconductor layer 1150 and the circuit board 1100 is the same as that of the second embodiment described above. The processes after performing the processing up to FIG. 16A will now be described.

The light-emitting element 250 and the second wiring layer 430 are formed as shown in FIG. 21A. The second wiring layer 430 is formed by etching after forming the light-emitting element 250. The second wiring layer 430 includes the wiring portions 430*a* and 430*k* that are insulated from each other.

As shown in FIG. 21B, the vias 461*a* and 461*k* are formed to extend through the inter-layer insulating film 156, and the via 461*d* is formed to extend through the inter-layer insulating films 156 and 112. The third wiring layer 460 is formed on the inter-layer insulating film 156.

An opening 458 is formed in the second inter-layer insulating film 156 at a position corresponding to the light-emitting surface 251S. The transparent electrodes 459*a* and 459*k* are formed on the wiring portions 460*a* and 460*k* after roughening the light-emitting surface 251S. The transparent electrode 459*k* is located over the entire surface of the light-emitting surface 251S, is located between the light-emitting surface 251S and the wiring portion 460*k*, and electrically connects the n-type semiconductor layer 251 and the wiring portion 460*k*.

Effects of the image display device of the embodiment will now be described.

In the image display device of the embodiment, in addition to the effects of the other embodiments described above, the second wiring layer includes the wiring portions 460*a* and 460*k* that are connectable to different potentials; therefore, it is unnecessary to route the ground line, the power supply line, etc., in the same plane as the light-emitting surface 251S, and the wiring portion pattern can have a high degree of freedom of the internal layers.

Fifth Embodiment

According to the embodiment, an image display device that has a higher luminous efficiency is realized by forming multiple light-emitting surfaces that correspond to multiple light-emitting elements in a single semiconductor layer that includes a light-emitting layer. In the description hereinbelow, the same components as those of the other embodiments described above are marked with the same reference numerals, and a detailed description is omitted as appropriate.

Figure 22:
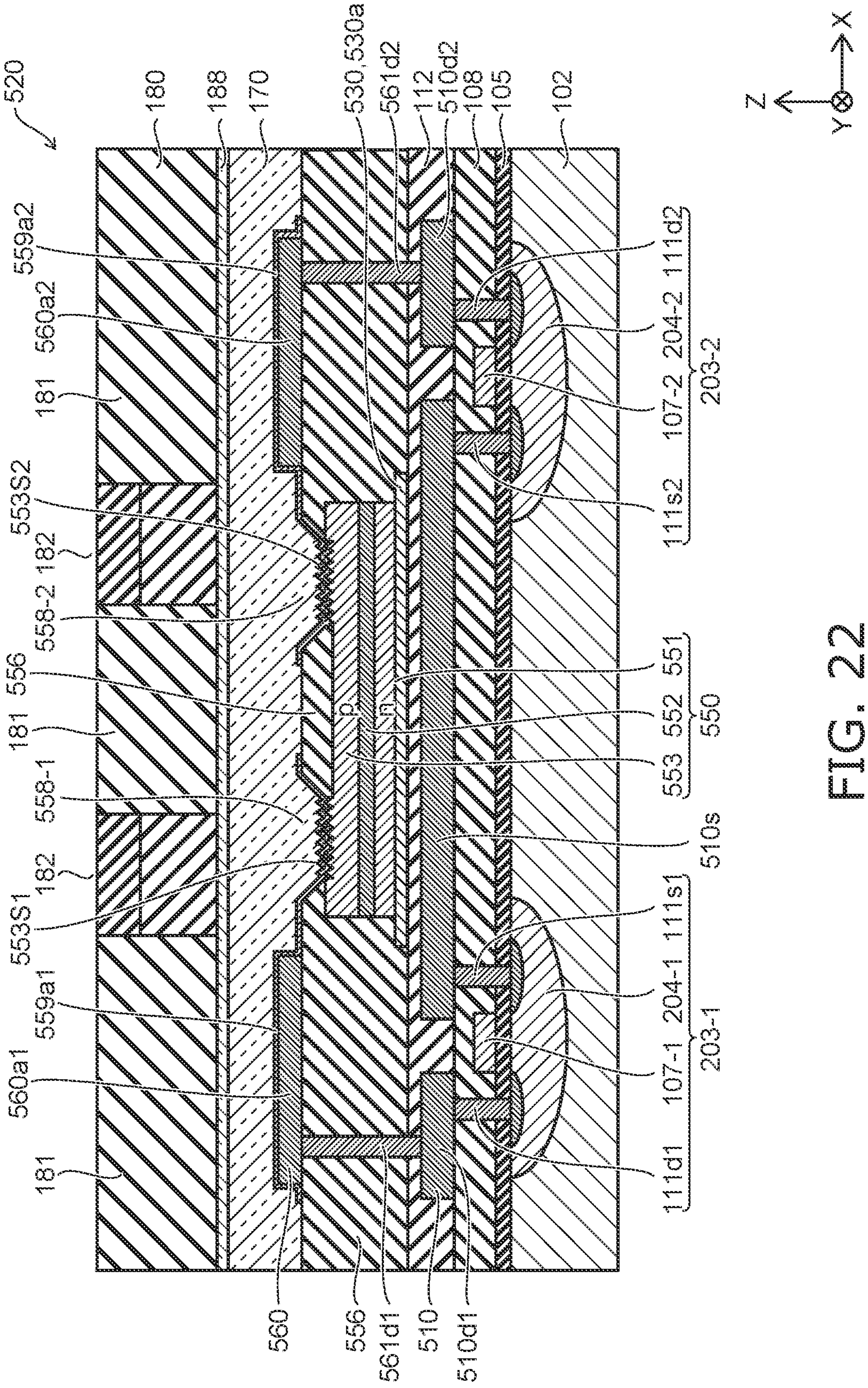
FIG. 22 is a schematic cross-sectional view illustrating a portion of an image display device according to a fifth embodiment.

FIG. 22 is a schematic cross-sectional view illustrating a portion of the image display device according to the embodiment.

As shown in FIG. 22, the image display device includes a subpixel group 520. The subpixel group 520 includes transistors 203-1 and 203-2, a first wiring layer 510, the first inter-layer insulating film 112, a semiconductor layer 550, a second inter-layer insulating film 556, a second wiring layer 530, and vias 561*d*1 and 561*d*2.

According to the embodiment, the p-channel transistors 203-1 and 203-2 cause the light-emitting layer to emit light by injecting holes into the semiconductor layer 550. For example, the circuit configuration shown in FIG. 14 is applied to the drive circuit. Using the other embodiments described above, the n-type semiconductor layer and the p-type semiconductor layer of the semiconductor layers may be vertically interchanged. The semiconductor layers are driven by n-channel transistors. In such a case, the circuit configuration shown in FIG. 3 is applied to the drive circuit.

The semiconductor layer 550 includes two light-emitting surfaces 553S1 and 553S2, and the subpixel group 520 substantially includes two subpixels. According to the embodiment, similarly to the other embodiments described above, a display region is formed by arranging the subpixel group 520 that substantially includes two subpixels in a lattice configuration.

The transistors 203-1 and 203-2 are formed respectively in element formation regions 204-1 and 204-2. In the example, the element formation regions 204-1 and 204-2 are n-type semiconductor layers, and p-type semiconductor layers are formed to be separated from each other in the n-type semiconductor layer. The n-type semiconductor layer includes a channel region, and the p-type semiconductor layers respectively include a source region and a drain region.

The insulating layer 105 is formed on the element formation regions 204-1 and 204-2, and gates 107-1 and 107-2 each are formed with the insulating layer 105 interposed. The gates 107-1 and 107-2 are gates of the transistors 203-1 and 203-2. The transistors 203-1 and 203-2 are p-channel MOSFETs.

The insulating film 108 covers the tops of the two transistors 203-1 and 203-2. The wiring layer (the first wiring layer) 510 is formed on the insulating film 108.

Vias 111*s*1 and 111*d*1 are located respectively between the wiring layer 510 and the p-type semiconductor layers of the transistor 203-1. Vias 111*s*2 and 111*d*2 are located between the wiring layer 510 and the p-type semiconductor layers of the transistor 203-2.

The first wiring layer 510 includes wiring portions 510*s*, 510*d*1, and 510*d*2. The wiring portion 510*s* is electrically connected to the p-type semiconductor layers that correspond to the source electrodes of the transistors 203-1 and 203-2 by the vias 111*s*1 and 111*s*2. The wiring portion 510*s* is connected to a power supply line that is not illustrated.

The wiring portion 510*d*1 is connected to the p-type semiconductor layer that corresponds to the drain electrode of the transistor 203-1 by the via 111*d*1. The wiring portion 510*d*2 is connected to the drain electrode of the transistor 203-2 by the via 111*d*2.

The first inter-layer insulating film (the first insulating film) 112 covers the transistors 203-1 and 203-2 and the wiring layer 510. The second wiring layer 530 is formed on the first inter-layer insulating film 112.

The second wiring layer (the second wiring layer) 530 is located between the semiconductor layer 550 and the first inter-layer insulating film 112. The second wiring layer 530 includes a light-shielding plate (a part) 530*a*, and the semiconductor layer 550 is located on the light-shielding plate 530*a*. In the example, the light-shielding plate 530*a* is connected to a ground line that is not illustrated. A single semiconductor layer 550 is located between the two driving transistors 203-1 and 203-2 that are arranged along the X-axis direction.

The semiconductor layer 550 includes an n-type semiconductor layer 551, a light-emitting layer 552, and a p-type semiconductor layer 553. The n-type semiconductor layer 551, the light-emitting layer 552, and the p-type semiconductor layer 553 are stacked in the semiconductor layer 550 in this order from the inter-layer insulating film 112 side toward the light-emitting surfaces 553S1 and 553S2. That is, the light-shielding plate 530*a* is electrically connected with the n-type semiconductor layer 551.

The light-shielding plate 530*a* is disposed so that the outer perimeter of the semiconductor layer 550 projected onto the light-shielding plate 530*a* when projected onto the XY plane is located within the outer perimeter of the light-shielding plate 530*a*. The light-shielding plate 530*a* reflects the scattered light from the semiconductor layer 550 and prevents malfunction of the circuit elements by shielding the light that would reach the circuit elements including the transistors 203-1 and 203-2, etc.

The second inter-layer insulating film (the second insulating film) 556 covers the tops of the first inter-layer insulating film 112 and the second wiring layer 530. The inter-layer insulating film 556 covers a portion of the semiconductor layer 550. It is favorable for the inter-layer insulating film 556 to cover the surface of the p-type semiconductor layer 553 other than the light-emitting surfaces (the exposed surfaces) 553S1 and 553S2 of the semiconductor layer 550. The inter-layer insulating film 556 covers the light-shielding plate 530*a* and the side surface of the semiconductor layer 550. It is favorable for the inter-layer insulating film 556 to be a white resin.

Transparent electrodes 559*a*1 and 559*a*2 cover the part of the semiconductor layer 550 that is not covered with the inter-layer insulating film 556. The transparent electrodes 559*a*1 and 559*a*2 are located respectively on the light-emitting surfaces 553S1 and 553S2 of the p-type semiconductor layer 553 that are exposed in openings 558-1 and 558-2 of the inter-layer insulating film 556. The transparent electrodes 559*a*1 and 559*a*2 are electrically connected to the p-type semiconductor layer 553.

The vias 561*d*1 and 561*d*2 are provided to extend through the inter-layer insulating films 556 and 112. One end of each of the vias 561*d*1 and 561*d*2 are connected respectively to the wiring portions 510*d*1 and 510*d*2.

A third wiring layer (a third wiring layer) 560 is located on the inter-layer insulating film 556. The wiring layer 560 includes wiring portions 560*a*1 and 560*a*2. The via 561*d*1 is located between the wiring portion 510*d*1 and the wiring portion 560*a*1. The via 561*d*2 is located between the wiring portion 510*d*2 and the wiring portion 560*a*2.

The transparent electrodes 559*a*1 and 559*a*2 are located respectively on the wiring portions 560*a*1 and 560*a*2. The transparent electrodes 559*a*1 and 559*a*2 are located respectively between the wiring portions 560*a*1 and 560*a*2 and the light-emitting surfaces 553S1 and 553S2 and electrically connect the wiring portions 560*a*1 and 560*a*2 and the transparent electrodes 559*a*1 and 559*a*2 respectively.

The openings 558-1 and 558-2 are formed at positions that correspond to the light-emitting surfaces 553S1 and 553S2. The light-emitting surfaces 553S1 and 55352 are formed at positions that are separated on the p-type semiconductor layer 553. The light-emitting surface 553S1 is located at the position on the p-type semiconductor layer 553 that is more proximate to the transistor 203-1. The light-emitting surface 553S2 is located at the position on the p-type semiconductor layer 553 that is more proximate to the transistor 203-2.

The openings 558-1 and 558-2 have, for example, square or rectangular shapes when projected onto the XY plane. The shapes are not limited to rectangular and may be circular, elliptical, or polygonal such as hexagonal, etc. The light-emitting surfaces 553S1 and 553S2 also may be square, rectangular, another polygon, circular, etc., when projected onto the XY plane. The shapes of the light-emitting surfaces 55351 and 55352 may be similar to the shapes of the openings 558-1 and 558-2 or may be different shapes.

As described above, the transparent electrodes 559*a*1 and 559*a*2 are connected respectively to the light-emitting surfaces 55351 and 553S2 that are exposed in the openings 558-1 and 558-2. Therefore, the holes that are supplied from the transparent electrodes 559*a*1 and 559*a*2 are injected into the p-type semiconductor layer 553 respectively from the exposed light-emitting surfaces 55351 and 55352. On the other hand, electrons are injected into the n-type semiconductor layer 551 via the light-shielding plate 530*a* that is connected to the ground line.

The transistors 203-1 and 203-2 are drive transistors of adjacent subpixels, and are sequentially driven. Accordingly, light emission is performed by holes being injected from one of the two transistors 203-1 and 203-2 into the light-emitting layer 552, and by electrons being injected from the light-shielding plate 530*a* into the light-emitting layer 552.

The opening 558-1 and the light-emitting surface 55351 are located at the position of the p-type semiconductor layer 553 that is more proximate to the transistor 203-1; therefore, when the transistor 203-1 is switched on, the holes are injected via the transparent electrode 559*a*1, the wiring portion 560*a*1, the via 561*d*1, and the wiring portion 510*d*1, and the light-emitting surface 553S1 that is exposed in the opening 558-1 emits light.

On the other hand, the opening 558-2 and the light-emitting surface 553S2 are located proximate to the transistor 203-2 of the p-type semiconductor layer 553; therefore, when the transistor 203-2 is switched on, the light-emitting surface 553S2 that is exposed in the opening 558-2 emits light via the transparent electrode 559*a*2, the wiring portion 560*a*2, the via 561*d*2, and the wiring portion 510*d*2.

A method for manufacturing the image display device of the embodiment will now be described.

FIGS. 23A to 24B are schematic cross-sectional views illustrating the method for manufacturing the image display device of the embodiment.

Figure 23A:
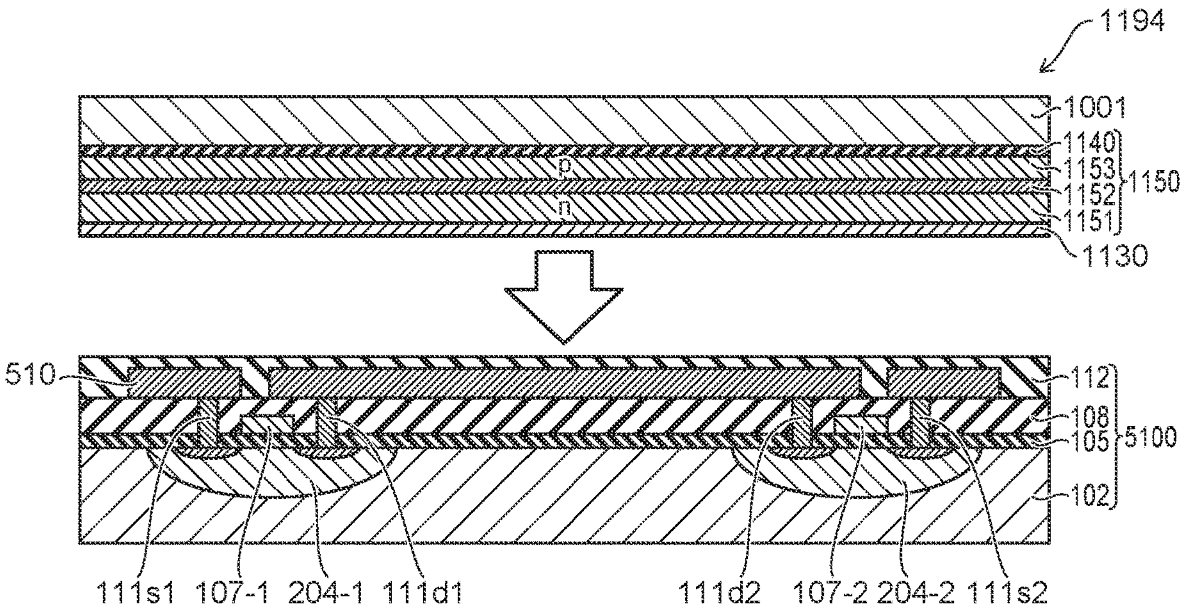
FIG. 23A is a schematic cross-sectional view illustrating a method for manufacturing the image display device of the fifth embodiment.

As shown in FIG. 23A, the semiconductor growth substrate 1194 that includes the crystal growth substrate 1001 on which the semiconductor layer 1150 is epitaxially grown is bonded to a circuit board 5100 by wafer bonding. The metal layer 1130 is formed at the surface of the semiconductor layer 1150 that is bonded with the circuit board 5100.

The semiconductor layer 1150, the metal layer 1130, etc., on the crystal growth substrate 1001 are similar to the structures already described in the other embodiments described above, and a detailed description is omitted. Also, for the circuit board 5100 as well, the configuration of the circuit is different from those of the other embodiments described above, but almost all of the other parts are similar to the structures that are already described. Hereinbelow, only the reference numerals are replaced, and a detailed description is omitted as appropriate.

Figure 23B:
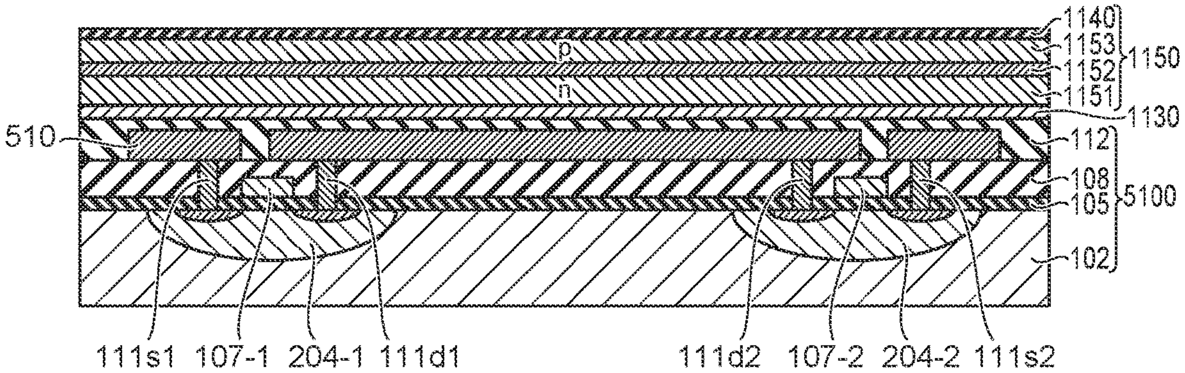
FIG. 23B is a schematic cross-sectional view illustrating the method for manufacturing the image display device of the fifth embodiment.

In the example as shown in FIG. 23B, for the semiconductor layer 1150, the surface of the metal layer 1130 that is formed at the side opposite to the surface of the crystal growth substrate 1001 is bonded to the flat surface of the inter-layer insulating film 112 of the circuit board 5100. The crystal growth substrate 1001 is removed by laser lift-off, etc.

Figure 24A:
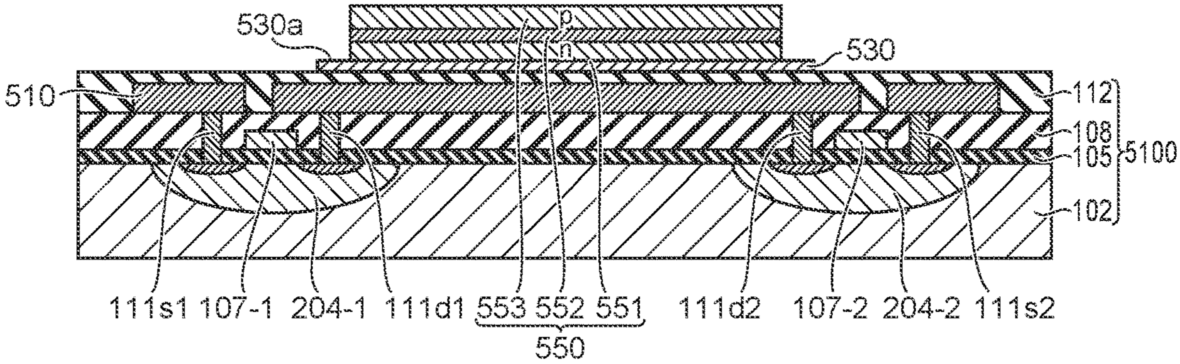
FIG. 24A is a schematic cross-sectional view illustrating the method for manufacturing the image display device of the fifth embodiment.

As shown in FIG. 24A, the second wiring layer 530 is formed by etching the metal layer 1130. The second wiring layer 530 includes the light-shielding plate 530*a*, and the wiring layer 530 that is formed into the shape of the light-shielding plate 530*a* is shown in FIG. 24A.

The semiconductor layer 1150 and the buffer layer 1140 are etched further. The semiconductor layer 550 is formed by etching the semiconductor layer 1150 to be located within the outer perimeter of the light-shielding plate 530*a*. Subsequently, the buffer layer 1140 is removed. The buffer layer

1140 may be removed before starting the etching of the metal layer 1130 and the semiconductor layer 1150.

Subsequently, an inter-layer insulating film that covers the first inter-layer insulating film 112, the second wiring layer 530, and the semiconductor layer 550 is formed, and vias are formed. Also, the third wiring layer 560 is formed, and the wiring portions **560*a*1, 560*a*2**, etc., are formed by etching.

Figure 24B:
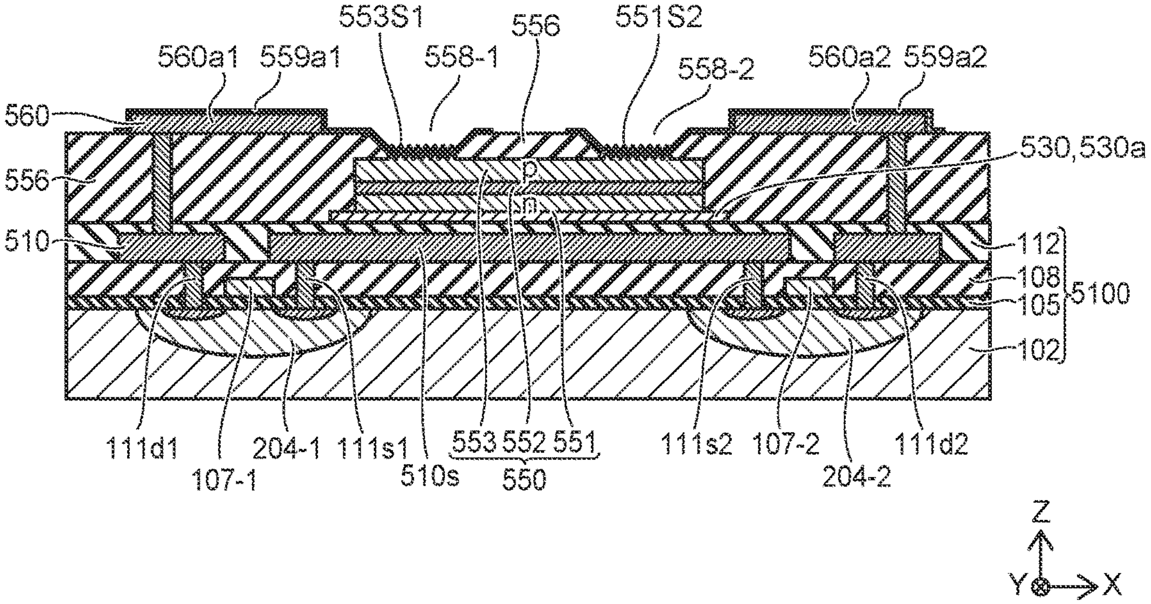
FIG. 24B is a schematic cross-sectional view illustrating the method for manufacturing the image display device of the fifth embodiment.

As shown in FIG. 24B, the openings 558-1 and 558-2 are formed by removing the inter-layer insulating film respectively at positions that correspond to the light-emitting surfaces 553S1 and 553S2.

The light-emitting surfaces 55351 and 553S2 of the p-type semiconductor layer 553 that are exposed by the openings 558-1 and 558-2 each are roughened. Subsequently, the transparent electrodes **559*a*1 and 559*a*2 are formed to electrically connect the light-emitting surfaces 553S1 and 553S2 and the wiring portions 560*a*1 and 560*a*2** respectively.

Thus, the subpixel group 520 that includes the semiconductor layer 550 that shares the two light-emitting surface 553S1 and 553S2 is formed.

Although two light-emitting surfaces 553S1 and 55352 are provided in one semiconductor layer 550 according to the example, the number of light-emitting surfaces is not limited to two; it is also possible to provide three or more light-emitting surfaces in one semiconductor layer 550. As an example, one column or two columns of subpixels may be realized using a single semiconductor layer 550. As described below, the recombination current that does not contribute to the light emission per light-emitting surface can be reduced thereby, and the effect of realizing a finer light-emitting element can be increased.

(Modification)

Figure 25:
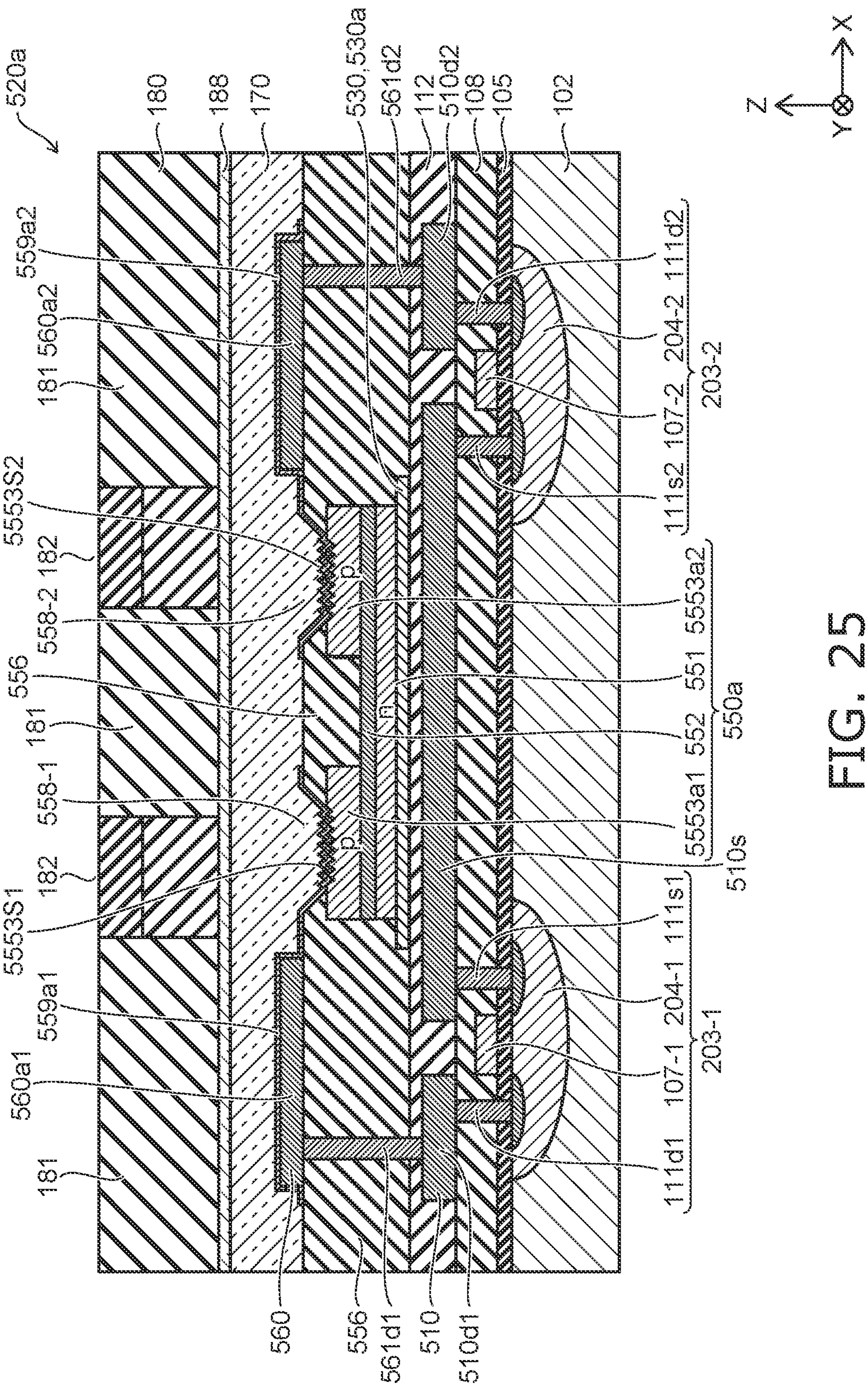
FIG. 25 is a schematic cross-sectional view illustrating a portion of an image display device according to a modification of the fifth embodiment.

FIG. 25 is a schematic cross-sectional view illustrating a portion of an image display device according to a modification of the embodiment.

The modification differs from the fifth embodiment described above in that two p-type semiconductor layers **5553*a*1 and 5553*a*2 are located on the light-emitting layer 552**. Otherwise, the modification is the same as the fifth embodiment; the same components are marked with the same reference numerals, and a detailed description is omitted as appropriate.

As shown in FIG. 25, the image display device of the modification includes a subpixel group **520*a*. The subpixel group 520*a* includes a semiconductor layer 550*a*. The semiconductor layer 550*a* includes the n-type semiconductor layer 551, the light-emitting layer 552, and the p-type semiconductor layers 5553*a*1 and 5553*a*2. The n-type semiconductor layer 551, the light-emitting layer 552, and the p-type semiconductor layers 5553*a*1 and 5553*a*2 are stacked in this order from the inter-layer insulating film 556 toward light-emitting surfaces 5553S1 and 5553S2**.

The p-type semiconductor layers **5553*a*1 and 5553*a*2 are arranged to be separated along the X-axis direction on the light-emitting layer 552. The inter-layer insulating film 556 is located between the p-type semiconductor layers 5553*a*1 and 5553*a*2, and the p-type semiconductor layers 5553*a*1 and 5553*a*2 are divided by the inter-layer insulating film 556**.

The p-type semiconductor layers **5553*a*1 and 5553*a*2** have substantially the same shape when projected onto the XY plane; the shape is a substantially square or rectangular shape, and may be another polygonal shape, circular, etc.

The p-type semiconductor layers **5553*a*1 and 5553*a*2 respectively include the light-emitting surfaces 5553S1 and 5553S2. The light-emitting surfaces 5553S1 and 5553S2 are surfaces of the p-type semiconductor layers 5553*a*1 and 5553*a*2 that are exposed respectively by the openings 558-1 and 558-2**.

Similarly to the shapes of the light-emitting surfaces of the fifth embodiment, the shapes of the light-emitting surfaces 5553S1 and 5553S2 when projected onto the XY plane are substantially the same shape, and are a shape such as substantially square, etc. The shapes of the light-emitting surfaces 5553S1 and 5553S2 are not limited to rectangular such as that of the embodiment, and may be circular, elliptical, or polygonal such as hexagonal, etc. The shapes of the light-emitting surfaces 5553S1 and 5553S2 may be similar to the shapes of the openings 558-1 and 558-2, or may be different shapes.

The transparent electrodes **559*a*1 and 559*a*2 are located respectively on the light-emitting surfaces 5553S1 and 5553S2. The transparent electrodes 559*a*1 and 559*a*2 also are located respectively on the wiring portions 560*a*1 and 560*a*2. The transparent electrodes 559*a*1 and 559*a*2 are located between the wiring portions 560*a*1 and 560*a*2 and the light-emitting surfaces 5553S1 and 5553S2 and electrically connect the wiring portions 560*a*1 and 560*a*2 and the light-emitting surfaces 5553S1 and 5553S2**.

Figure 26A:
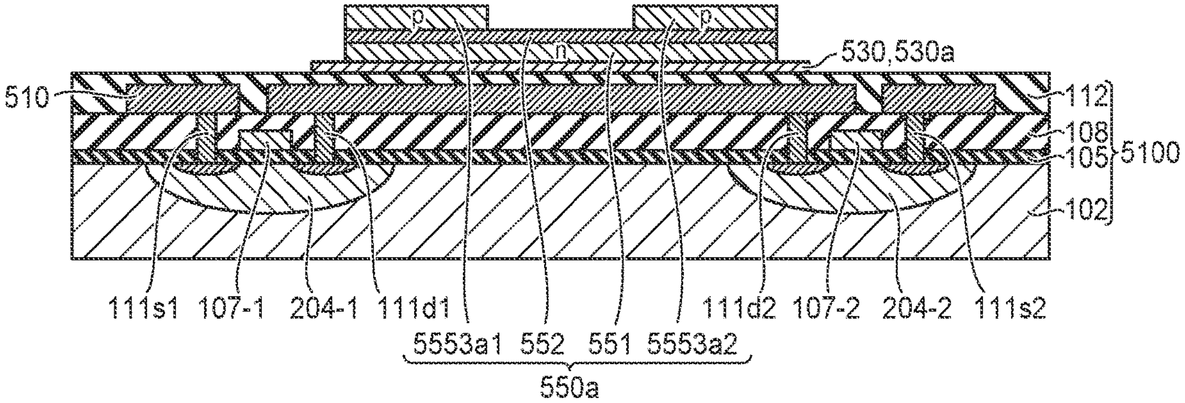
FIG. 26A is a schematic cross-sectional view illustrating a method for manufacturing the image display device of the modification of the fifth embodiment.
Figure 26B:
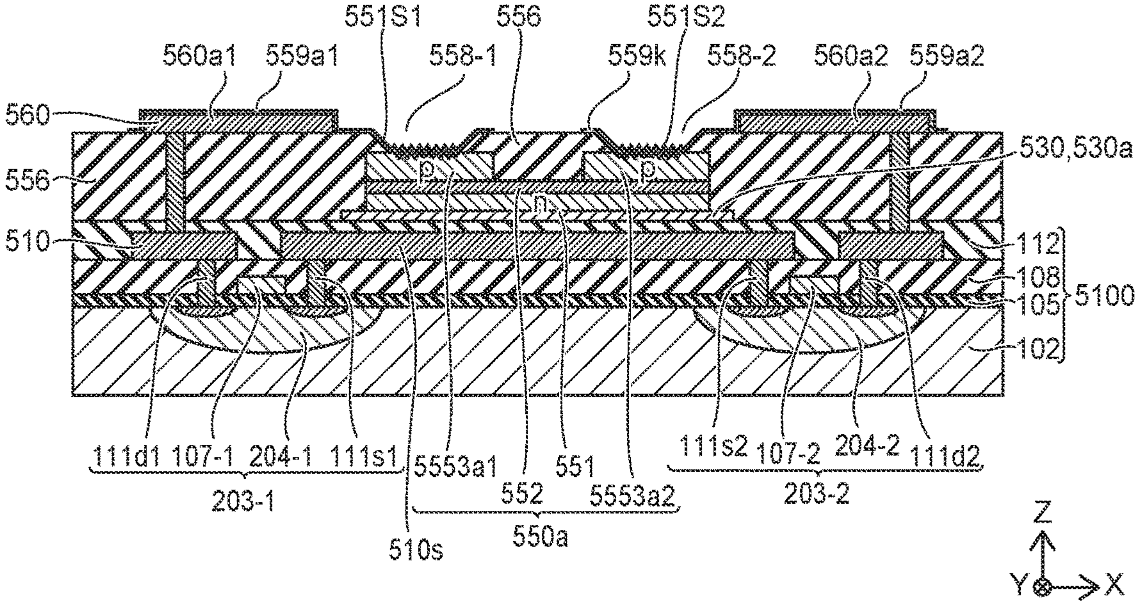
FIG. 26B is a schematic cross-sectional view illustrating the method for manufacturing the image display device of the modification of the fifth embodiment.

FIGS. 26A and 26B are schematic cross-sectional views illustrating a method for manufacturing the image display device of the modification.

According to the modification, processes similar to the processes described in reference to FIGS. 23A and 23B of the fifth embodiment are applied up to the metal layer 1130 being formed on the semiconductor layer 1150 and bonded with the circuit board 5100. The subsequent processes will now be described.

According to the modification as shown in FIG. 26A, the second wiring layer 530 that includes the light-shielding plate **530*a* is formed by etching the metal layer 1130 after removing the buffer layer 1140. Also, the light-emitting layer 552 and the n-type semiconductor layer 551 are formed by etching the p-type semiconductor layer 1153, the light-emitting layer 1152, and the n-type semiconductor layer 1151; subsequently, etching is performed further to form the two p-type semiconductor layers 5553*a*1 and 5553*a*2. The buffer layer 1140 may be removed after forming the semiconductor layer 550*a***.

The p-type semiconductor layers **5553*a*1 and 5553*a*2 may be formed by performing even deeper etching. For example, the etching for forming the p-type semiconductor layers 5553*a*1 and 5553*a*2 may be performed to a depth that reaches the interior of the light-emitting layer 552 and the interior of the n-type semiconductor layer 551. Thus, when deeply etching the p-type semiconductor layer, it is desirable for the etching position of the p-type semiconductor layer 1153 to be separated from the outer perimeters of the light-emitting surfaces 5553S1 and 5553S2 of the p-type semiconductor layer described below by not less than 1 μm. The recombination current can be suppressed by setting the etching position to be separated from the outer perimeters of the light-emitting surfaces 5553S1 and 5553S2**.

As shown in FIG. 26B, an inter-layer insulating film that covers the first inter-layer insulating film 112, the second wiring layer 530, and the semiconductor layer **550*a* is formed; subsequently, vias are formed. Also, the third wiring layer 560 is formed, and the wiring portions 560*a*1, 560*a*2**, etc., are formed by etching.

The openings 558-1 and 558-2 are formed respectively at positions of the inter-layer insulating film that correspond to the light-emitting surfaces 5553S1 and 5553S2. The light-emitting surfaces 5553S1 and 5553S2 of the p-type semiconductor layers that are exposed by the openings 558-1 and 558-2 each are roughened. Subsequently, the transparent electrodes **559*a*1 and 559*a*2** are formed.

Thus, a subpixel group **520*a* that includes the two light-emitting surfaces 5553S1 and 5553S2** is formed.

According to the modification as well, similarly to the fifth embodiment, the number of light-emitting surfaces is not limited to two; three or more light-emitting surfaces may be provided in one semiconductor layer **550*a***.

Effects of the image display device of the embodiment will now be described.

Figure 27:
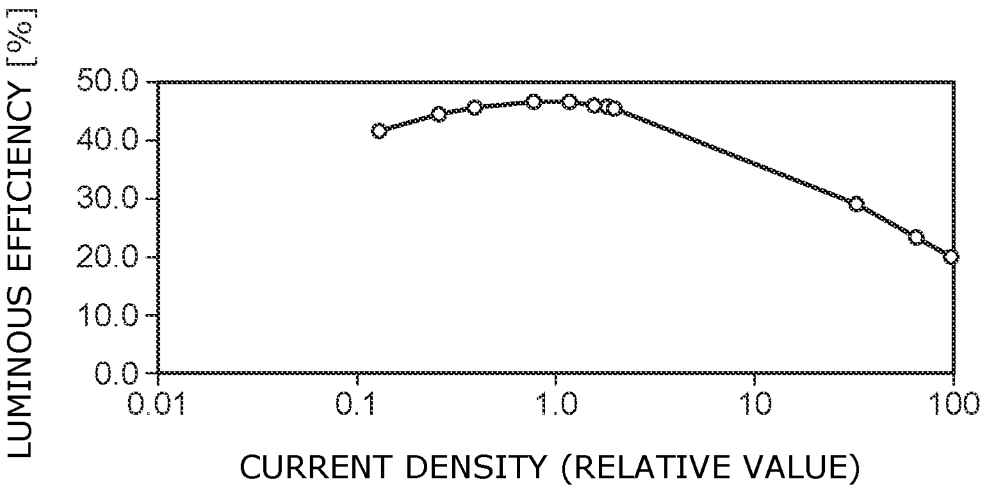
FIG. 27 is a graph illustrating a characteristic of a pixel LED element.

FIG. 27 is a graph illustrating a characteristic of a pixel LED element.

The vertical axis of FIG. 27 illustrates the luminous efficiency (%). The horizontal axis illustrates the current density of the current caused to flow in the pixel LED element as a relative value.

As shown in FIG. 27, the luminous efficiency of the pixel LED element is substantially constant or monotonously increases in the region in which the relative value of the current density is less than 1.0. The luminous efficiency monotonously decreases in the region in which the relative value of the current density is greater than 1.0. That is, an appropriate current density at which the luminous efficiency is a maximum exists in the pixel LED element.

It may be expected that a highly efficient image display device is realized by suppressing the current density so that a sufficient luminance is obtained from the light-emitting element. However, it is shown by FIG. 27 that there is a tendency for the current density to decrease and for the luminous efficiency to decrease for a low current density.

As described in the first embodiment and the second embodiment, the light-emitting element is formed by individually singulating by etching or the like of all of the layers of the semiconductor layer 1150 that includes the light-emitting layer. At this time, the junction surface between the light-emitting layer and the n-type semiconductor layer is exposed at the end portion. Similarly, the junction surface between the light-emitting layer and the p-type semiconductor layer is exposed at the end portion.

When such an end portion exists, electrons and holes recombine at the end portion. On the other hand, such recombination does not contribute to the light emission. The recombination at the end portion occurs substantially regardless of the current caused to flow in the light-emitting element. It is considered that the recombination occurs according to the length of the junction surface that contributes to the light emission of the end portion.

When two light-emitting elements that have cubic shapes of the same dimensions emit light, end portions are formed at four sides for each light-emitting element; therefore, recombination may occur at a total of eight end portions.

Conversely, according to the embodiment, there are four end portions in the semiconductor layers 550 and **550*a* that include two light-emitting surfaces. The region between the openings 558-1 and 558-2** substantially does not contribute to the light emission because few electrons and holes are injected into this region; therefore, the end portions that contribute to the light emission can be considered to be six. Thus, according to the embodiment, by substantially reducing the number of end portions of the semiconductor layers, the recombination that does not contribute to the light emission can be reduced, and the reduction of the recombination current makes it possible to reduce the drive current.

When shortening the distance between the subpixels for higher definition or the like, when the current density is relatively high, etc., the distance between the light-emitting surfaces 553S1 and 55352 becomes short in the subpixel group 520 of the fifth embodiment. In such a case, when the p-type semiconductor layer 553 is shared, there is a risk that a portion of the electrons injected into the adjacent light-emitting surface side may shunt, and the light-emitting surface at the side that is not driven may have a micro light emission. According to the modification, the p-type semiconductor layer is divided for each light-emitting surface; therefore, the micro light emission of the light-emitting surface at the side that is not driven can be reduced. In such a case as well, it is desirable for the etching position of the p-type semiconductor layer 1153 to be separated by not less than 1 μm from the outer perimeters of the light-emitting surfaces 5553S1 and 5553S2 at which the transparent electrodes **559*a*1 and 559*a*2** are located. The recombination current can be suppressed thereby because the equivalent series resistance in the recombination current path can be increased.

According to the embodiment, the semiconductor layers that include the light-emitting layer are favorable from the perspective of increasing the luminous efficiency by roughening the exposed surface of the p-type semiconductor layer because the n-type semiconductor layer, the light-emitting layer, and the p-type semiconductor layer are stacked in this order from the first inter-layer insulating film 112 side. Similarly to the other embodiments described above, the p-type semiconductor layer, the light-emitting layer, and the n-type semiconductor layer may be stacked in this order by replacing the stacking order of the p-type semiconductor layer and the n-type semiconductor layer.

Sixth Embodiment

The image display device described above can be used as an image display module having the appropriate number of pixels in, for example, a computer display, a television, a portable terminal such as a smartphone, car navigation, etc.

Figure 28:
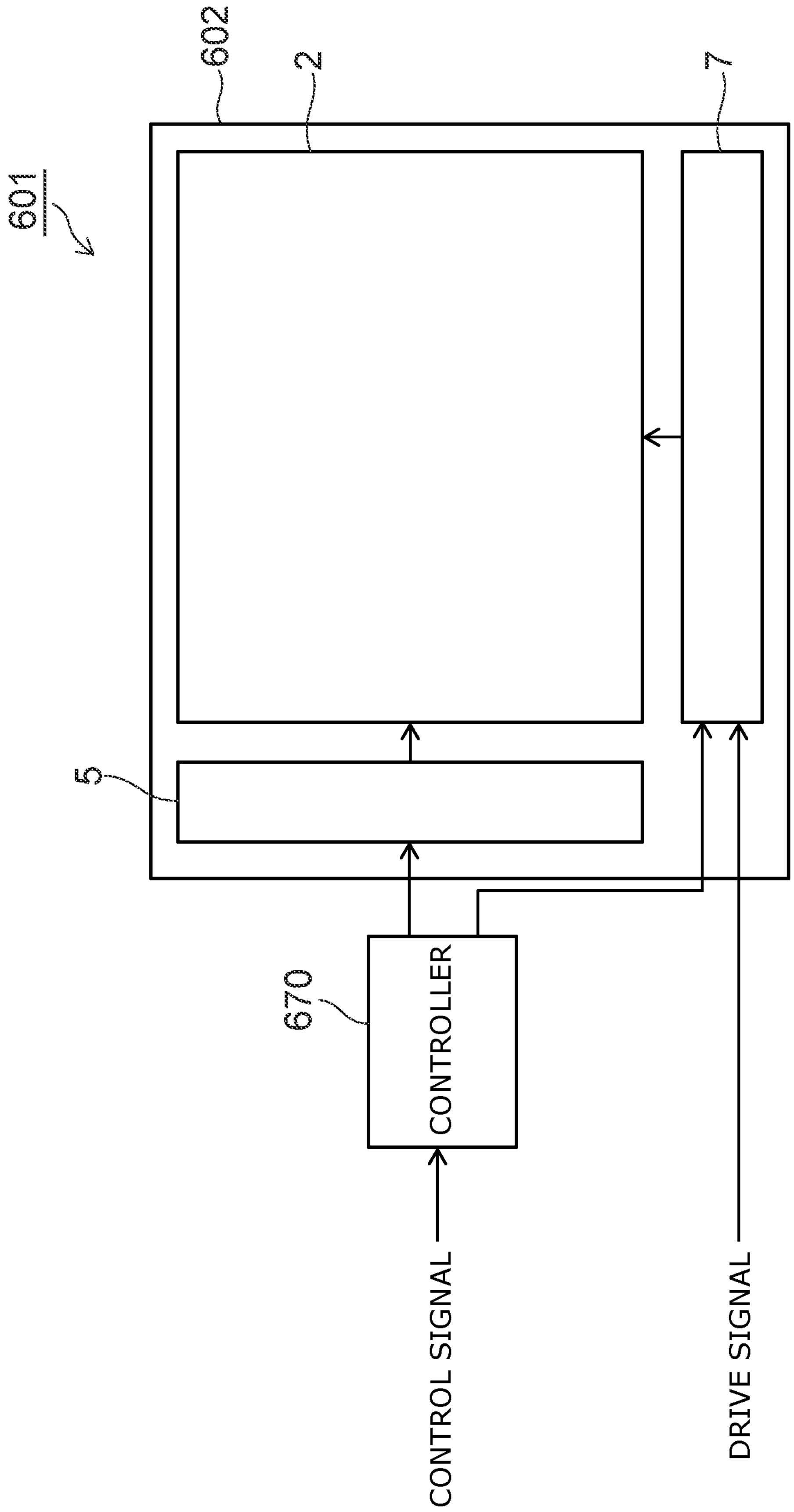
FIG. 28 is a block diagram illustrating an image display device according to a sixth embodiment.

FIG. 28 is a block diagram illustrating the image display device according to the embodiment.

Main parts of the configuration of a computer display are shown in FIG. 28.

As shown in FIG. 28, the image display device 601 includes an image display module 602. The image display module 602 is, for example, an image display device that includes the configuration of the first embodiment described above. The image display module 602 includes the display region 2 in which the subpixels 20 are arranged, the row selection circuit 5, and the signal voltage output circuit 7.

The image display device 601 further includes a controller 670. The controller 670 receives input of control signals that are separated and generated by not-illustrated interface circuitry, and controls the driving and the drive sequence of the subpixels in the row selection circuit 5 and the signal voltage output circuit 7.

(Modification)

Figure 29:
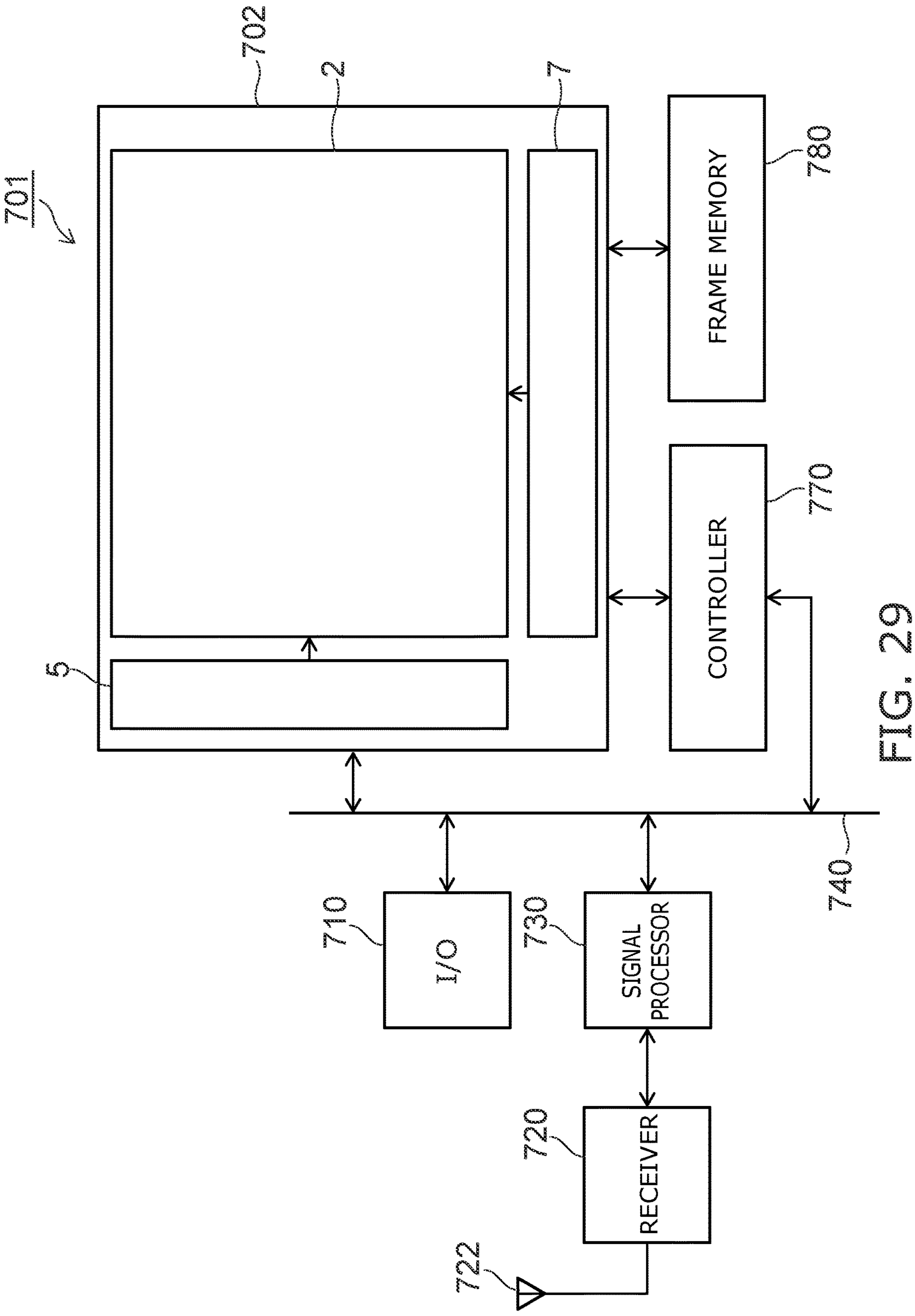
FIG. 29 is a block diagram illustrating an image display device according to a modification of the sixth embodiment.

FIG. 29 is a block diagram illustrating an image display device of the modification.

The configuration of a high-definition thin television is shown in FIG. 29.

As shown in FIG. 29, the image display device 701 includes an image display module 702. The image display module 702 is, for example, the image display device 1 that includes the configuration of the first embodiment described above. The image display device 701 includes a controller 770 and a frame memory 780. Based on a control signal supplied by a bus 740, the controller 770 controls the drive sequence of the subpixels of the display region 2. The frame memory 780 stores one frame of display data and is used for smooth processing such as video image reproduction, etc.

The image display device 701 includes an I/O circuit 710. The I/O circuit 710 provides interface circuitry and the like for connecting with external terminals, devices, etc. The I/O circuit 710 includes, for example, a USB interface that connects an external hard disk device or the like, an audio interface, etc.

The image display device 701 includes a receiver 720 and a signal processing circuit 730. An antenna 722 is connected to the receiver 720, and the necessary signal is separated and generated from the radio wave received by the antenna 722. The signal processing circuit 730 includes a DSP (Digital Signal Processor), a CPU (Central Processing Unit), etc., and the signal that is separated and generated by the receiver 720 is separated and generated into image data, audio data, etc., by the signal processing circuit 730.

Other image display devices also can be made by using the receiver 720 and the signal processing circuit 730 as a high frequency communication module for the transmission and reception of a mobile telephone, for WiFi, a GPS receiver, etc. For example, the image display device that includes an image display module having the appropriate screen size and resolution can be used as a personal digital assistant such as a smartphone, a car navigation system, etc.

The image display module of the embodiment is not limited to the configuration of the image display device of the first embodiment; modifications of the first embodiment or of other embodiments may be used.

Figure 30:
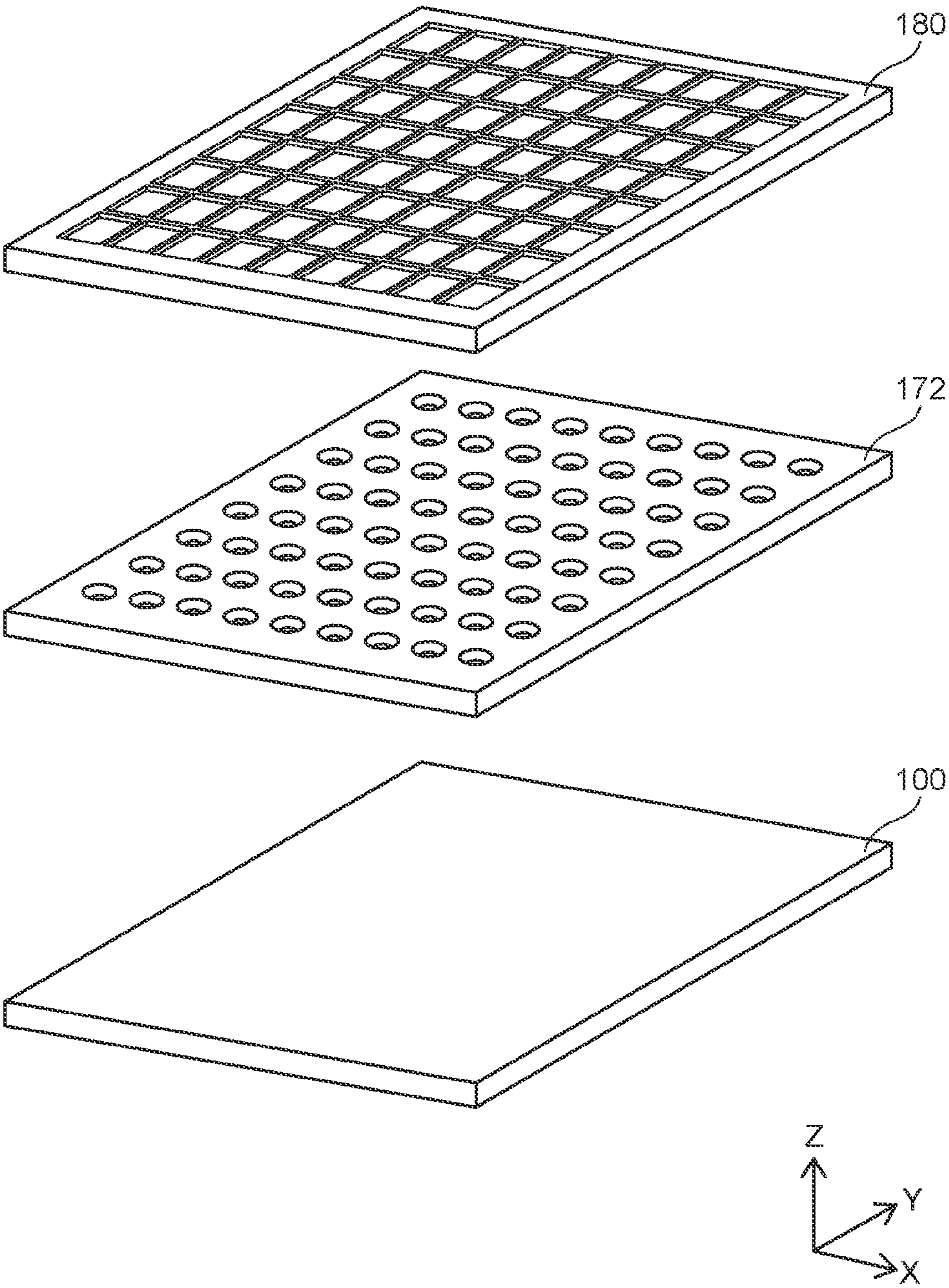
FIG. 30 is a perspective view schematically illustrating the image display device of the first to fifth embodiments and modifications of the first to fifth embodiments.

FIG. 30 is a perspective view schematically illustrating the image display device of the first to fifth embodiments and modifications of the first to fifth embodiments.

As shown in FIG. 30, in the image display device of the first to fifth embodiments, a light-emitting circuit 172 that includes many subpixels on the circuit board 100 is provided as described above. The color filter 180 is located on the light-emitting circuit part 172. According to the sixth embodiment, the structural component that includes the circuit board 100, the light-emitting circuit part 172, and the color filter 180 is used as the image display modules 602 and 702 and is embedded in the image display devices 601 and 701.

According to embodiments described above, an image display device and a method for manufacturing an image display device can be realized in which the transfer process of the light-emitting elements is shortened, and the yield is increased.

Although several embodiments of the invention are described hereinabove, these embodiments have been presented by way of example only, and are not intended to limit the scope of the inventions. These novel embodiments may be embodied in a variety of other forms, and various omissions, substitutions, and changes may be made without departing from the spirit of the inventions. Such embodiments and their modifications are included in the scope and spirit of the inventions, and are included in the scope of the inventions recited in the claims and their equivalents. Also, embodiments described above can be implemented in combination with each other.

REFERENCE NUMERAL LIST

1, 201, 601, 701 image display device
2 display region
3 power supply line
4 ground line
5, 205 row selection circuit
6, 206 scanning line
7, 207 signal voltage output circuit
8, 208 signal line
10 pixel
20, 20*a*, 20*b* subpixel
22, 222 light-emitting element
24, 224 select transistor
26, 226 drive transistor
28, 228 capacitor
100 circuit board
101 circuit
103, 203, 203-1, 203-2 transistor
104, 204, 204-1, 204-2 element formation region
105 insulating layer
107, 107-1, 107-2 gate
108 insulating film
110 first wiring layer
112 first insulating film
130, 330, 530 second wiring layer
130*a*, 530*a* light-shielding plate
140 buffer layer
150, 250 light-emitting element
156, 256, 556 second insulating film
159*a*, 159*k*, 259*a*, 259*k*, 359*k*, 459*a*, 459*k*, 559*a*1, 559*a*2 transparent electrode
160, 260, 360, 560 third wiring layer
161*d*, 161*k*, 261*a*, 361*k*, 461*a*, 461*k*, 461*d*, 561*d*1, 561*d*2 via
180 color filter
520, 520*a* subpixel group
670, 770 controller
1001 crystal growth substrate
1100, 5100 circuit board
1140 buffer layer
1150 semiconductor layer
1190 support substrate
1192 structure body
1194, 1294 semiconductor growth substrate

The invention claimed is:

1. A method for manufacturing an image display device, the method comprising:

providing a semiconductor growth substrate comprising a semiconductor layer on a first substrate, the semiconductor layer comprising a light-emitting layer;

forming a metal layer on the semiconductor layer;

after forming the metal layer on the semiconductor layer, bonding the semiconductor layer to a second substrate via the metal layer, wherein the second substrate comprises a circuit, and the circuit comprises a circuit element;

forming a light-emitting element by patterning the semiconductor layer;

forming a first wiring layer by patterning the metal layer, the first wiring layer directly contacting the light-emitting element;

forming an insulating film that covers the light-emitting element and the first wiring layer;

forming a first via that extends through the insulating film to the circuit;

forming a second via that extends through the insulating film to the first wiring layer so as to directly contact the first wiring layer; and forming a second wiring layer on the insulating film, the second wiring layer comprising a first wiring portion and a second wiring portion;

exposing a surface of the light-emitting element by removing a portion of the insulating film; and forming a transparent electrode that electrically connects the first wiring portion and the exposed surface of light-emitting element; wherein;

the second via electrically connects the first wiring layer to the second wiring portion; and the first wiring portion, the transparent electrode, the light-emitting element, the first wiring layer, the second via, the second wiring portion, the first via, and the circuit element are connected in series.

2. The method for manufacturing the image display device according to claim 1, further comprising:

after the step of bonding the semiconductor layer to the second substrate, removing the first substrate.

3. The method for manufacturing the image display device according to claim 1, further comprising:

before the step of bonding the semiconductor layer to the second substrate, removing the first substrate, and adhering a third substrate to the semiconductor layer.

4. The method for manufacturing the image display device according to claim 1, wherein:

the semiconductor layer comprises an n-type semiconductor layer, the light-emitting layer, and a p-type semiconductor layer, stacked in this order from a first substrate side.

5. The method for manufacturing the image display device according to claim 1, wherein:

the first via extends through the first wiring layer, is formed to be insulated from the first wiring layer, and is electrically connected to the second wiring portion of the second wiring layer.

6. The method for manufacturing the image display device according to claim 1, further comprising:

forming a second metal layer at a bonding surface of the second substrate before the bonding of the semiconductor layer to the second substrate.

7. The method for manufacturing the image display device according to claim 1, wherein:

the first substrate comprises silicon or sapphire.

8. The method for manufacturing the image display device according to claim 1, wherein:

the semiconductor layer comprises a gallium nitride compound semiconductor, and the second substrate comprises silicon.

9. The method for manufacturing the image display device according to claim 1, further comprising:

forming a wavelength conversion member on the light-emitting element.

10. The method for manufacturing the image display device according to claim 1, wherein the first wiring layer is formed after the light-emitting element is formed.

* * * * *